US011201070B2

(12) United States Patent
Babbs et al.

(10) Patent No.: US 11,201,070 B2
(45) Date of Patent: *Dec. 14, 2021

(54) SIDE OPENING UNIFIED POD

(71) Applicant: Brooks Automation, Inc., Chelmsford, MA (US)

(72) Inventors: Daniel Babbs, Austin, TX (US); William Fosnight, Saratoga Springs, NY (US); Robert C. May, Austin, TX (US); William Weaver, Austin, TX (US)

(73) Assignee: Brooks Automation, Inc., Chelmsford, MA (US)

(*) Notice: Subject to any disclaimer, the term of this patent is extended or adjusted under 35 U.S.C. 154(b) by 98 days.

This patent is subject to a terminal disclaimer.

(21) Appl. No.: 15/986,710

(22) Filed: May 22, 2018

(65) Prior Publication Data

US 2018/0269094 A1    Sep. 20, 2018

Related U.S. Application Data

(63) Continuation of application No. 14/822,392, filed on Aug. 10, 2015, now Pat. No. 9,978,623, which is a
(Continued)

(51) Int. Cl.
*H01L 21/673* (2006.01)
*H01L 21/677* (2006.01)
*H01L 21/67* (2006.01)

(52) U.S. Cl.
CPC .. *H01L 21/67379* (2013.01); *H01L 21/67376* (2013.01); *H01L 21/67772* (2013.01);
(Continued)

(58) Field of Classification Search
CPC ......... H01L 21/67379; H01L 21/67207; H01L 21/67213; H01L 21/67225;
(Continued)

(56) References Cited

U.S. PATENT DOCUMENTS 4,534,695 A    8/1985  stump et al.
4,797,054 A    1/1989  Arii
(Continued)

FOREIGN PATENT DOCUMENTS

DE    19731174    1/1998
EP     818806     1/1998
(Continued)

OTHER PUBLICATIONS

XPS analysis with an ultra clean vacuum substrate carrier for oxidation and airborne molecular contamination prevention, Pelissier et al., Jan. 2008, vol. 85, pp. 151-155, Elsevier.
(Continued)

*Primary Examiner* — James Keenan
(74) *Attorney, Agent, or Firm* — Perman & Green LLP; Colin C. Durham

(57) ABSTRACT

A substrate processing system including a processing section arranged to hold a processing atmosphere therein, a carrier having a shell forming an internal volume for holding at least one substrate for transport to the processing section, the shell being configured to allow the internal volume to be pumped down to a predetermined vacuum pressure that is different than an exterior atmosphere outside the substrate processing system, and a load port communicably connected to the processing section to isolate the processing atmosphere from the exterior atmosphere, the load port being configured to couple with the carrier to pump down the internal volume of the carrier and to communicably connect the carrier to the processing section, for loading the substrate into the processing section through the load port.

29 Claims, 38 Drawing Sheets

Related U.S. Application Data continuation of application No. 12/123,391, filed on May 19, 2008, now Pat. No. 9,105,673.

(60) Provisional application No. 60/930,634, filed on May 17, 2007, provisional application No. 61/024,152, filed on Jan. 28, 2008, provisional application No. 61/043,097, filed on Apr. 7, 2008.

(52) U.S. Cl.
CPC .. *H01L 21/67775* (2013.01); *H01L 21/67778* (2013.01); *H01L 21/67201* (2013.01); *H01L 21/67207* (2013.01); *H01L 21/67213* (2013.01); *H01L 21/67225* (2013.01); *H01L 21/67393* (2013.01); *H01L 21/67742* (2013.01); *H01L 21/67766* (2013.01); *Y10S 414/14* (2013.01)

(58) Field of Classification Search
CPC ......... H01L 21/67376; H01L 21/67386; H01L 21/67393; H01L 21/67772; H01L 21/67775; H01L 21/67778
USPC ........................................ 414/217
See application file for complete search history.

(56) References Cited

U.S. PATENT DOCUMENTS

| | | | |
|---|---|---|---|
| 4,816,098 A | 3/1989 | Davis et al. |
| 4,832,778 A | 5/1989 | Davis et al. |
| 4,846,345 A | 7/1989 | Hamuro et al. |
| 4,872,938 A | 10/1989 | Davis et al. |
| 4,911,103 A | 3/1990 | Davis et al. |
| 4,911,597 A | 3/1990 | Maydan et al. |
| 4,966,519 A | 10/1990 | Davis et al. |
| 4,969,556 A | 11/1990 | Ishimaru et al. |
| 5,044,871 A | 9/1991 | Davis et al. |
| 5,217,053 A | 6/1993 | Foster et al. |
| 5,255,783 A | 10/1993 | Goodman et al. |
| 5,320,218 A | 6/1994 | Yamashit et al. |
| 5,378,107 A | 1/1995 | Vieerny et al. |
| 5,390,785 A | 2/1995 | Garrick et al. |
| 5,411,358 A | 5/1995 | Garrick et al. |
| 5,433,574 A | 7/1995 | Kawano et al. |
| 5,451,131 A | 9/1995 | Hecht et al. |
| 5,538,390 A | 7/1996 | salzman |
| 5,547,328 A | 8/1996 | Bonora et al. |
| 5,562,383 A | 10/1996 | Iwai et al. |
| 5,575,081 A | 11/1996 | Ludwig |
| 5,586,585 A | 12/1996 | Bonora et al. |
| 5,611,452 A | 3/1997 | Bonora et al. |
| 5,630,690 A | 5/1997 | Salzman |
| 5,664,679 A | 9/1997 | Schneider et al. |
| 5,785,186 A | 7/1998 | babbs et al. |
| 5,788,304 A | 8/1998 | korn et al. |
| 5,810,062 A | 9/1998 | Bonora et al. |
| 5,833,426 A | 11/1998 | Marhol |
| 5,895,191 A | 4/1999 | Bonora et al. |
| 5,988,233 A | 11/1999 | Fosnight et al. |
| 5,988,392 A | 11/1999 | Hosoi |
| 6,044,874 A | 4/2000 | Saga |
| 6,068,668 A | 5/2000 | Mastoianni |
| 6,076,617 A | 6/2000 | Berner |
| 6,082,951 A | 7/2000 | Nering et al. |
| 6,135,168 A | 10/2000 | Yang et al. |
| 6,158,946 A | 12/2000 | Miyashita |
| 6,176,023 B1 | 1/2001 | Doche |
| 6,220,808 B1 | 4/2001 | Bonora et al. |
| 6,261,044 B1 | 7/2001 | Fosnight et al. |
| 6,309,161 B1 | 10/2001 | Hofmeister |
| 6,318,953 B1 | 11/2001 | Bonora et al. |
| 6,319,297 B1 | 11/2001 | Fosnight |
| 6,352,403 B1 | 3/2002 | Fishkin et al. |
| 6,382,896 B1 | 5/2002 | Hu et al. |
| 6,398,475 B1 | 6/2002 | Ishikawa |
| 6,403,945 B2 | 6/2002 | Roessler et al. |
| 6,419,438 B1 | 7/2002 | Rosenquist |
| 6,473,996 B1 | 11/2002 | Tokunaga |
| 6,491,177 B1 | 12/2002 | Huyobu |
| 6,530,736 B2 | 3/2003 | Rosenquist |
| 6,585,470 B2 | 7/2003 | vandermeulan |
| 6,592,434 B1 | 7/2003 | Vanell et al. |
| 6,637,998 B2 | 10/2003 | Langan et al. |
| 6,677,690 B2 | 1/2004 | Fosnight et al. |
| 6,701,972 B2 | 3/2004 | Dickinson et al. |
| 6,719,517 B2 | 4/2004 | Beaulieu et al. |
| 6,758,876 B2 | 7/2004 | Suzuki et al. |
| 6,796,763 B2 | 9/2004 | Miyajima et al. |
| 6,808,352 B2 | 10/2004 | Seita |
| 6,817,822 B2 | 11/2004 | Tokunaga et al. |
| 6,828,235 B2 | 12/2004 | Takano |
| 6,899,145 B2 | 5/2005 | Aggarwal |
| 6,899,765 B2 | 5/2005 | krivts et al. |
| 6,991,416 B2 | 1/2006 | del Puerto et al. |
| 6,996,453 B2 | 2/2006 | Ahn et al. |
| 7,068,793 B2 | 6/2006 | Shim |
| 7,077,173 B2 | 7/2006 | Tokunaga et al. |
| RE39,241 E | 8/2006 | Fosnight |
| 7,115,891 B2 | 10/2006 | Komatsu |
| 7,172,981 B2 | 2/2007 | Kobayashi |
| 7,360,346 B2 | 4/2008 | Miyajima et al. |
| 7,410,340 B2 | 8/2008 | Bonora et al. |
| 7,568,875 B2 | 8/2009 | Le Guet et al. |
| 7,789,609 B2 | 9/2010 | Okabe et al. |
| 7,905,960 B2 | 3/2011 | Choi et al. |
| 8,186,927 B2 | 5/2012 | Okabe et al. |
| 8,888,433 B2 | 11/2014 | Gilchrist et al. |
| 2001/0026747 A1 | 10/2001 | Saga |
| 2001/0041530 A1* | 11/2001 | Hara ................ F24F 3/161 454/187 |
| 2001/0048866 A1 | 12/2001 | Sakiya et al. |
| 2002/0020650 A1 | 2/2002 | Fujimori et al. |
| 2003/0035713 A1 | 2/2003 | Tsai et al. |
| 2004/0013498 A1 | 1/2004 | Soucy et al. |
| 2004/0134420 A1 | 7/2004 | Lei |
| 2004/0168633 A1 | 9/2004 | Nozawa et al. |
| 2005/0087300 A1 | 4/2005 | Ishizawa et al. |
| 2005/0105997 A1 | 5/2005 | Englhardt et al. |
| 2005/0118000 A1 | 6/2005 | Kasai et al. |
| 2005/0232734 A1 | 10/2005 | Elliott et al. |
| 2005/0238476 A1 | 10/2005 | Bernard et al. |
| 2006/0018736 A1 | 1/2006 | Lee et al. |
| 2006/0019411 A1 | 1/2006 | Ueda et al. |
| 2006/0088272 A1 | 4/2006 | Gilchrist et al. |
| 2006/0088406 A1 | 4/2006 | Miyajima et al. |
| 2006/0099054 A1 | 5/2006 | Friedman et al. |
| 2006/0120833 A1 | 6/2006 | Bonora et al. |
| 2006/0182531 A1 | 8/2006 | Shah et al. |
| 2006/0266011 A1 | 11/2006 | Halbmaier et al. |
| 2006/0272169 A1 | 12/2006 | Miyajima |
| 2006/0278612 A1 | 12/2006 | Tokunaga et al. |
| 2007/0023322 A1 | 2/2007 | Hyun et al. |
| 2007/0059127 A1 | 3/2007 | guo et al. |
| 2007/0140822 A1 | 6/2007 | Elliott et al. |
| 2007/0151619 A1 | 7/2007 | Okabe et al. |
| 2007/0170088 A1 | 7/2007 | Shimura |
| 2007/0186851 A1 | 8/2007 | Geiser et al. |
| 2007/0210533 A1 | 9/2007 | Okabe et al. |
| 2008/0031709 A1 | 2/2008 | Bonora et al. |
| 2008/0080963 A1 | 4/2008 | bufano et al. |
| 2008/0107506 A1 | 5/2008 | babbs et al. |
| 2008/0107507 A1 | 5/2008 | bufano et al. |
| 2008/0112784 A1 | 5/2008 | rogers et al. |
| 2009/0169344 A1 | 7/2009 | Nozawa et al. |
| 2012/0123391 A1 | 5/2012 | Gill et al. |

FOREIGN PATENT DOCUMENTS

| | | |
|---|---|---|
| EP | 0959495 | 11/1999 |
| EP | 1035574 | 9/2000 |
| GB | 2139424 | 11/1984 |
| GB | 2419035 | 4/2006 |
| JP | 1189371 | 7/1989 |

(56) References Cited

FOREIGN PATENT DOCUMENTS

| | | |
|---|---|---|
| JP | 2033379 | 2/1990 |
| JP | 2174244 | 7/1990 |
| JP | 02278746 | 11/1990 |
| JP | 04079347 | 2/1992 |
| JP | 5197431 | 8/1993 |
| JP | 05326679 | 10/1993 |
| JP | 2005326679 | 12/1993 |
| JP | 7066267 | 3/1995 |
| JP | 7066272 | 3/1995 |
| JP | 07108159 | 4/1995 |
| JP | 09027542 | 1/1997 |
| JP | 10084034 | 3/1998 |
| JP | 11168136 | 6/1999 |
| JP | 11217119 | 8/1999 |
| JP | 11243140 | 9/1999 |
| JP | 2011345863 | 12/1999 |
| JP | 200306988 | 11/2000 |
| JP | 2001015576 | 1/2001 |
| JP | 2001093958 | 4/2001 |
| JP | 2001156142 | 8/2001 |
| JP | 2002520831 | 7/2002 |
| JP | 2002368075 | 12/2002 |
| JP | 2003060007 | 2/2003 |
| JP | 2003068825 | 3/2003 |
| JP | 2003092345 | 3/2003 |
| JP | 2003258077 | 9/2003 |
| JP | 2003197709 | 11/2003 |
| JP | 2004087781 | 3/2004 |
| JP | 2004265894 | 9/2004 |
| JP | 2004282002 | 10/2004 |
| JP | 2005268462 | 9/2005 |
| JP | 2005527966 | 9/2005 |
| JP | 2006074033 | 3/2006 |
| JP | 2006351619 | 12/2006 |
| JP | 20085111142 | 4/2008 |
| KR | 20000064966 | 11/2000 |
| KR | 20030016165 | 2/2003 |
| KR | 100627782 | 9/2006 |
| TW | 541580 | 7/2003 |
| TW | 561128 | 11/2003 |
| TW | 565519 | 12/2003 |
| TW | 232199 | 5/2005 |
| WO | 99028965 | 6/1999 |
| WO | 0203431 | 1/2002 |
| WO | 2002013392 | 3/2002 |
| WO | 2006108032 | 10/2006 |
| WO | 2007019105 | 2/2007 |
| WO | 2007078407 | 7/2007 |
| WO | 2008019076 | 2/2008 |

OTHER PUBLICATIONS

Particle dynamics in a front-opening unified pod/load port unit minienvironment in the presence of a 300 mm wafer in various positions, Hu et al., Mar. 2005, vol. 39, pp. 185-195, Taylor and Francis Inc.

Trends in 300 mm factory automation, Hunter et al., Jun. 2003, vol. 26, pp. 60-64, Reed Business Information.

Design and evaluation of a nitorgen purge system for the front opening unified pod (FOUP), Hu et al., Applied Thermal Engineering, vol. 27, Jun. 2007, pp. 1386-1393, Elsevier.

Purging of the front-opening unified pod with nitrogen for 300 mm wafer manufactuing, Hu et al., Janpanese Journal of Applied Physics, vol. 45, pp. 5269-5271, Japan Societ of Applied Physics.

Evaluation of front-opening unified pod with attached US/photocatalyst cleaning unit, Suzuki et al., Japanese Journal of Applied Physics, vol. 44, pp. 1130-1131, Japanes Journal of Applied Physics.

Improvement of 300 mm FOUP mini-environment, Seita et al., IEEE International Symposium on Semiconductor Manufacturing, Oct. 8-10, 2001, San Jose, CA, USA, IEEE.

Purging FOUP's that open to front-end minienvironments using an inert-gas curtain, Keyhani et al., Aug.-Sep. 2004, Micro, vol. 22, pp. 65-71, Canon Communications, USA.

International Search Report dated May 19, 2008, International application No. PCT/US0864163, dated Sep. 3, 2008.

* cited by examiner

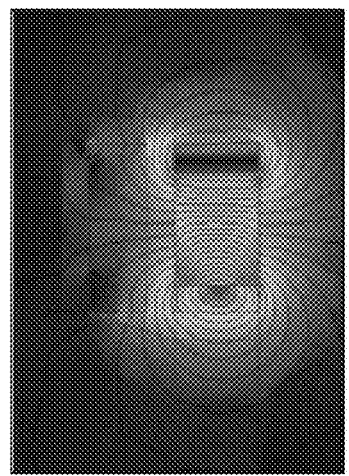
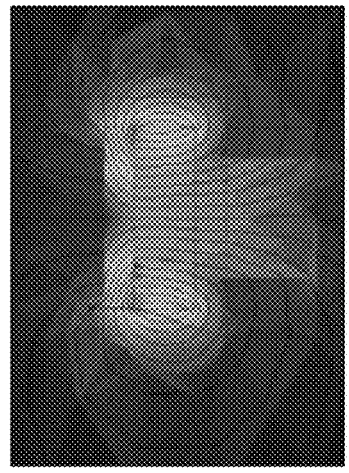
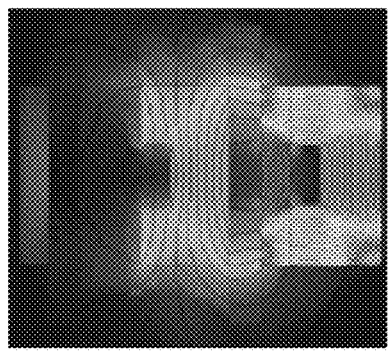
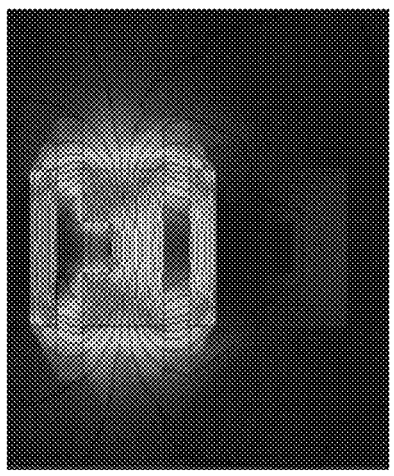
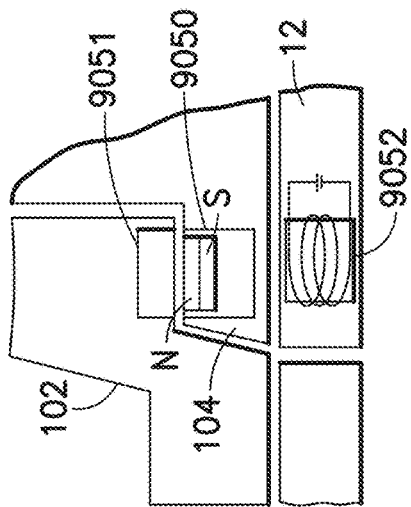
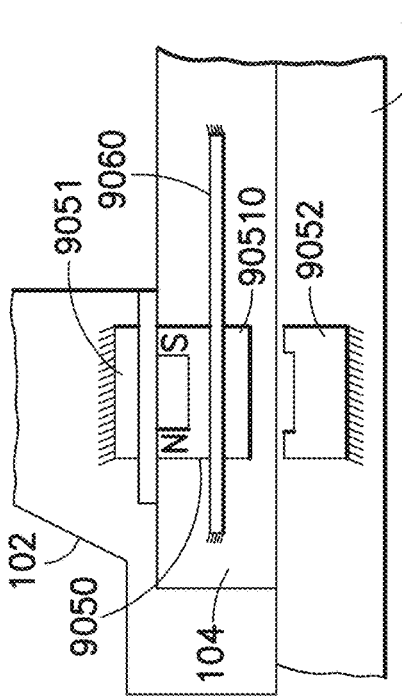
FIG.3A
FIG.3B

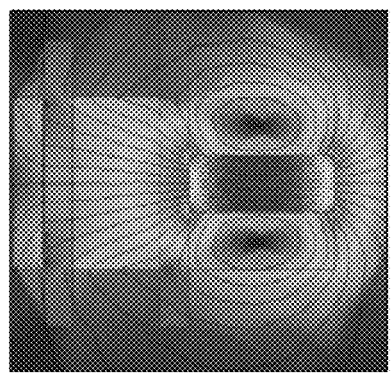
"OFF"
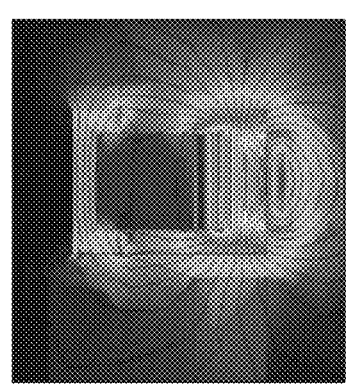
"OFF"
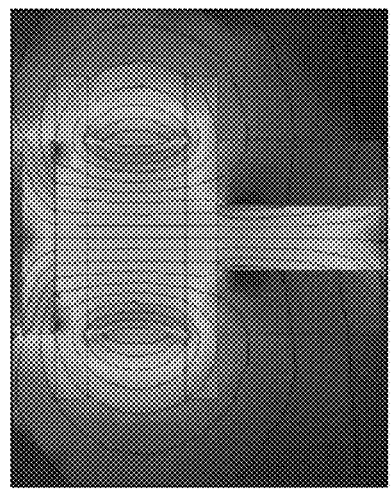
"ON"
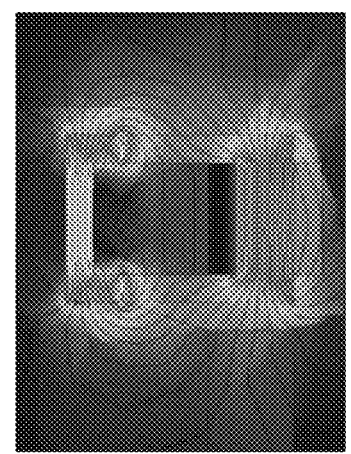
"ON"
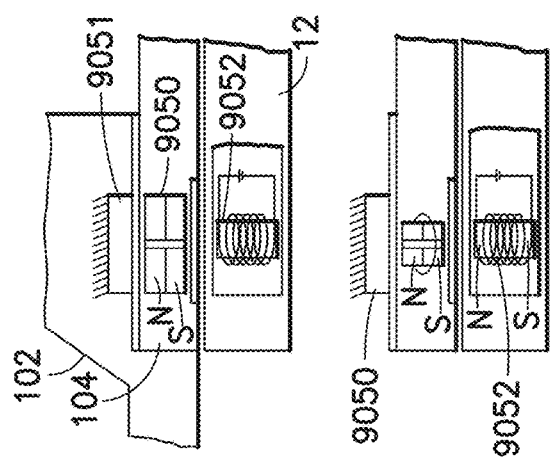
FIG.3C
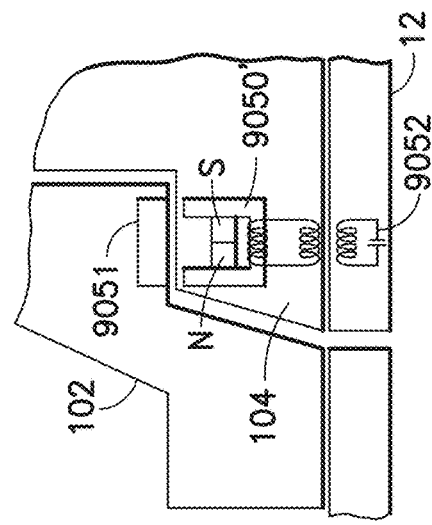
FIG.3D

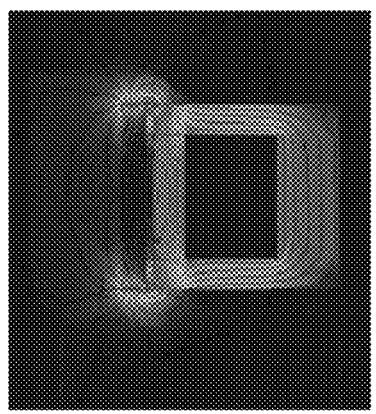
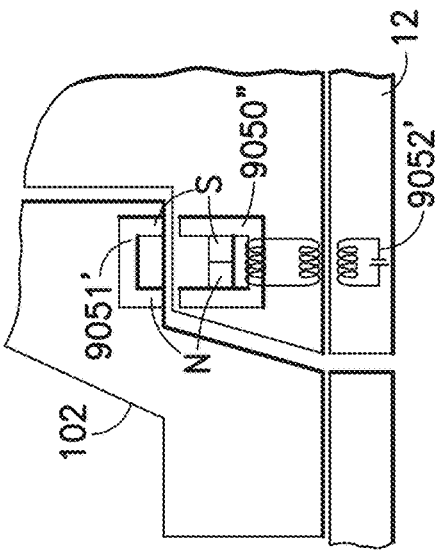
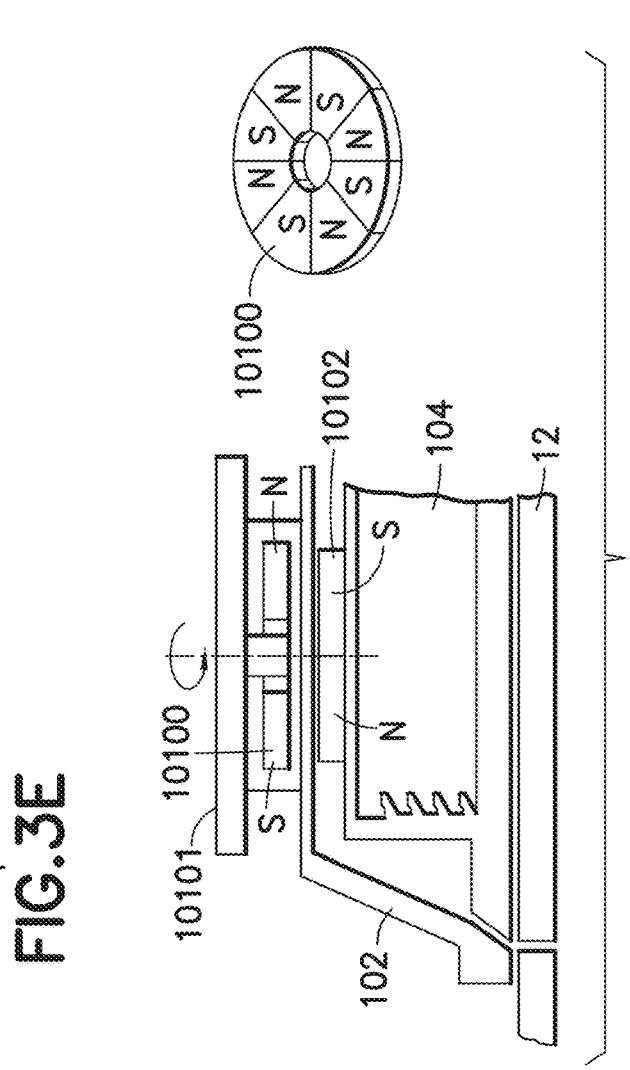
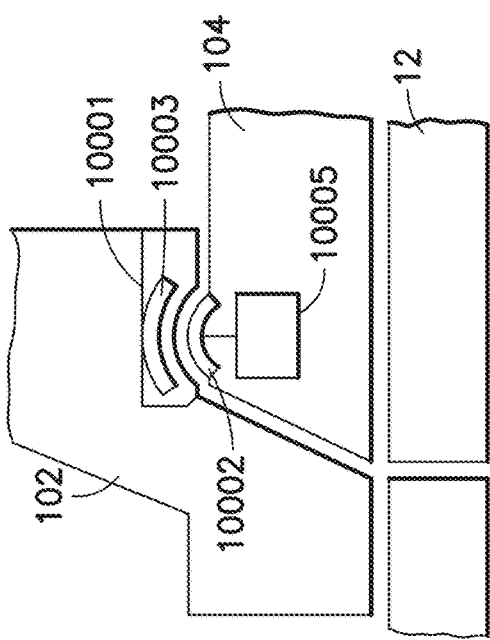

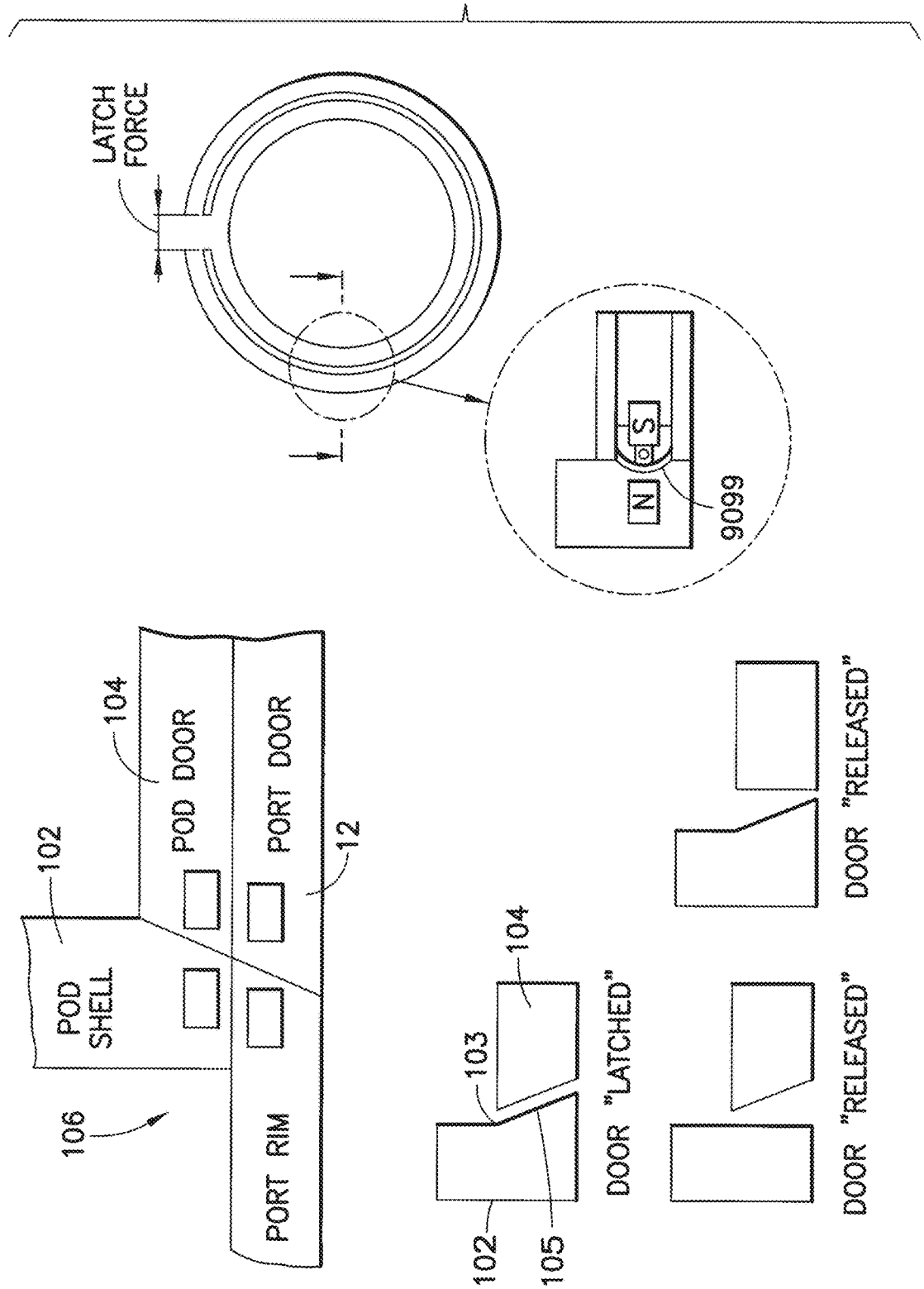

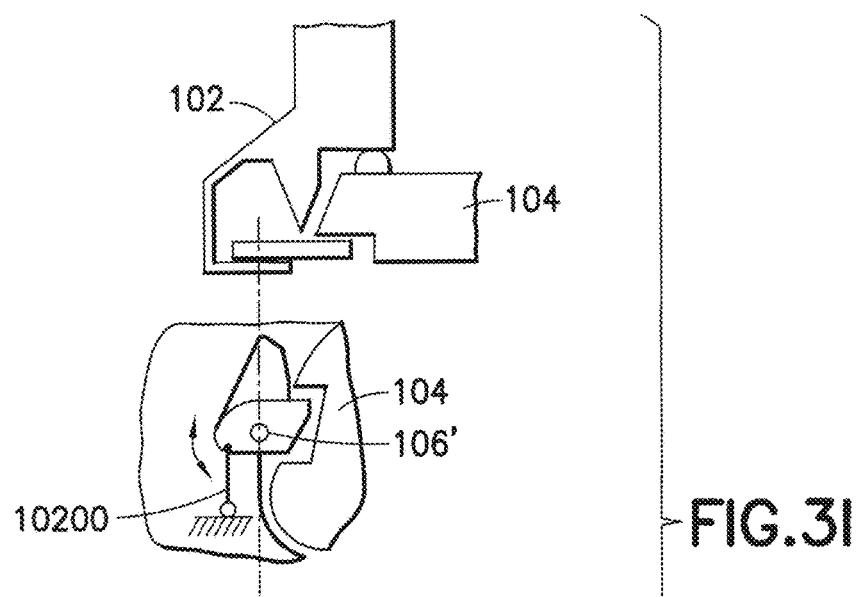
FIG.3I
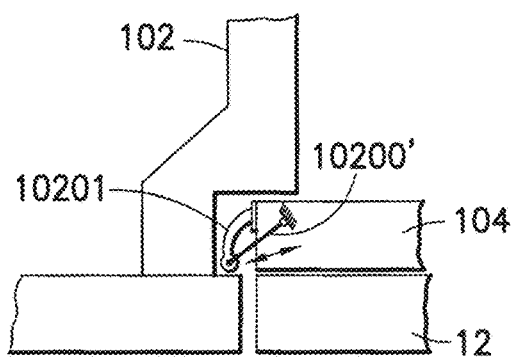
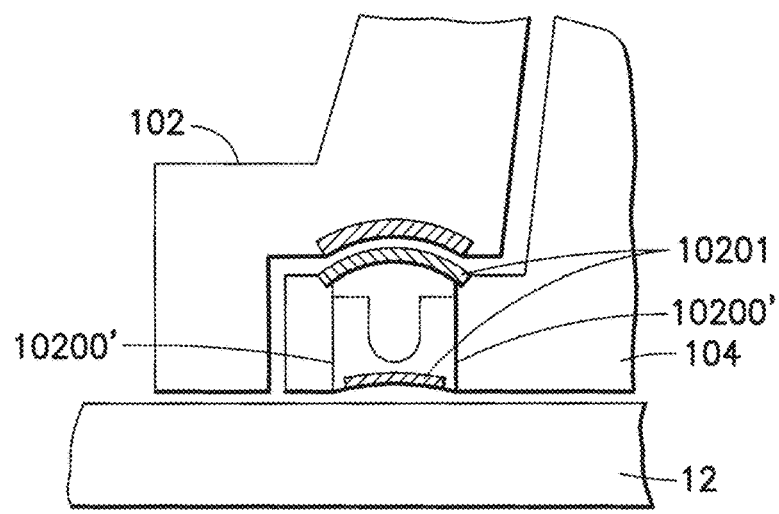
FIG.3J (MISALIGNED)

(ALIGNED)

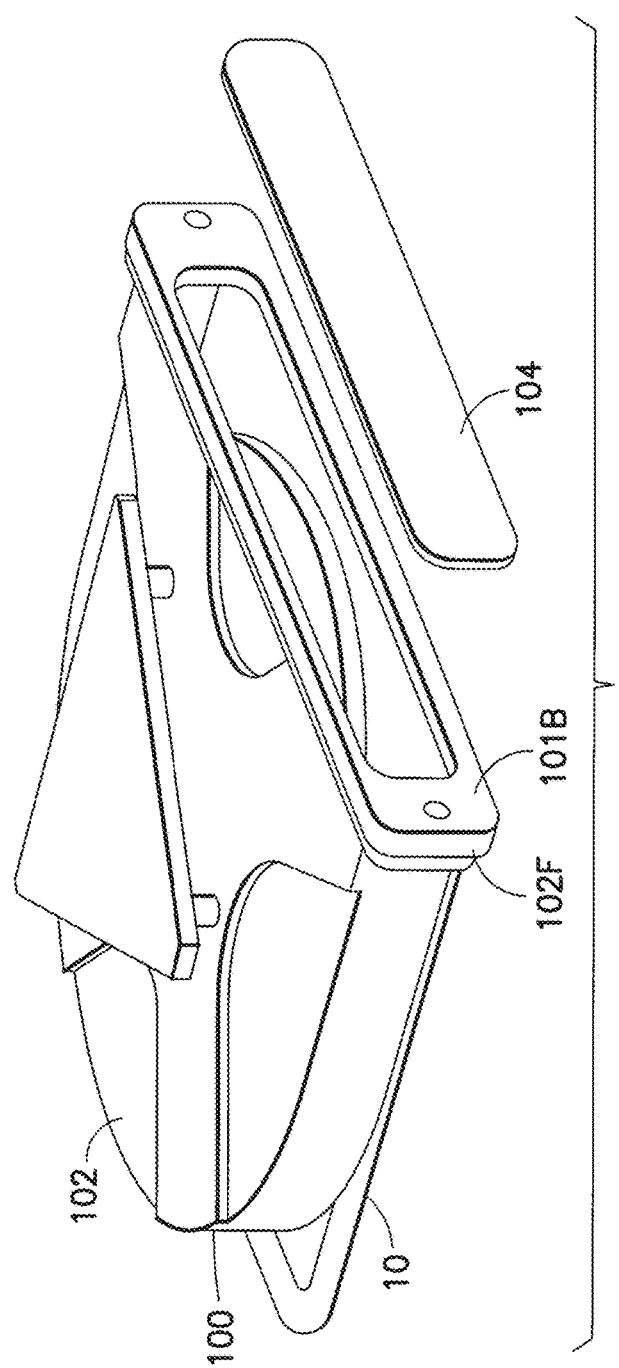
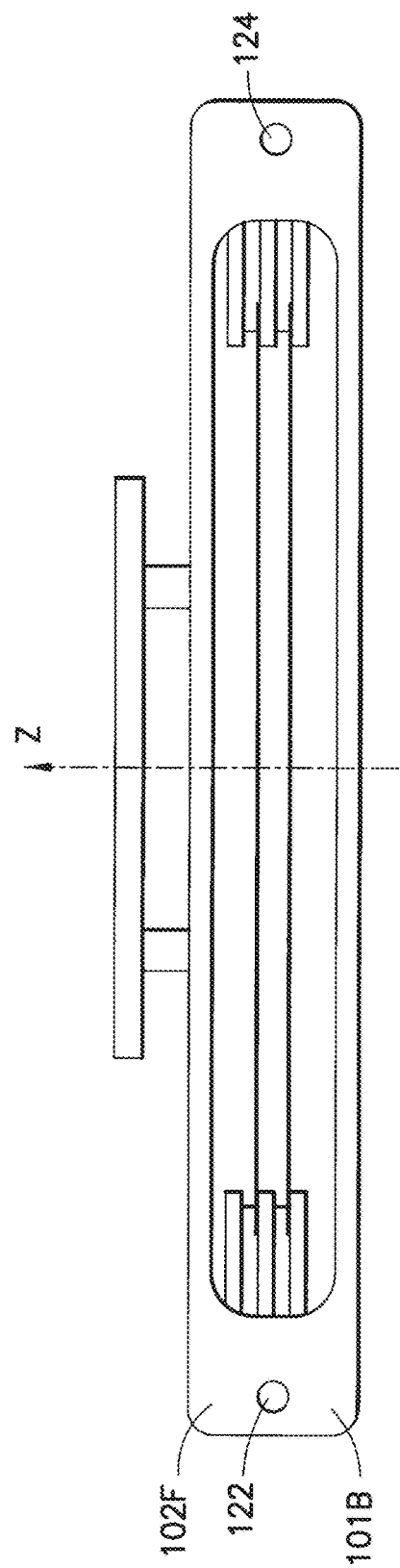

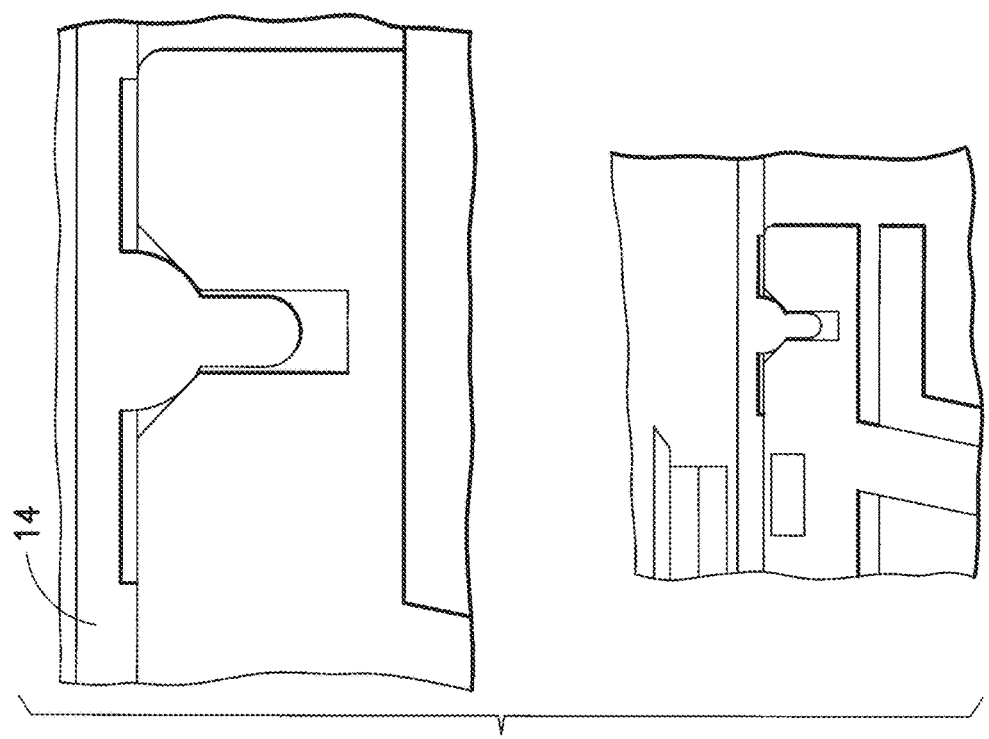
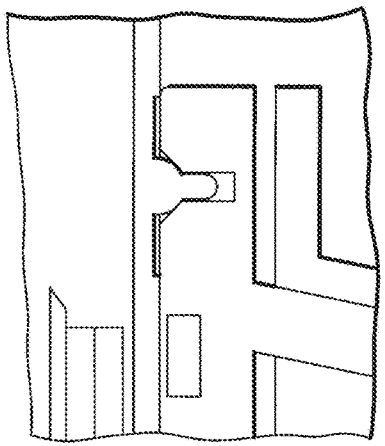
FIG. 9A
FIG. 9B
FIG. 9C

SIDE OPENING UNIFIED POD

CROSS REFERENCE TO RELATED APPLICATIONS

This application is a continuation of U.S. Non-Provisional application Ser. No. 14/822,392, filed on Aug. 10, 2015 (now U.S. Pat. No. 9,978,623), which is a continuation of U.S. Non-Provisional application Ser. No. 12/123,391 filed on May 19, 2008, (now U.S. Pat. No. 9,105,673), which claims the benefit of and priority from U.S. Provisional Patent Application No. 61/043,097 filed on Apr. 7, 2008, U.S. Provisional Patent Application No. 61/024,152 filed on Jan. 28, 2008, and U.S. Provisional Patent Application No. 60/930,634 filed on May 17, 2007 the disclosures of which are incorporated by reference herein in their entireties.

BACKGROUND

1. Field

The disclosed embodiments relate to interface systems for reducing particle contamination of substrates during processing.

2. Brief Description of Related Developments

There is a desire in the semiconductor industry to reduce wafer cycle time through the FAB and reduce the amount of work in progress (WIP) as well as to improve wafer safety. Conventionally, the carrier to load port physical interface is a multi-step process involving up to six mechanisms to perform the carrier load and unload operation. In this environment, the load port cycle time ranges for example from 12-18 seconds depending on the manufacturer and can reach 2 million cycles over a 7 year life in extreme applications. A lot size of 25 wafers per conventional carrier is used to optimize tool utilization and minimize the effect of tool setup and wafer handling overhead. Conventional semiconductor manufacturing has been generally focussed on high volume with a low mix of product types flowing through the production line. In contrast, the practices of the manufacturing environment has tended to migrate so that it consists of many product types of both high and low volume. Essentially, changes in the semiconductor business model are driving fab managers to minimize inventories and reduce manufacturing cycle times. The later is heavily influenced by the lot size in the wafer carrier. Some suggest that a lot size smaller than 13 wafers is a point at which significant gains in cycle time can be realized. One end of this approach is to drive the lot size for example to a single wafer. Although a single wafer may be theoretically ideal, the current state of process tool architecture is not compatible with the level of recipe changes related thereto and thus drives up tool setup time. The length of setup time on some tools can be equal to or greater than the processing time of the single wafer negating the original intentions. In addition, due to the complexity in characterizing advanced process tools, it is desired that some number of test or qualification wafers confirm that the process is operating within specification. These non-product wafers may be used and handled in conjunction with a single wafer strategy.

A smaller, multi-wafer lot size may be effectively employed to support the single wafer strategy. However, as may be realized, variance in the lot size of the carrier has a commensurate impact on the load port design. Specifically, the cycle time of the load port may be generally linearly proportional to the lot size. For example, to avoid limiting the process tool throughput a 12 second cycle time on a 25 wafer lot may use a 2.4 second cycle time on a 5 wafer lot. Recalculation of the load port life with a reduced cycle time results in 10 million cycles over a 7 year life for the same steady state throughput. A further aspect of a load port which can open or close the carrier in ⅕ of the time it must possess inherent reliability; otherwise, the mean cycle between failures (MCBF) of the load port will negatively impact the tool level MCBF.

On the other hand, the impact to the carrier from a reduction in lot size and cycle time is two-fold. First, the lot size reduction impacts the time to open or close the carrier on the load port. Second, manufacturing cycle time impacts the number of desired open/close cycles of the carrier. A simple calculation can approximate the total cycles of a carrier based upon the number of mask layers, process steps per layer and the days per mask layer. Currently 27 mask layers with 32 process steps each are typical. The number of days per mask layer varies depending on the device and manufacturer but a reasonable estimate is 1.5 days per masks layer. For the purposes of the example calculation it may be assumed that the carrier may be loaded onto a different tool for each process step (a conservative assumption).

Process Steps÷Days per Mask Layer=Cycles$_{Carrier}$/Day

32÷1.5=21.33 Cycles$_{Carrier}$/Day

Taken to the extreme, device manufacturers have suggested that it is highly desired that the days per mask layer be reduced to 1-0.7 days to achieve optimal productivity and that future-devices may employ up to 45 mask layers. Inserting the forecasted changes into our previous example calculation we compute the following new values for carrier cycle time. The number of process steps per mask layer is assumed to be unchanged.

Process Steps÷Days per Mask Layer=Cycles$_{Carrier}$/Day

32÷0.7=45.7 Cycles$_{Carrier}$/Day

Based on the previous exemplary calculations we can derive the cycles over a seven year life of the carrier to be between 54,498 and 116,764. In other words a carrier may be subjected to open and close cycle every 31.5 minutes. Conventional load ports, carriers and the interface therebetween cannot satisfy the anticipated operational parameters. Associated with the desire for more robust carrier and carrier to tool interface (for example with respect to ability to withstand substantially higher (e.g. X2-X10) cycles and hence provide higher cleanliness within the carrier and across the interface) is the desire to simplify and speed the system that gets the substrates to the different process modules, that carry out the various process steps, bending what is achievable with conventional load ports and carriers.

SUMMARY

In one exemplary embodiment a substrate processing system is provided. The substrate processing system includes a processing section arranged to hold a processing atmosphere therein, a carrier having a shell forming an internal volume for holding at least one substrate for transport to the processing section, the shell being configured to allow the internal volume to be pumped down to a predetermined vacuum pressure that is different than an exterior atmosphere outside the substrate processing system, and a load port communicably connected to the processing section to isolate the processing atmosphere from the exterior atmosphere, the load port being configured to couple with the carrier to pump down the internal volume of the carrier and to communicably connect the carrier to the processing section, for loading the substrate into the processing section through the load port.

In accordance with another exemplary embodiment, a substrate carrier configured for coupling to a load port of a substrate processing system is provided. The substrate carrier includes a shell and an internal volume formed by the shell, wherein the shell is configured such that the internal volume can be pumped down to a predetermined vacuum pressure when the carrier is substantially located in an atmospheric environment.

In accordance with still another exemplary embodiment, a method is provided. The method includes coupling a substrate carrier to a load port of a substrate processing system and pumping down an internal volume of the substrate carrier to a predetermined vacuum pressure while one or more exterior surfaces of substrate carrier are exposed to an atmospheric environment.

In accordance with yet another exemplary embodiment, a substrate processing system is provided. The substrate processing system includes a carrier for holding substrates therein, the carrier having first and second carrier registration features, and a load port configured to communicably connect the carrier to a processing section of the substrate processing system, the load port comprising, a first carrier interface having first registration features configured such as to form a first kinematic coupling with the first carrier registration features for coupling the carrier to the first carrier interface, and a second carrier interface arranged at an angle in relation to the first carrier interface, the second carrier interface having second registration features configured such as to form a second kinematic coupling with the second carrier registration features for coupling the carrier to the second carrier interface, wherein the second registration features are configured to allow movement of the carrier relative to the second carrier interface when the carrier is coupled by the second kinematic coupling to the second carrier interface so that the second carrier registration features allow coupling of the first registration features with the first carrier registration features In accordance with still another exemplary embodiment, a method is provided. The method includes registering a carrier on a first registration interface and translating the first registration interface to advance the carrier towards a second registration interface wherein contact between the carrier and second registration interface causes relative movement between the carrier and first registration interface for transferring registration of the carrier from first registration interface to the second registration interface.

BRIEF DESCRIPTION OF THE DRAWINGS

The foregoing aspects and other features of the exemplary embodiment are explained in the following description, taken in connection with the accompanying drawings, wherein:

FIGS. 3A-3L illustrate exemplary latches in accordance with exemplary embodiments;

FIGS. 8-8A respectively are schematic perspective and side elevation views of a carrier in accordance with another exemplary embodiment;

FIGS. 9A-9C respectively are a schematic perspective view of a load port interface and cross-sectional views of different portions of the load port interface engaging a carrier in accordance with another exemplary embodiment;

DETAILED DESCRIPTION

Figure 1B:
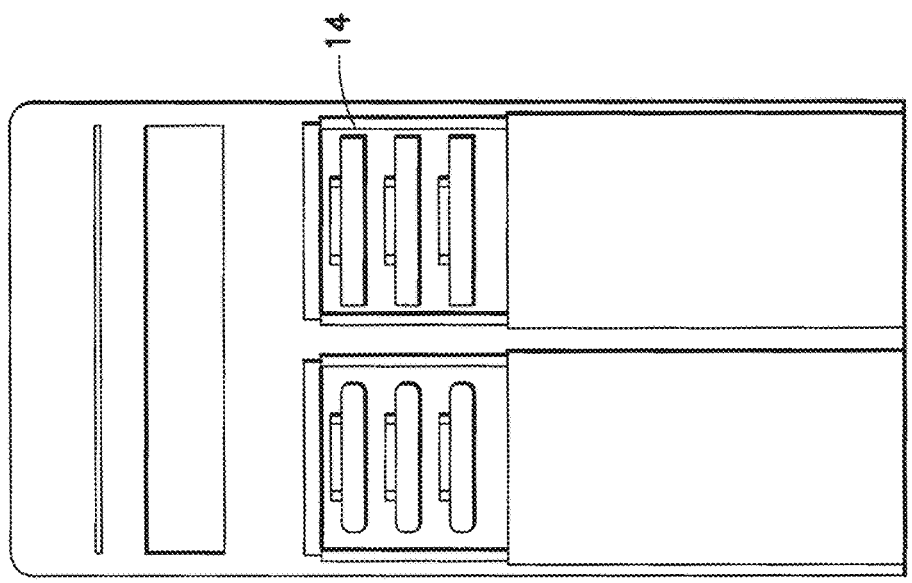
FIGS. 1A-1B are respectively schematic elevation views of a substrate processing tool and one or more substrate carriers or pods incorporating features in accordance with an exemplary embodiment.
Figure 1A:
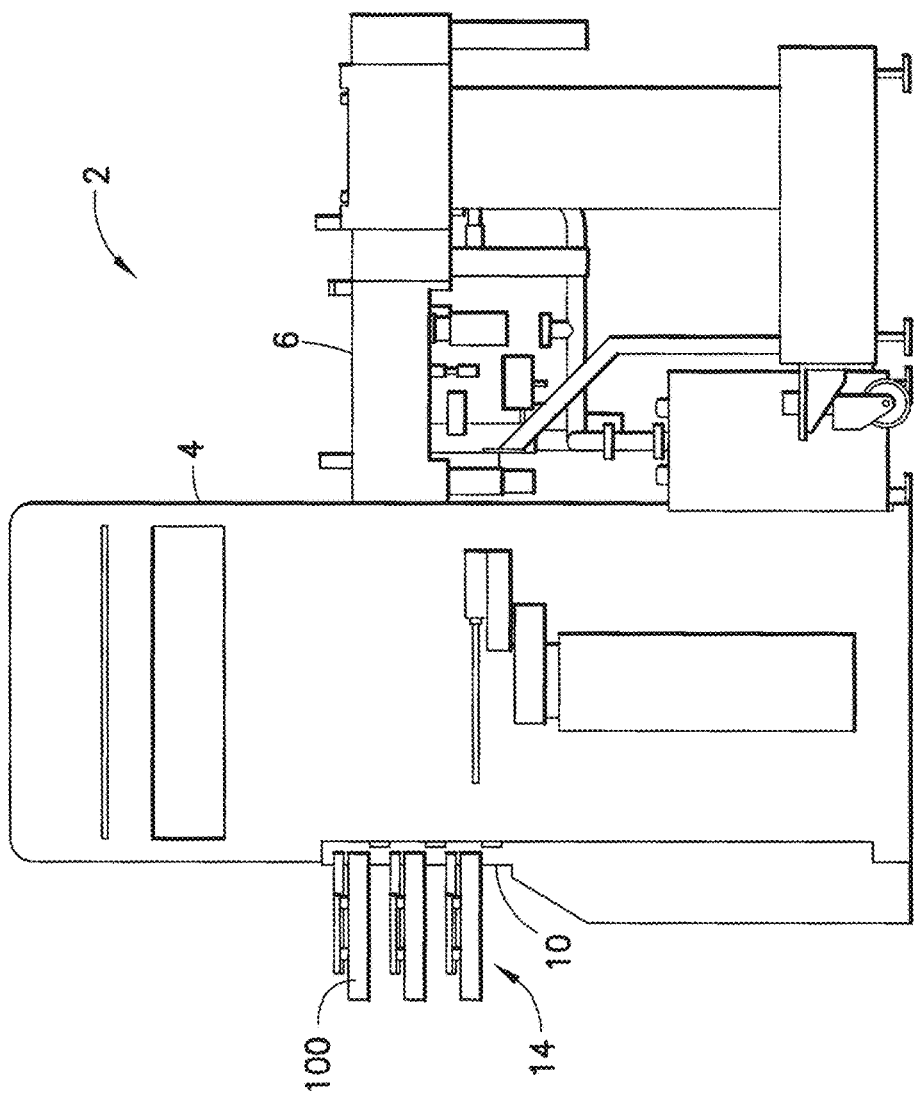

Referring to FIGS. 1A-1B, there is shown a schematic elevation view of a substrate processing apparatus 2, and substrate carriers or pods 100 incorporating features in accordance with exemplary embodiments described further below.

Still referring to FIGS. 1A-1B, the processing tool 2 illustrates therein is merely representative and in alternate embodiments the processing tool may be of any desired type and may have any desired configuration. By way of example, (it is noted that no example described herein is meant as limitation on the features of the exemplary embodiments), the processing tool may be arranged to perform material deposition, ion implantation, etching, lithography, polishing or any other desired process. The tool for example may also be a metrology tool. In the exemplary embodiment shown, tool 2 may generally have a process section 6 and a front end module (FEM) 4 (if using a reference convention in which wafers may be considered to be loaded into the tool from the front). The process section 6 may be isolated and hold desired process atmosphere(s) (e.g. vacuum, inert gas (N2) . . . ). The FEM 4 may be connected to the process sections. In the exemplary embodiment shown, the FEM 4 may contain an atmosphere common with the process section (e.g. a process atmosphere, such as an inert gas). In the exemplary embodiment, the FEM 4 may isolably communicate with process section 6 via a load lock(s) (for example if the portions of the process section may be at vacuum). In alternate embodiments, the FEM may have a clean air atmosphere and in other alternate embodiments the process tool may not have a FEM, and the process section may interface directly with substrate carriers. The carrier(s) 100 may be configured, as will be described below, to allow interface of the carrier directly to the process section 6 independently of the gas species in the process section or carrier or whether the process section is vacuum. As seen in FIGS. 1A-1B, the FEM 4 has an interface(s) for substrate carriers 100. The interface, which may also be referred to as a load port 10, allows carriers to interface the FEM 4, and hence the tool 2, in order to allow loading and unloading of wafer/substrates to and from the tool. The FEM 4 may include desired environmental controls (as will be described further below) to enable loading of wafers (from an environment exterior to the tool) into the tool without degradation of the process atmosphere. The carrier(s) may define a chamber holding the substrates for example in a clean atmosphere (with a gas species that may be the same or different than the process atmosphere. The interface between carrier and load port may define what may be referred to as a clean tunnel between carrier chamber in which the substrates are transported, between carrier chamber and process atmosphere, such as in the FEM 4 or in the process section 6, without degradation of the process atmosphere as will be described in greater detail below.

Figure 2:
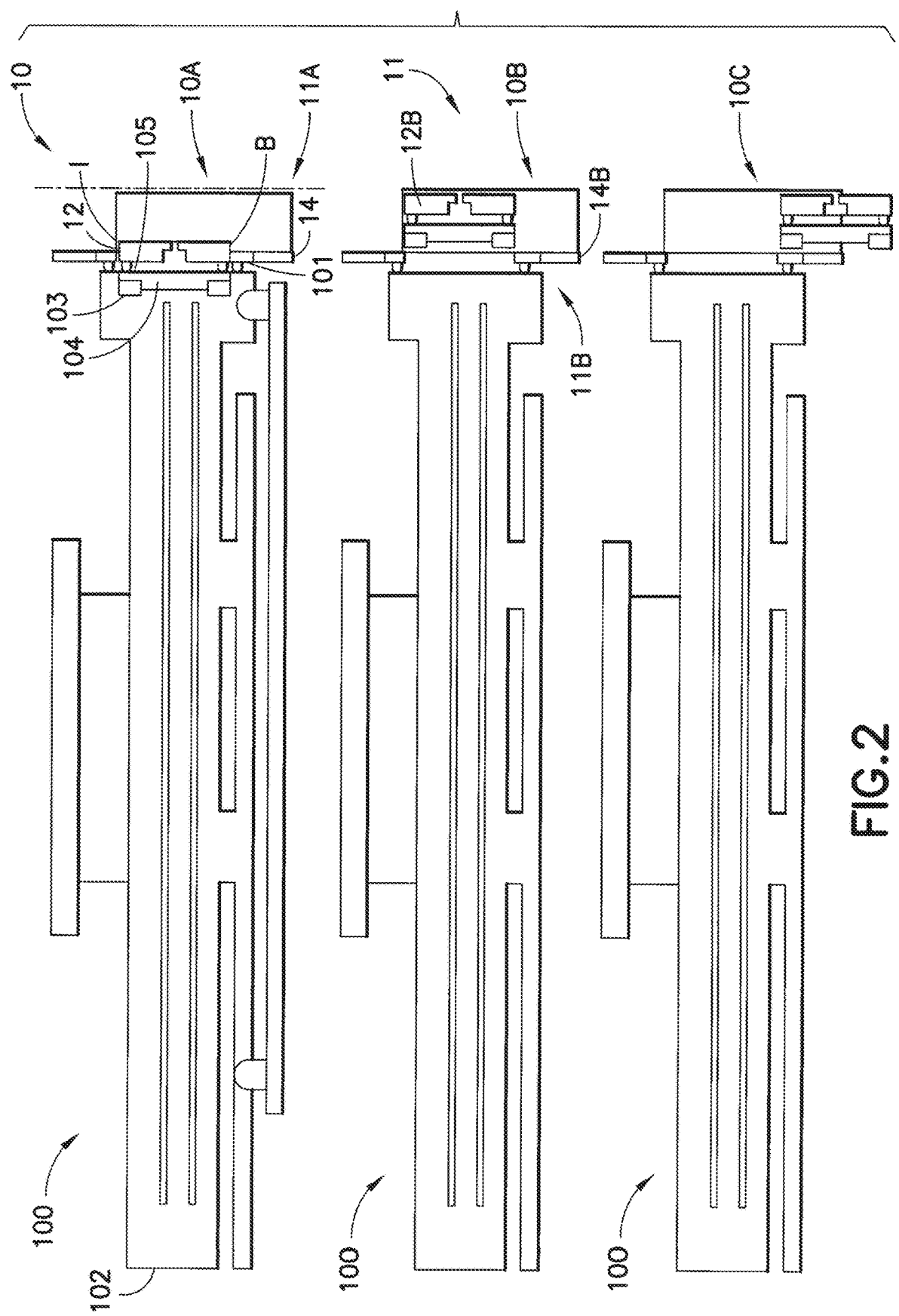
FIG. 2 is a schematic partial elevation view of a load port of the processing tool in FIG. 1 and carriers interface with the load port.

Referring also to FIG. 2, which is an enlarged partial schematic elevation view of the load port 10 and carriers 100, the communication interface I (e.g. clean tunnel) between the carrier chamber and the FEM atmosphere, may generally include for example interfaces that may be generally identified, for example purposes, as carrier shell to carrier door interface 103, carrier shell to load port flange interface 101 and carrier door to load port door interface 105 and load port door to load port flange interface 13. In alternate embodiments the interface that effects communication between carrier chamber and FEM atmosphere or process section atmosphere or vacuum may have any other desired configuration with more or fewer interfaces, (for example two or more of the aforementioned interfaces may be combined into a common interface). As may be realized, in the exemplary embodiment, the clean tunnel (between carrier chamber and process atmosphere) provided by the multi-interface I may be open or closed (e.g. opened when the carrier is interfaced with the load port and closed at all other times until carrier interface is complete). The clean tunnel remains clean (e.g. substantially no degradation to the interior atmosphere) when the tunnel is open and closed as well as during opening and closing of the tunnel. Thus as may be realized to establish and maintain the clean tunnel, each of the interfaces of the communication multi-interface I may be sealed as the given interface is closed such as to isolate the carrier chamber atmosphere, or process atmosphere from an outside atmosphere or dirty surfaces (such as may be subjected to exterior atmosphere). For example carrier shell to carrier door interface 103 may be sealed to isolate the carrier atmosphere, and load port door to load port flange interface 13 may be sealed to isolate the FEM or process section atmosphere or vacuum (such as when the clean tunnel is closed). Also the carrier door to load port door interface 105 may be sealed to isolate exterior (e.g. dirty/surfaces for example on the carrier door and load port door from the clean tunnel atmosphere, and the carrier shell to load port flange interface 101 may be sealed to isolate the process atmosphere from the outside atmosphere (such as when the clean tunnel is opened). In the exemplary embodiment, the interfaces, such as between carrier shell and door 103, shell and load port flange 101, carrier door and load port door 105, and load port flange and door 13 may be solid state at least in part as will be described further below, to minimize moving parts exposed to the clean tunnel. Suitable examples of interfaces between carrier and load port are described in U.S. patent application Ser. No. 11/207,231, filed Aug. 19, 2005; Ser. No. 11/211,236, filed Aug. 24, 2005; Ser. No. 11/210,918, filed Aug. 23, 2005; Ser. No. 11/594,365, filed Nov. 7, 2006; Ser. No. 11/787,981, filed Apr. 18, 2007; and Ser. No. 11/803,077, filed May 11, 2007 all incorporated by reference herein in their entirety.

Still referring to FIGS. 1A-1B and 2, in the exemplary embodiment the load port 10 may be configured to interface with reduced or small capacity carriers 100. Suitable examples of small capacity carriers with features similar to carriers 100 and suitable examples of a load port interface with features similar to load port 10 are described in U.S. patent application Ser. No. 11/207,231, filed Aug. 19, 2005; Ser. No. 11/211,236, filed Aug. 24, 2005; Ser. No. 11/210, 918, filed Aug. 23, 2005; Ser. No. 11/594,365, filed Nov. 7, 2006; Ser. No. 11/787,981, filed Apr. 18, 2007; and Ser. No. 11/803,077, filed May 11, 2007 previously incorporated by reference herein. In the exemplary embodiment, the load port interface 11 may be arranged for example to meet present EFEM interface standards. For example, the load port 10 may fit within the BOLTS interface established by SEMI E63, such as for a conventional twenty-five (25) wafer load port, and may position the carriers 100 within the space envelope identified by SEMI E15.1. In the exemplary embodiment load port 10 having a generally stacked load port configuration capable of interfacing a stack of carriers 100, and presenting substrates, within the carriers, to the tool transport apparatus such as at a height between what would be the lowest and highest wafers in a twenty-five (25) wafer stack of a carrier conforming to the standards in SEMI E47.1 sitting on the SEMI E151 load port. In the exemplary embodiment, three load port sections 10A, 10B, 10C are shown (for example purposes, and in alternate embodiments the load port may have more or fewer sections) each capable of interfacing a carrier 100 to the FEM. In alternate embodiments, a load port section may be configured to interface more or fewer carriers to the FEM. In the exemplary embodiment, the load port sections 10A-10C and corresponding interfaces 11A-11C may be substantially similar. Each load port section 10A-10C and corresponding interface 11A-11C may be independently and simultaneously operable providing substantially unrestricted FEM access, for wafer transfer, and substantially random access by an automated material handling system (AMHS) (not shown) to undocked carriers on the load port sections. In alternate embodiments, the load port may have any other desired configuration. The substrates handled by the carriers and load port may be of any desired type such as semiconductor wafers of any desired size, such as 450 mm, 300 mm, or 200 mm diameter reticles or pelicles, or flat panels for flat displays.

Figure 3:
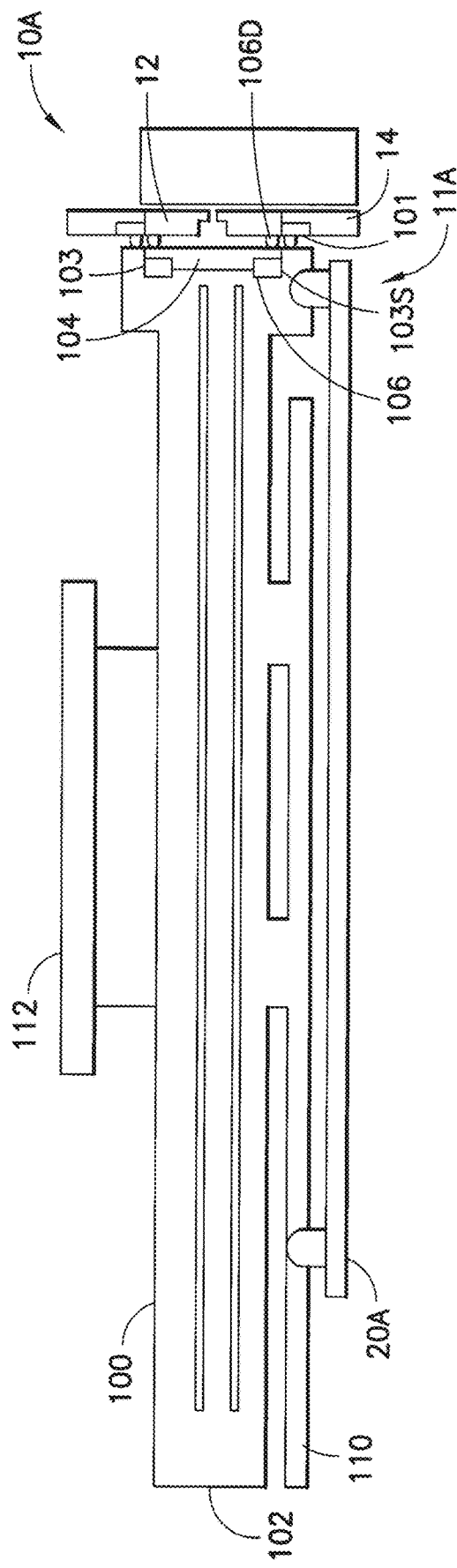
FIG. 3 is another schematic partial elevation view of a load port interface and carrier.

Referring now to FIG. 3, there is shown another schematic elevation view of a carrier 100. In the exemplary embodiment illustrated in FIG. 3, the carrier 100 is resting on load portion section 10A. The carrier 100 shown in the figures is representative, and in alternate embodiments, the carrier may have any other suitable features. In the exemplary embodiment the carrier generally comprises a shell 102 defining the chamber enclosing the substrates (see also FIG. 8). The shell may be made of non metallic material, such as optically clear thermoplastic, polyvinylidine chloride (PVDC), composites or non magnetic metal such as aluminum alloy, magnesium alloys and metallized plastics with for example one or more viewing ports, sealed with an optically clear material (e.g. the viewing ports may be positioned to allow wafer mapping, through the window with beam sensors outside the carrier shell. In alternate embodiments the shell may be made of any suitable material capable of maintaining a sealed environment within the carrier. As seen best in FIG. 8, the carrier shell defines a substrate transfer opening in a side of the shell that is closable by door 104 as will be described further below. The carrier 110 may have couplings or attachments 110, 112 for handling the carrier and positioning the carrier, such as at the load port interface. In the exemplary embodiment, carrier 100 may have a handle or flange 112 for automated gripping of the carrier from the top such as with the AMHS. In alternate embodiments, the top handle 112 may be employed to engage the carrier to the load port interface (see for example FIGS. 7A-7C). In other alternate embodiments, the carrier may have any other desirable handling features on the shell. In the exemplary embodiment, the carrier shell may have a carrier positioning coupling 110, capable of providing repeatable positioning of the carrier such as on the load port interface. For example, the coupling 110 may be a kinematic coupling (e.g. provides substantially automatic repeatable positioning) located on the bottom mating surface of the carrier such as having features substantially in accordance with SEMI E 57.1. In the exemplary embodiment, the coupling between carrier and load port interface with coupling 110 may be relaxed as will be described further below, to eliminate overconstraints in registration of the carrier to the load port interface and ensure desired registration between carrier flange and load port interface flange. In alternate embodiments, the carrier mating surface and registration coupling may be positioned on any other side of the carrier. As seen in FIG. 3, in the exemplary embodiment, the carrier 100 may interface the load port at interface 110 and at interface 101, which if provided in a conventional configuration may generate an overconstrained condition for conventional carrier registration on the load port due to competing interface surfaces of the different interfaces. In the exemplary embodiment, the carrier 100 may interface the load port at interface 110 and at interface 101 without generating an over constrained condition, as will be described further below.

As seen in FIG. 3 and as noted before, in the exemplary embodiment the carrier shell 102 and door 104 mate/interface at interface 103 (shown schematically in FIG. 3) to close the carrier chamber. In the exemplary embodiment, the interface 103 may be sealed with seal 103S, and a door latch 106 may hold the door to the shell when closed. As also seen in FIG. 3 and noted before, the door 104 in the exemplary embodiment may also define at least a portion of the interface 105 to the load port door 12. Hence, in the exemplary embodiment the carrier door 104 may have interface features for interfacing with both the carrier shell (at interface 103) and the load port door (at interface 105), and thus generating a further competing interface and possible constraint on registration of the carrier at the load port (e.g. in addition to interfaces 110, and interface 101 which as noted before is defined between carrier shell flange and load port flange). In the exemplary embodiment shown in FIG. 3, the carrier shell to door interface 103 may be compliant thus positionally releasing the carrier door relative to the shell when the carrier door interfaces the load port door (thus eliminating the constraint due to interfacing the carrier door to both the carrier shell and load port door). Compliance at interface 103 may be effected such as with a suitably compliant seal 103S capable of accommodating and compensating for any mismatches in mating surface of door and shell (to ensure interior cleanliness is not compromised and withstand desired pressure differences between carrier chamber and exterior atmosphere). The door latch 106 may be configured to generate sufficient latching forces to withstand any bias against the door such as from seal compression, pressure differential across door and substrate bias against the door as will be described further below. The door latch 106 may be substantially solid state device (e.g. latching actuation is effected by non-contact methods) to avoid particulate generation. The compliant seal 103S may be incorporated within the latching device so that flexure of compliance of the seal effects latching, and/or the latching device 106 may be integrated into the seal. By way of example, as shown schematically in FIG. 3, seal 103S may be a combination seal and magnet. Seal 103S may be a face seal disposed around the perimeter of the door, with a magnetic ribbon located on the door within the seal, operating on magnetic material in the shell flange to compress the seal. In alternate embodiments, a radial or curved (e.g. seal surface cross section) door seal may be used at the shell to carrier door interface. In other alternate embodiments, the seal may have any other desired configuration.

Figure 3K:
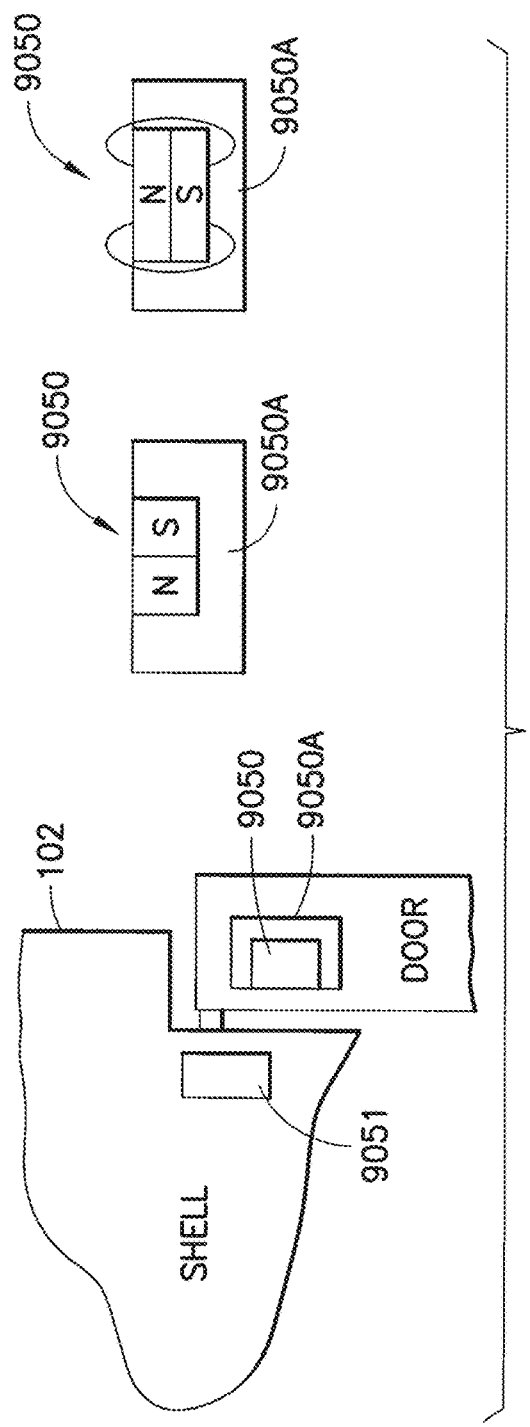

In the exemplary embodiment, the latch device 105 in the carrier may be passive, and actuation (to open/close the latch) may be effected by an active side that may be resident for example in the load port. In alternate embodiments, the active side of the latching device may be resident in the carrier 100. As may be realized, to effect actuation of the latching device demands that power and control be provided to the device. Locating the active portion of the device in the load port, for example, may avoid or minimize power and control demands of the carrier. In the exemplary embodiment shown in FIG. 3, energy transfer to drive the passive section of the latch may be magnetic, such as with an electromagnet (for example position in the load port door) that when energized generates a magnetic field sufficient to decouple the permanent magnet on the carrier door from the magnetic material in the shell 102. In other exemplary embodiments, the energy transfer to the latching device may be effected by induction, or electrical contact pads between carrier 100 and load port 10A. In other alternate embodiments, actuation energy may be stored on the carrier 100 and control commands may be transmitted wirelessly to the carrier 100 for operating the latch. In the exemplary embodiment, actuation input for actuating the latch 106 may be applied via the carrier door 104, though in alternate embodiments actuation input may be applied to the carrier shell. FIGS. 3A-3E are partial cross sectional views of the carrier shell to door interface 105 and door latch in accordance with different exemplary embodiments. In the exemplary embodiments shown the door latch actuation is magnetic, and the active portion of the device is shown for example in load port door 12. Accordingly, in the exemplary embodiments shown actuation of the active part effects actuation of the shell or carrier to door latch 106 in combination with actuation of the carrier door to load port door latch 106D. As may be realized, the latch configurations shown in FIGS. 3A-3E are merely exemplary, and in alternate embodiments the carrier door latch (both to the shell and load port door) may have any other desired configuration. In the exemplary embodiment shown in FIG. 3A, the magnetic latch may include permanent magnets 9050 in the carrier door operating on ferrous materials 9051 in the carrier shell. In alternate embodiments, the permanent magnets may be in the shell and magnetic material in the carrier door. The configuration for example may effect a closed magnetic circuit when the carrier door latch is closed (active portion is off), thus minimizing the potential of stray magnetic fields. As can also be seen in FIG. 3K, in the exemplary embodiment a ferrous material 9050A may also partially surround the permanent magnets 9050. This ferrous material may be configured to form what may referred to as a shield around the magnets prevent or minimize stray magnetic within the carrier as well as exterior to the carrier is desired. Though FIG. 3K illustrates the ferrous shield 9050A used with the latch magnet arrangement as in FIG. 3A, the ferrous shield may be used to shield the latch magnets having any other desired configuration, such as shown in FIGS. 3B-3H and 3K-3L. The configuration of the ferrous shield (and magnets) shown in FIG. 3K is illustrated schematically and in alternate embodiments the ferrous shield 9050A (and magnets) may have any suitable configuration in relation to the latch magnets that may prevent or minimize stray magnetic fields from the interior and exterior of the carrier. It is noted that the magnets 9050 and/or ferrous material/plates 9051, 9050A may be embedded in other non-ferrous materials or coated for corrosion resistance.

In the exemplary embodiments, the active portion may be an electromagnet 9052, which may be positioned in the load port door for example as shown in the figures. When the active portion is actuated (e.g. turned "on") actuative forces between the permanent magnets 9050 in the carrier door 104 and magnetic material 9051 in the shell 102 are overcome by the effects of the magnetic field from the electromagnets 9052 in the load port door 12, releasing the carrier door/shell latch 106 and closing the carrier door to load port door latch 106D. As may be realized, the carrier door 104 may be moved with the load port door 12, such as when the load port is opened, and hence moving the permanent magnets 9050 in the carrier door which when in the latch open position may define an open magnetic circuit away from the substrate transport opening in the load port (for example to minimize undesired magnetic fields). As can be seen in FIG. 3B, in accordance with another exemplary embodiment, the carrier door 104 may include permanent magnet 9050 connected to one side of a flexure 9060 and a ferrous material 9050D connected to the other side of the flexure 9060. The flexure 9060 may be made of any suitable resiliently flexible material(s). When the electromagnet 9052 is activated it may interact with the ferrous material 9051D to move the flexure causing a displacement of the permanent magnet 9050 relative to the ferrous material 9051 in the door (e.g. releasing the carrier door/carrier shell latch and causing latching between the carrier door and load port door). In the example shown in FIG. 3C, the permanent magnet 9050 in the carrier door 104 may be rotatable such that when the electromagnet 9052 is activated the permanent magnets 9050 rotate so that the interaction of the ferrous material 9051, permanent magnets 9050 and electromagnet 9052 is such that carrier door/carrier shell latch 106 is released and the load port door/carrier door latch 106D is engaged. In the exemplary embodiments illustrated in FIGS. 3D-3E, the latch portion in the carrier door may be an induction electromagnet 9050', 9050" with active coil 9052' located in the port door 12 to activate the induction electromagnets and thus latch/unlatch the carrier door from the carrier shell. As can also be seen in FIG. 3E, the carrier shell, in an exemplary embodiment, may include permanent magnets 9051' to interact with the induction electromagnet 9050". The induction electromagnet arrangements in FIGS. 3D-3E may operate in a substantially similar manner as that described above with respect to FIGS. 3A-3B. The configuration of the induction electromagnets, as well as of the passive and active elements illustrated in FIGS. 3A-3E are merely exemplary and in alternate embodiments the passive and active elements of the solid state (or near solid state) latches between the carrier shell and door, and carrier door and port door may have any other suitable configuration and may comprise more or fewer elements.

Figure 3L:
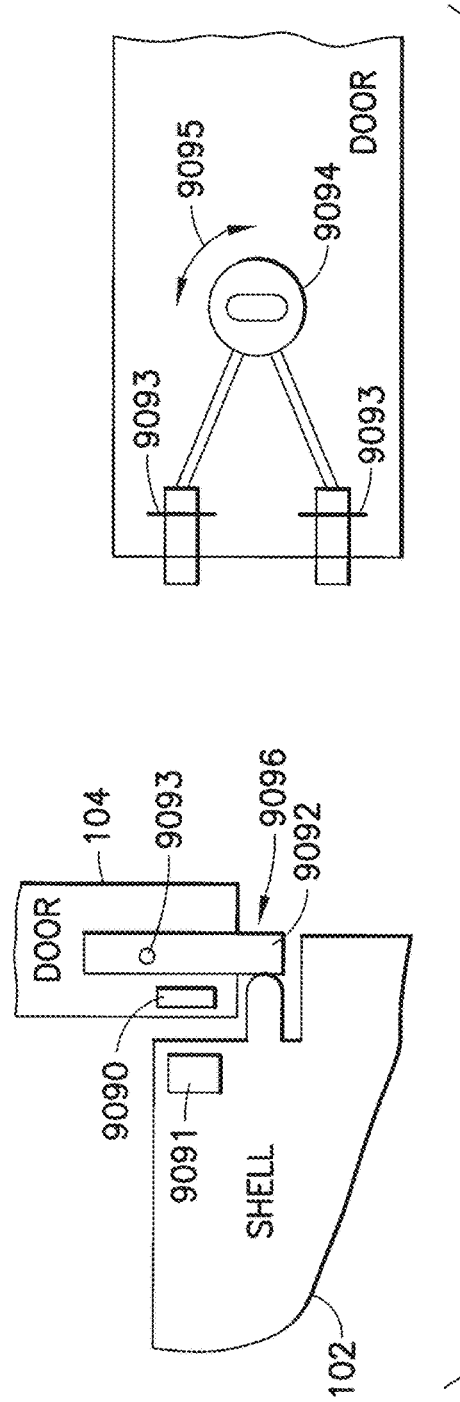

Referring to FIG. 3L, in other exemplary embodiments, the magnetic latch between the carrier and door may be unlatched mechanically. For example, the magnetic latch/seal shown in FIG. 3L may include magnets 9090 and magnetic (e.g. ferrous) material 9091 respectively located in the door 104 and carrier shell 102, for example, in a generally similar arrangement to that shown in FIGS. 3A-2C through in alternate embodiments the latch may have any other desired configuration. The magnetic latch/seal may be released mechanically through, for example, the activation of the latch finger 9092. The latch finger 9092 may be pivotally mounted at least partially in the door 104 about a pivot 9093. The latch finger 9092 may be operably coupled to, for example, a movable latch key hole 9094 of the door 104 (shown, for example, as being rotatable, though it may be movable in any other desired manner, such as translation). The key hole may be engaged and moved by keys, such as from the load port door. In the exemplary embodiment shown, as the latch key 9094 is rotated in the direction of arrow 9095 the latch members or fingers are caused to pivot in the direction of arrow 9096 to, for example, urge the door 104 away from the carrier shell 102 thereby releasing the magnetic latch. It is noted that the configuration shown in the figure is exemplary only and in alternate embodiments the magnetic latch/seal between the door and carrier may be mechanically released in any suitable manner. For example, the magnets or magnetic material may be mounted or linked to the latch fingers so that movement of the latch fingers moves the magnets/magnetic material of the carrier door latch away from each other to release the latch. Conversely, engagement of the latch may be effected by reverse movement of the latch fingers.

Referring now to FIG. 3F there is shown other schematic partial cross-sectional views of the carrier shell and door interface and latch 106 in accordance with another exemplary embodiment. In the exemplary embodiment shown, latching is effected by some positive displacement (such as with a flexible member or piezo-electric effect) between carrier shell 102 and carrier door 104 along the interface generating substantially an interference compression therebetween substantially around the interface perimeter. The interference between carrier shell 102 and door 104 may be positioned to cooperate with bias forces for example on the carrier door 104 (such as from pressure differential across the door) and increase the compression and hence latching forces between the shell 102 and carrier door 104. The displacement section may be positioned in the carrier shell 102, carrier door 104 or both. To release the latch 106, the displacement section may be actuated to release compression on the carrier door 104. In the exemplary embodiment, the displacement section may have a flexure member 9099 that may be actuated to effect latching and unlatching. Actuation of the flexure member 9099 may be for example by vacuum (e.g. vacuum bladder), by magnetics, electroactive polymers, shape memory alloys (SMA) or any other suitable actuation means.

Referring to FIGS. 3I and 3J examples of SMA members are shown that may be used to actuate the, for example the flexure member 9099 or similar latching member. As may be realized, though SMA has memory, it does not store energy. In the exemplary embodiments, the SMA may be however an effective solid state actuator. In the exemplary embodiments, the latch mechanism may be normally biased to a closed position such as by material flexure, spring, magnetic input, and the SMA member (or wire (which may be integrated into the carrier) pre-stressed by the closing bias may be actuated, such as via electrical or heat input from the load port, to overcome the closing bias and displace the flexure member to open the latch. In one exemplary embodiment as shown in FIG. 3I the SMA member such as wire 10200 may be connected to a latch which is normally biased to the "latched" state. This type of latch could be a pivotally mounted finger 106' which rotates in either a horizontal or vertical plane. In an alternate embodiment, the pivot could be replaced with a flexure. In another exemplary embodiment, as shown in FIG. 3J a gasket 10201 with sufficient elasticity to pre-stress the SMA member(s) 10200' may be used which may be collapsed by the SMA member(s) 10200' at actuation. A variation on the collapsible gasket would employ a wiper type gasket which is deflected by the SMA member pulling on the tip of the wiper. The bent wiper creates enough separation for the door to be released and removed.

Figure 19:
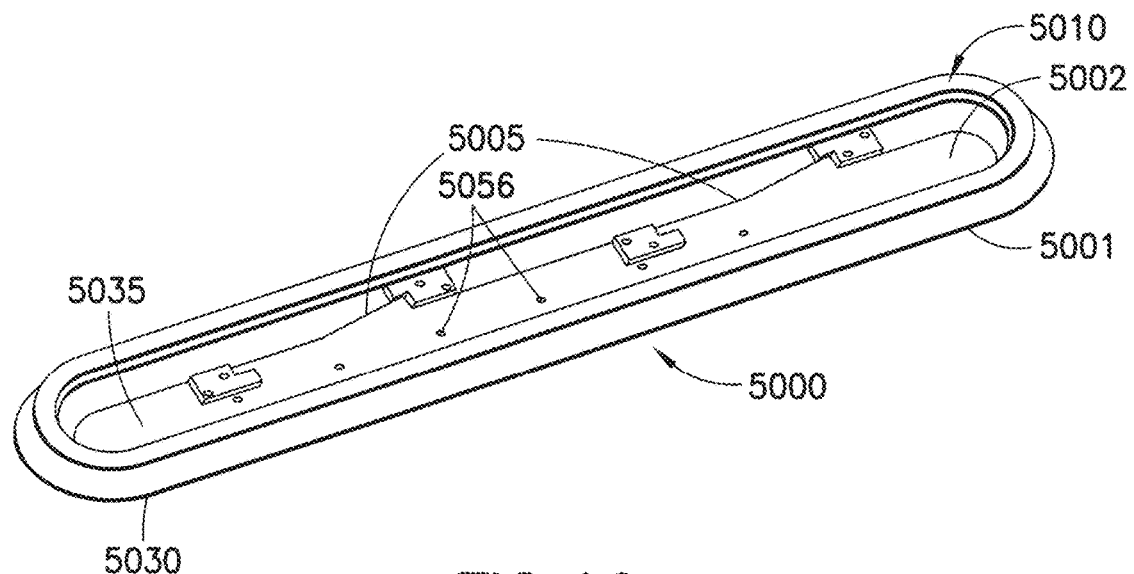
FIGS. 19 and 20 are respectively perspective and side views of an actuator in accordance with an exemplary embodiment.
Figure 20:
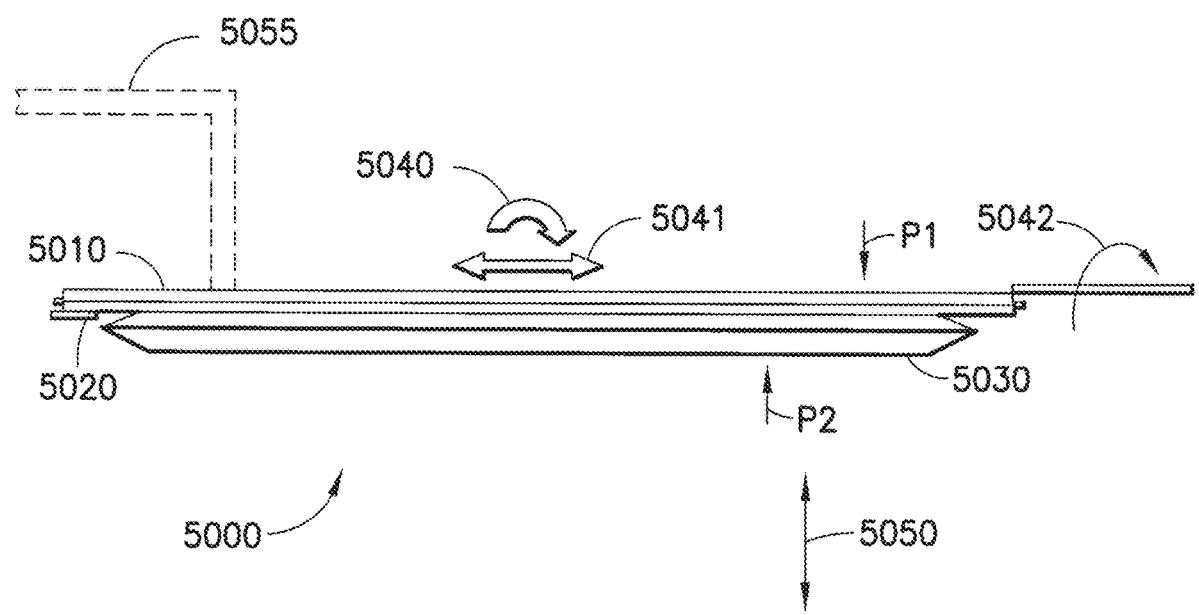

In other examples, a vacuum (e.g. bladder actuator) for example, having a configuration similar to actuator 5000 in the exemplary embodiments shown in FIGS. 19 and 20 may be used to actuate a latching member similar to flexure member 9099. The bladder actuator similar to actuator 5000 may be configured to actuate the flexure member 9099 (see FIG. 3F), or any other suitable actuable mechanism or device (see also FIGS. 3A-3L) of, for example, the processing tool and carriers including, but not limited to, load port or substrate carrier doors, gate valves, and latches. In this example the actuator 5000 is configured generally as a vacuum or partial vacuum bladder. In alternate embodiments, the actuator may have any other suitable configuration. The actuator 5000 may be configured to minimize the overall size of the actuator 5000 with respect to the stroke of the actuator 5000 (e.g. maximize the stroke to size ratio of the actuator). In the exemplary embodiment, the actuator 5000 may be controlled to operate inside a controlled clean environment such as inside a carrier or inside a process tool. In the exemplary embodiment shown, the actuator may generally have a base or substantially fixed surface 5020, a moveable surface 5030 and a power or drive surface 5035 capable of effecting movement of the moveable surface 5030 and hence actuating the actuator 5000. As can be seen in the Figure, the fixed surface may have a seal 5010 for sealing the actuator against any suitable surface so that, for example, a pressure differential may be created on either side of the actuator. In the exemplary embodiment the power surface 5035 is shown and referred to as a bladder for example purposes only, and in alternate embodiments the power surface 5035 may have any other suitable shape or configuration. As may be realized, the fixed surface 5020, shown illustratively in FIGS. 19-20, may be mated to a fixed surface or member of the tool or carrier frame, and the moveable or actuator surface 5030 may be connected to the actuated mechanism so that movement of the movable surface, under the impetus of a pressure differential (e.g. the difference in pressure between pressure P1 and pressure P2 located on opposite sides of the drive surface 5035) across the drive surface 5035 causes actuation of the mechanism. In the exemplary embodiment the drive surface 5035 may be shaped to form an inner space or volume 5002 and may form an isolation boundary or membrane substantially isolating the interior space 5002 bounded thereby, and any moving components located therein such as described further below for example, from the space outside the drive surface 5035. The drive surface may be made from any suitable material to eliminate or minimize particulate formation when the drive surface 5035 moves during actuation. In the exemplary embodiment, the drive surface 5035 is connected to the fixed surface 5020 of the actuator 5000 and to the moveable surface 5030 of the actuator, and a portion of the drive surface 5035 is arranged (as shown in FIGS. 19-20 for example, though in alternate embodiments there may be any other surface arrangement) to move relative to the fixed surface 5020 when subjected to a desired pressure difference across the drive surface 5035. The degrees of freedom and rate of actuation may be controlled as described further below, and may be achieved if desired without use of electronic control or electrical power.

As noted before, the activation of the actuator 5000 (e.g. extension and retraction) may be controlled through, for example, the pressure difference on the bladder of the actuator and the rate of actuation may be controlled by the size of 5000 orifices in flow lines 5055 or leak points 5056 located through the drive surface 5035 around the actuator 5000, for example purposes. The location of the of the leak points 5056 and flow lines 5055 are exemplary only and in alternate embodiments the flow lines and leak points may have any suitable location on or relative to the actuator. The orifices may be connected to, for example any suitable atmosphere of the processing tool 2 (or external environment such as the ambient environment around the tool) and may be in flow communication with an internal volume of the actuator. In one example, the differential pressures P1, P2 between a vacuum environment and atmospheric environment of the processing tool 2 provides, for example, linear motion of the vacuum actuator 5000. For example, the outside of the bladder 5001 may be exposed to a vacuum environment of the processing tool while the inside 5002 of the bladder is exposed to an atmospheric environment of the processing tool 2. For example, as can be seen in FIG. 20, for exemplary purposes only, the vacuum environment may be provided by the flow lines 5055 (e.g. the flow lines may cause pumping down of a chamber in communication with the drive surface 5035 as will be described below). As may be realized, as the vacuum pressure increases the differential pressure P1, P2 between the vacuum and atmospheric pressures increases causing actuation of the actuator (and vice versa). In other embodiments one side the actuator may be pressurized, as will be described below, for moving the actuator. In alternate embodiments the outside 5001 of the bladder may be exposed to the atmospheric environment while the inside of the bladder 5002 may be exposed to the vacuum environment. In one exemplary embodiment, any suitable filters may be placed in the orifice(s) and/or at the leak point(s) to prevent or minimize any particles generated within the actuator 5000 from entering, for example, the load lock or any other suitable controlled clean environment. In alternate embodiments, the actuator 5000 may have its own pumping system for inflating and deflating the bladder for actuating the actuator 5000. The speed (e.g. acceleration and deceleration) at which the actuator 5000 is activated may be controlled in any suitable manner such as by, for example, orifice restrictions that may be fixed or variable, including but not limited to valves, in the flow lines and/or in the leak points around the actuator 5000.

In one exemplary embodiment, the extension and retraction of the actuator 5000 may be guided to fix a predetermined number of degrees of freedom movement of the actuator 5000. For example, as can best be seen in FIG. 20, the actuator 5000 may be configured so that it extends and retracts linearly in substantially the direction of arrow 5050 while movement of the actuator in other directions (e.g. linear and rotational) such as those indicated by arrows 5040-5042 are restricted. In alternate embodiments the actuator 5000 may have any suitable number of degrees of freedom for actuation in any one or more directions. In this example, the actuator 5000 may include any suitable linkage(s) 5005 for guiding the movement of the actuator 5000. Here the linkage may be a "scissor" or "accordion" linkage but in alternate embodiments the linkage may have any suitable configuration. The scissor or accordion linkage may provide a compact profile when retracted or folded while maximizing the extension or reach of the linkage when in an unfolded configuration (e.g. maximize a containment to reach ratio of the actuator). In alternate embodiments, the linkage may include extendable rails where one or more rails are connected in series and configured with different widths and heights so that the smaller rails slide into larger rails in the series of rails providing a telescoping extension and retraction of the rails. In other alternate embodiments, the bladder may be constructed of a self guiding material such as, for example, a mesh material that is constructed so that as the drive surface is moved via the pressure differential the mesh guides, for example, the linear movement of the actuator 5000. In still other alternate embodiments the movement of the actuator may be guided in any suitable manner.

Here the linkage 5005 is located inside 5002 the bladder so that any particulate generated by the linkage is not exposed to the vacuum or otherwise clean environment within the processing tool. In alternate embodiments the linkage may be located outside the bladder. In still other alternate embodiments the particulate that may be generated by the linkage may be contained in any suitable manner. While the actuator is described as being a linear actuator in alternate embodiments the actuator can be configured for rotary actuation. In still other embodiments the linear motion of the actuator may be converted into rotary motion in any suitable manner. In still other alternate embodiments the actuator may include two bladders connected to a common actuator chamber for providing two degrees of motion having any spatial relationship to each other. For example, one of the bladders may be configured to move a door substantially perpendicular relative to a door interface surface of a substrate passage opening while the second bladder is configured to move the door substantially parallel to the door interface surface so that the substrate passage opening in unobstructed by the door. The multiple bladders may be constructed with different properties, including material and thickness of the bladder material, so that the bladders may be actuated at different times depending on a predetermined actuation pressure differential of each of the bladders. As may be realized, the bladders described herein may be configured in any suitable orientation and may be arranged in parallel or in series with respect to one another to provide a desired actuation.

Referring now to FIGS. 3G-3H are schematic partial cross-sectional views of the carrier shell to door interface and latch respectively showing exemplary configurations of a displacement type latch in accordance with different exemplary embodiments. In the example shown in FIG. 3G the latch includes ferrous material 10001 located in the carrier shell 102 and a permanent magnet 10002 in the carrier door 104. A flexible material or gasket 10003 may be attached to the carrier door 104 such that it encloses magnet 10002 within the door 104. An actuator 10005, for example, similar to actuator 5000 described before or other previously described actuators, may be located in the door 104 which when actuated pulls the magnet 10002 away from the ferrous material 10001, overcoming the magnetic force therebetween and releasing the door 104 from the carrier shell 102. In the example shown in FIG. 3H the latch includes, for example, a rotatable ring shaped multipole magnet 10100 in the carrier shell 102 and a stationary multipole ring shaped magnet 10102 in the carrier door 104. The shape of the magnets 10100, 10102 is merely exemplary and the magnets may have any other suitable shape for operating as described herein. In alternate embodiments the magnet in the door 104 may be rotatable and the magnet in the carrier shell 102 may be fixed. In still other alternate embodiments the magnets may be movable in any suitable manner for operating as described herein. To release the latch, a handle 10101 connected to the rotatable magnet 10100 may be turned causing the magnet 10100 to rotate such that the poles on the magnets 10100, 10102 repel each other causing the latch to release. In alternate embodiments the magnet 10100 may be moved in any suitable manner such as manually or through automation such as a solenoid, spring, coil, latch key similar to latch key hole illustrated in FIG. 3L, or other suitable device. In alternate embodiments, the latch may have any other desired configuration.

Figure 4B:
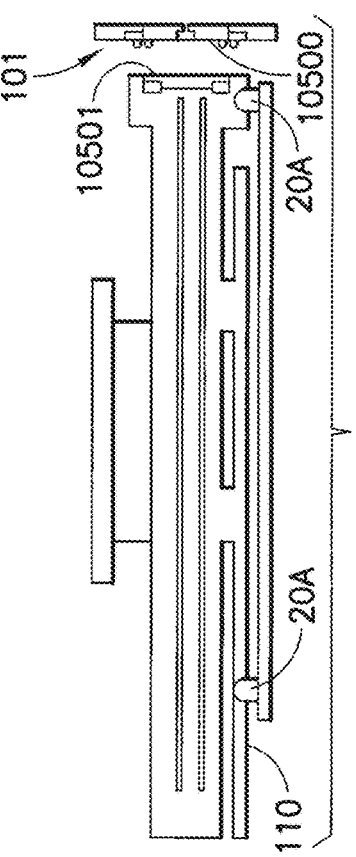
FIGS. 4A-4E are other schematic partial elevation views of the load port interface and carrier respectively showing the load port interface and carrier in different positions.
Figure 4A:
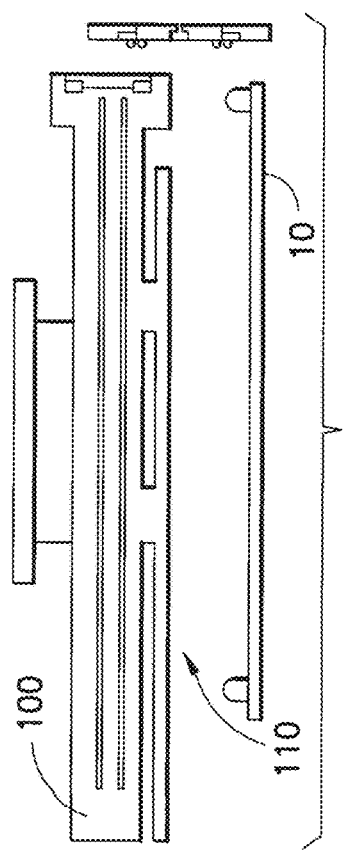
Figure 4C:
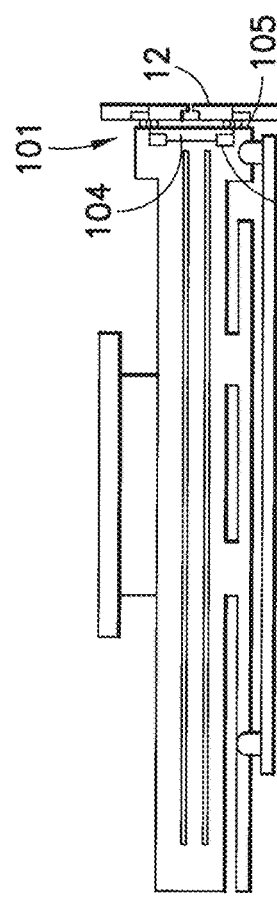
Figure 4D:
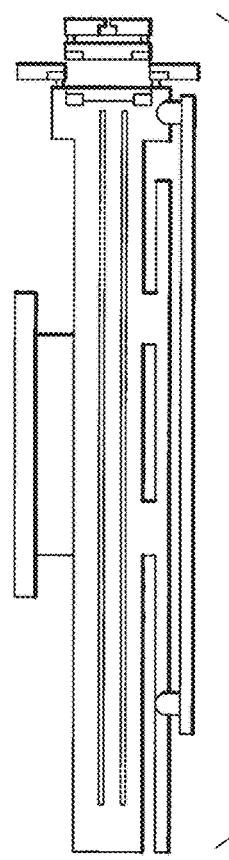
Figure 4E:
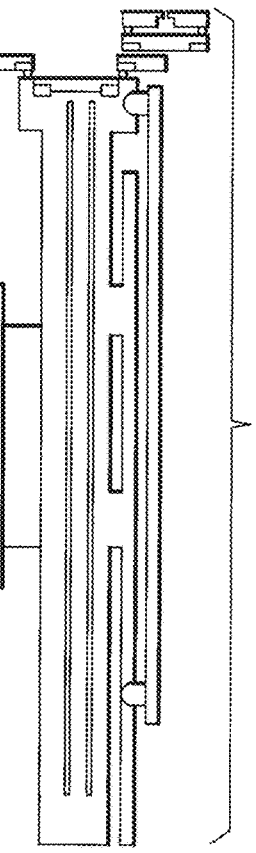
Figure 4F:
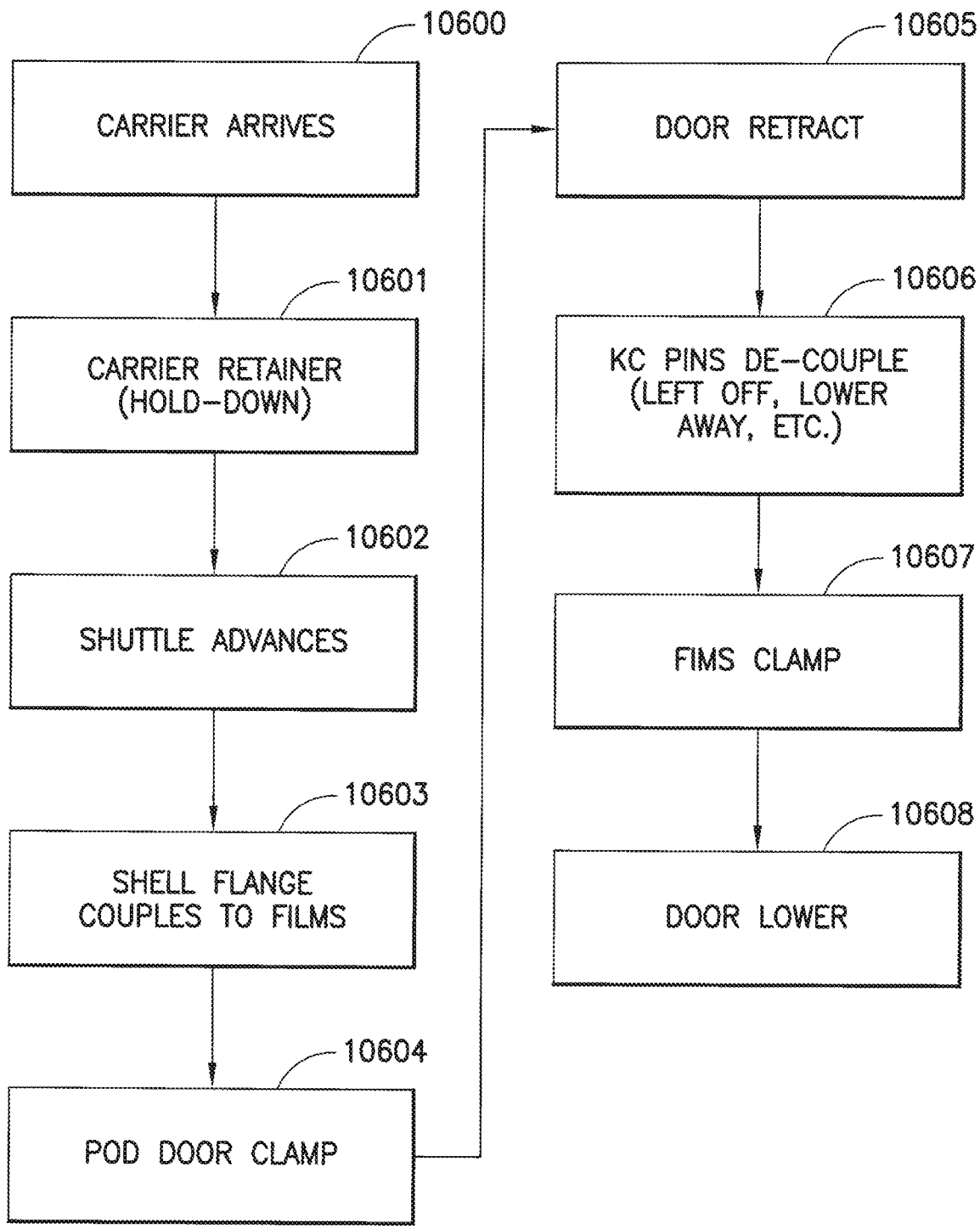
FIG. 4F is a flow chart graphically illustrating a process of carrier to load port interface in accordance with an exemplary embodiment.
Figure 5A:
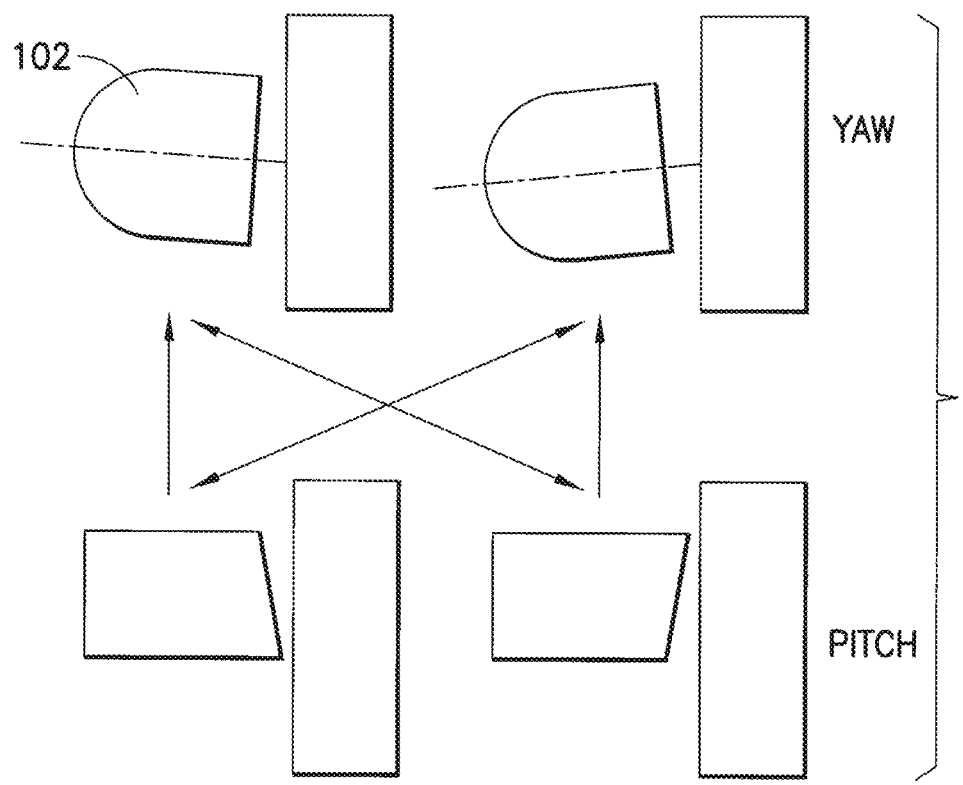
FIGS. 5A-5B illustrate schematic views of a carrier and load port interface in different positions.
Figure 5B:
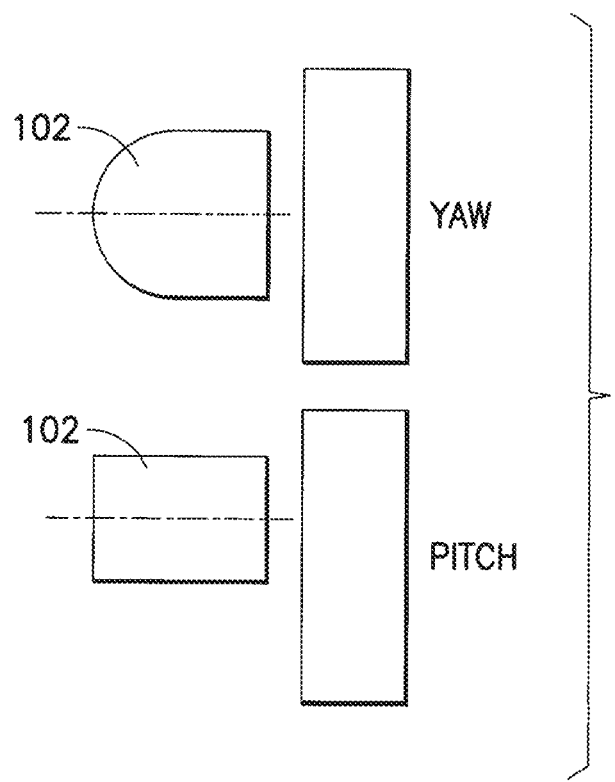

Referring now to FIGS. 4A-4E, the carrier 100 is shown in different positions as it is being mated to the load port interface 10. Referring also to FIG. 4F, there is shown a flow chart graphically illustrating a process for mating the carrier with the load port interface in accordance with the exemplary embodiment. The positions and process depicted in FIGS. 4A-4F are exemplary, and in alternate embodiments the carrier may be interfaced with load port in any other desired process. In the embodiment shown in FIG. 4A, the carrier 100 is positioned at a distance from the load port interface, for example such as when the carrier arrives at the process tool (FIG. 4F, Ref. 10600). The carrier may be handled for example by an AMHS (not shown) supporting the carrier from the upper handle 112, though in alternate embodiments the carrier may be handled in any other desired manner. As may be realized, in the position illustrated in FIG. 4A, the carrier chamber is closed, as is the load port. In FIG. 4B, the carrier 100 may be initially registered to the load port (FIG. 4F, Ref. 10601). By way of example registration coupling portion 110 (in the exemplary embodiment on the bottom mating surface) of the carrier engages complementing registration coupling portion 20 of the load port 10. In this position, the side interface of the carrier is at a distance from and not mated to the load port flange 10500. Referring again to FIG. 3, in the exemplary embodiment the kinematic coupling features 110 and the registration reference datum or plane of the carrier defined thereby may be positioned near the substrate seating planes or midplane of the carriers, hence reducing any angular misalignment effects between constraining interfaces. In the position shown in FIG. 4B, the carrier may be clamped relative to the load port interface 20A to hold the carrier in position as the load port shuttle advances the carrier (FIG. 4F, Ref. 10602) to coarsely couple the carrier shell flange 10501 to the load port flange 10500 at interface 101 (shown in FIG. 4C) (FIG. 4F, Ref. 10603). In the exemplary embodiment, the carrier flange 10501 and the load port flange 10500 may include for example kinematic coupling features defining repeatable registration datum at interface 101 (as will be described further below, see also FIG. 8). As noted before, repeatable registration of carrier to load port flange at interface allows establishment and opening of the clean tunnel from the carrier chamber through into the FEM without compromise of the process atmosphere. By way of example, in the coarsely coupled position, see FIG. 4C, the carrier door 104 may be interfaced with the load port door 12. As may be realized, the compliant interface 103 between carrier shell and door may accommodate positional differences arising on carrier registration at interface 110 and mating of the carrier door and load port door at interface 105, hence allowing interface 105 to be closed and the carrier door clamped to the load port door (FIG. 4F, Ref. 10604). In the exemplary embodiment, the load port door may have a vacuum port to purge any volume of interface 105, prior to clamping carrier door to load port door, though in alternate embodiments the interface 105 may have substantially no volume. In the exemplary embodiment, the carrier door 104 may be clamped to the load port door 12, for example with latching devices such as previously described, that may effect carrier door to load port door clamping substantially simultaneously with latch release between carrier shell and door. In alternate embodiments, independent clamps may be used to secure carrier door and load port door. In other alternate embodiments, vacuum clamping such as via vacuum bellows acting on the whole carrier. The carrier door surface or local vacuum cups may clamp carrier door to load port door and assist carrier door decoupling from the carrier shell. In FIG. 4A, the load port door is shown retracting and moving the carrier door through the load port into the FEM as will be described further below. In the exemplary embodiment shown in FIG. 4D, the registration between carrier shell and load port at interface 110 may be relaxed. For example, any hold down clamp holding the carrier shell in the registered position may be released, and the kinematic coupling 110, 20 may decouple, at least in part, by lowering coupling pins 20A from the grooves, or by lifting the mating surface (FIG. 4F, Ref. 10605). As the registration at interface 110 may be relaxed, the registration coupling features at interface 101 (between shell flange and load port flange) may be engaged registering the shell 102 to the load port flange 10500 (FIG. 4F, Ref. 10607). In the exemplary embodiment, the actuation input for registration at interface 101 (and relaxation of registration at interface 110) may be the retraction of the load port door. By way of example, coarse coupling of the kinematic coupling features (e.g. partial engagement) at interface 101, and relaxation of registration at interface may positionally suspend the carrier in such a manner that minor tugging forces, as may be generated by the carrier door on the carrier shell as the door is retracted may be sufficient to drive the carrier shell to complete engagement of the kinematic coupling features at interface 101, resulting in full registration. Full registration at interface 101 may be effected by actuating the clamps (not shown), clamping the carrier shell to load port flange (in yaw and pitch as schematically illustrated in FIGS. 5A-B). In the registered positions at interface 101. The carrier and load port door 104, 12 may be lowered as shown in FIG. 4E (FIG. 4F, Ref. 10608).

Figure 10:
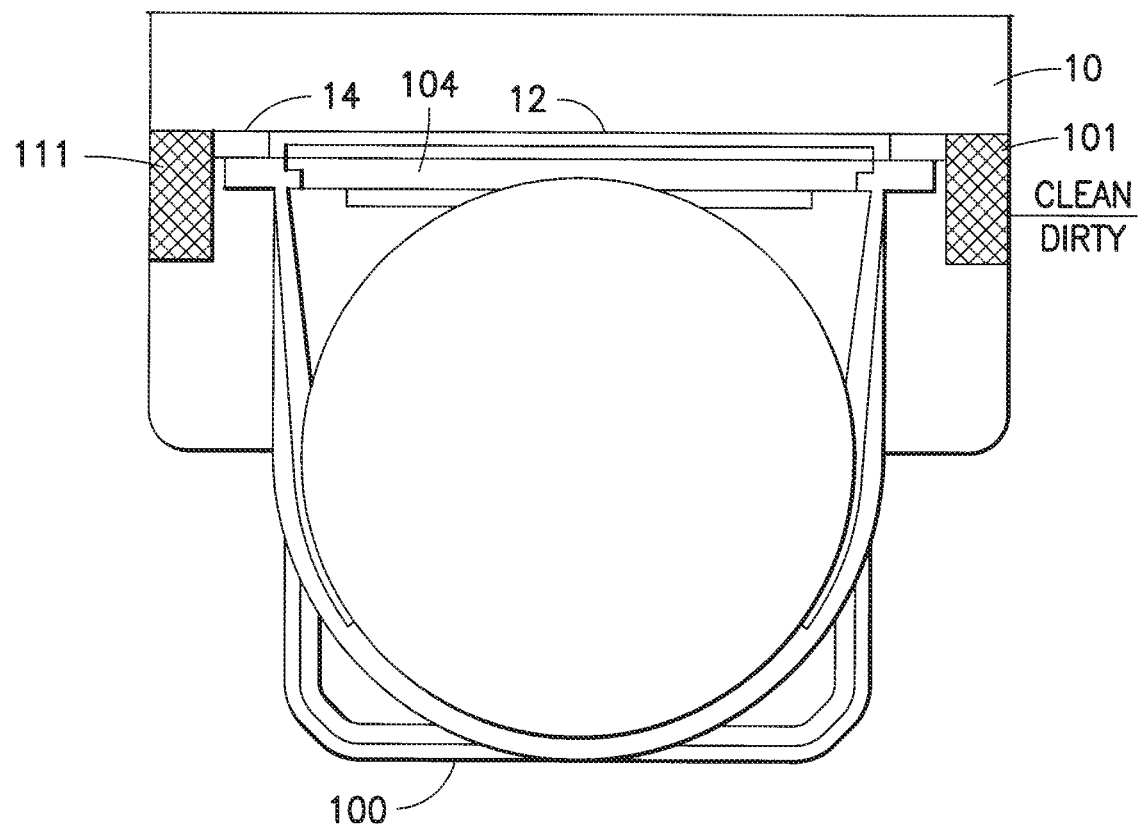
FIG. 10 is a top cross-sectional view of the load port interface and carrier.

Referring now to FIG. 8-8A, there is shown respectively a schematic perspective view and a side elevation view of the carrier 100 in accordance with another exemplary embodiment. As noted before, and seen best in FIG. 8A, the carrier shell may have a mating flange with coupling features that define coupling portion 101B of interface 101 (between shell flange 102F and load port flange 14, see also FIG. 3). Referring now to FIG. 9A, there is shown a schematic partial perspective view of the mating of load port flange 14 to the carrier shell flange 102F at load port flange interface 101, in accordance with another exemplary embodiment. The configurations of the interfaces shown in the figures are exemplary, and in alternate embodiments the carrier flange to load port interface may have any other desired configuration. In the exemplary embodiment illustrated in FIG. 9A, the load port flange 14 may be disposed on a frame member or bulkhead that defines the load ports of the load port sections. Interface seals may be provided around the load ports 16A-16C to seal the interface when closed, and a clamping device (shown for example as magnetic clamp pads 10700) may be located to engage the carrier shell 102 and hold the carrier shell 102 on the load port. In alternate embodiments, the interface seal and clamp device may have any desired configuration such as, for example, vacuum clamping. In the exemplary embodiment shown in FIG. 9A, the load port flange 14 may have coupling features defining complementing coupling portion 101A of interface 101. In the exemplary embodiment, the respective coupling features 101A, 101B define a kinematic coupling, for repeatable registration of carrier shell(s) 102 to the load port at interface 101. As noted before, the features of the kinematic coupling 101 shown in FIGS. 8, 8A and 9A-9C and 10 are merely exemplary and in alternate embodiments the kinematic coupling may have any other suitable configuration. In the exemplary embodiment, the kinematic coupling 101 comprises pins 22, 24 (coupling portion 101A) on the load port flange 14, and grooves or detents 122, 124 (coupling portion 101B) on the carrier shell flange 102F. In the pins 22, 24 and grooves 122, 124 may be arranged to repeatably position the carrier shell 102 relative to the load port in the x, y, z directions and allow the carrier shell 102 freedom to pitch and yaw when translated to interface 101 (see FIGS. 4C and 5A) to overcome slope differences between shell flange 102F and load port flange 14 (illustrated for example in FIG. 5A) to seat the interface seal. For example, the pins and grooves may be located substantially at the midplane of the carrier shell 102 and load port 16A-16C. The coupling may be arranged as shown for example, so that upon coarse coupling between carrier shell 102 and load port 16A-16C at interface 101, the coupling provides sufficient Z support to allow relaxation of the constraints from kinematic coupling 110 such as by decoupling the coupling pins 20A of coupling 110. Decoupling of the coupling 110 may be assisted by Z' motion (e.g. via shuttle or other suitable lifting mechanism) of the carrier to transfer Z loading onto the coupling pins 22, 24 and decouple coupling pins 20A. FIG. 10 is a schematic plan view showing the carrier in a mated position at interface 101.

Figure 21:
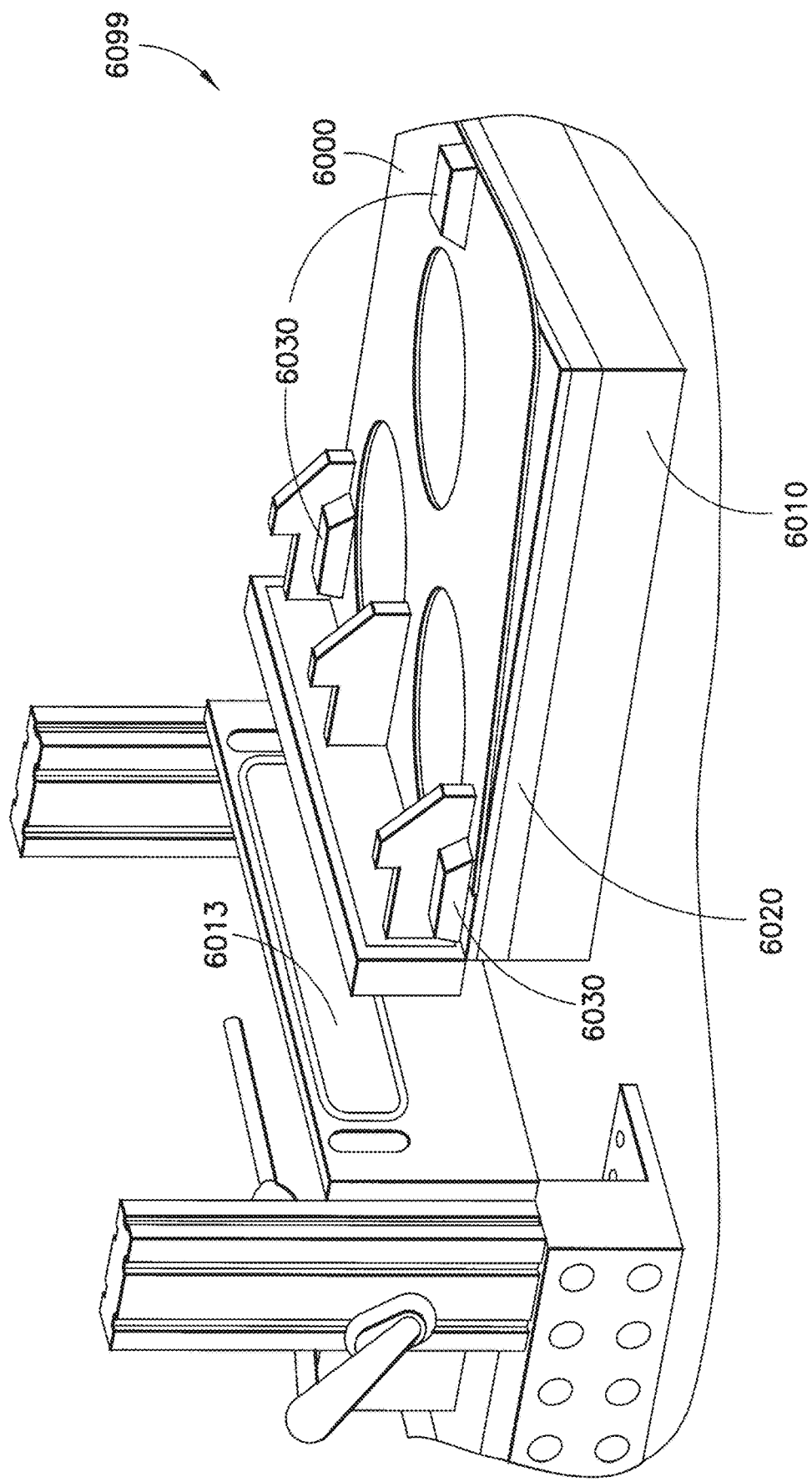
FIG. 21 shows an object coupled to a first interface surface of, for example, a load port in accordance with an exemplary embodiment.
Figure 21A:
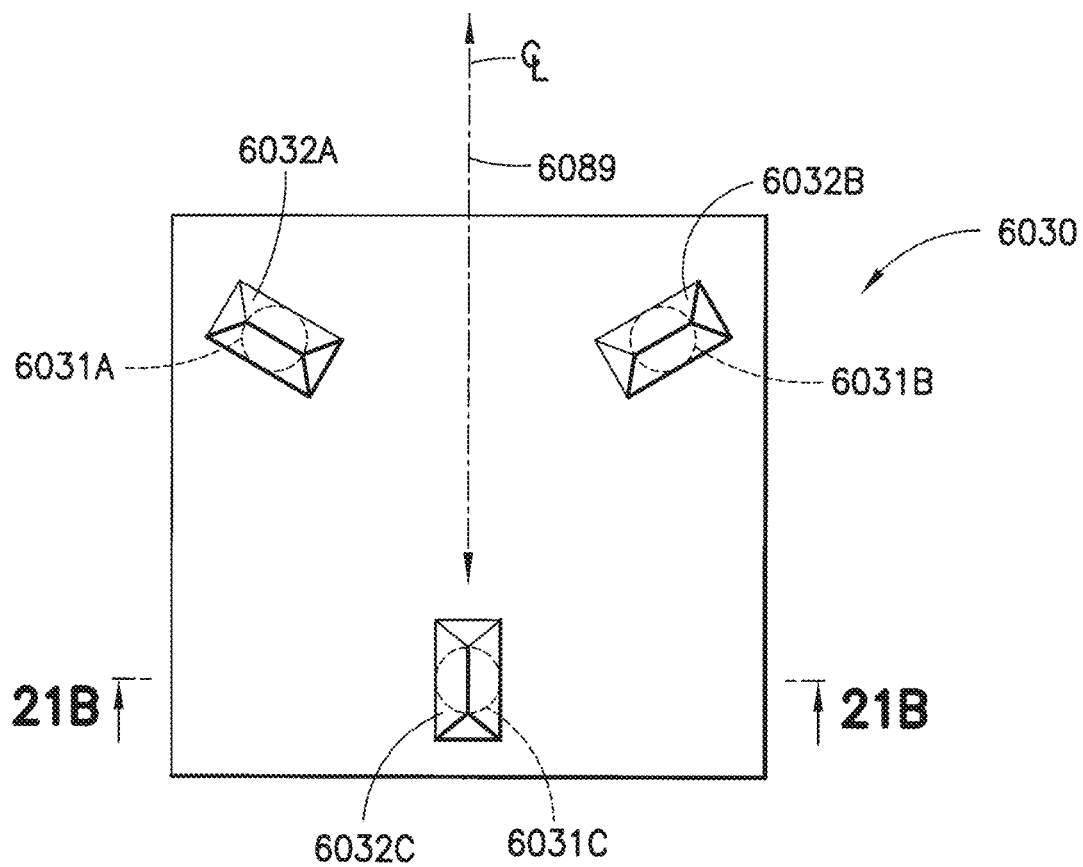
FIGS. 21A and 21B illustrate a kinematic coupling between the object and load port of FIG. 21 in accordance with an exemplary embodiment.
Figure 21B:
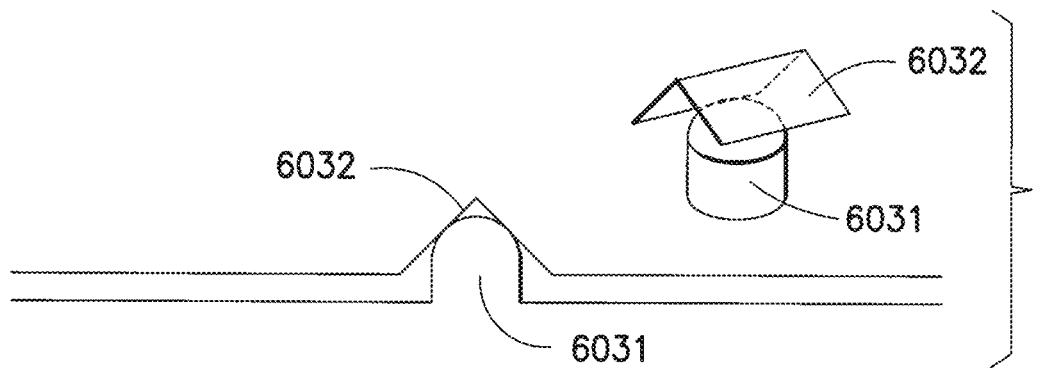

Referring now to FIGS. 21-25, one example of transferring a registration of the carrier from kinematic coupling 110 to interface 101 without over constraining the object 6000 will be described in greater detail in accordance with one exemplary embodiment. As can be seen in FIG. 21 an object 6000 is shown located on a coupling plate 6010 of, for example, a load port 6099. The object 6000 may be representative of carrier 100 but in alternate embodiments the object 100 may be any suitable object. The coupling plate 6010 may include kinematic couplings 6030 for coupling the object 6000 to the plate 6010. The kinematic couplings 6030 may be substantially similar that described above with respect to FIG. 3. For example, as can be seen in FIGS. 21A, 21B the carrier 100 may include substantially V-shaped grooves 6032A-6032C (generally referred to as groove(s) 6032) that are configured to interface with pins 6031A-3031C (generally referred to as pin(s) 6031) of the coupling plate 6010. In alternate embodiments the kinematic coupling may have any other suitable arrangement, such as pins in the carrier and grooves in the coupling plate or any other desired combination of pins, grooves or other suitable kinematic coupling features. As can be seen best in FIG. 21B, in the exemplary embodiment, the pin 6031 may have a curved interface surface and is suitably shaped to fit at least partly within the V-shaped groove 6032 for locating the carrier 100 with respect to the load port 6099. In alternate embodiments the pins and grooves may have any suitable configurations. The coupling may be in accordance with SEMI (Semiconductor Equipment and Materials International) standard E57-0600. In alternate embodiments the kinematic coupling may be any suitable kinematic coupling.

Figure 22:
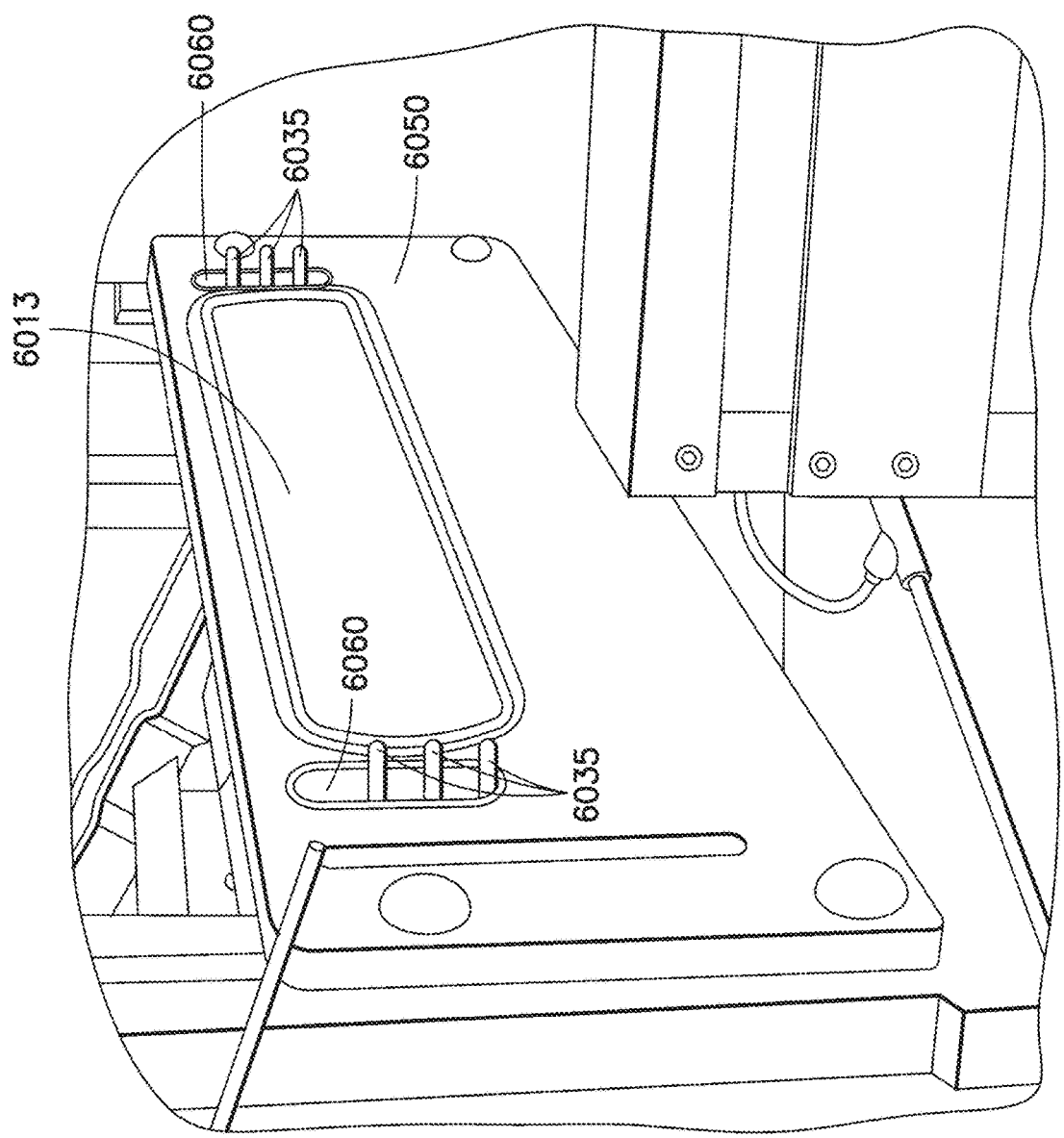
FIG. 22 illustrates another interface surface of the load port of FIG. 21 in accordance with an exemplary embodiment.

Referring back to FIG. 21, the load port 6099 may include any suitable actuator 6020 for moving the object 6000 towards and away from interface 6013 for coupling and decoupling the object 6000 to and from the interface 6013. In one embodiment the interface 6013 may be substantially similar to interface 101 and include any suitable kinematic coupling. In alternate embodiments interface may be any suitable interface having any suitable coupling features for coupling the object 6000 to the interface 6013. Referring to FIG. 22, in one example, the interface 6013 includes a kinematic surface 6050, which may be in a coupling plane oriented at an angle relative to the plane of the coupling or plate 6010 (the coupling plane is shown as being substantially perpendicular to the coupling plane of plate 6010 for exemplary purposes). In alternate embodiments the kinematic surface 6050 may have any suitable angular relationship with respect to the coupling plate 6010.

The interface 6013 may be suitably located on the kinematic surface and include, for example, kinematic coupling features 6035, preloading 6060 for at least partially securing the object 6000 to the interface 6013, a port door and suitable seals for sealing off the environment within the carrier (and within the chamber of the tool component the objet is interface with) from an external atmosphere. It is noted that the interface 6013 may include latches for securing the object 6000 to the interface 6013 as described above with respect to FIGS. 3A-3I. The latches may work in conjunction with for example, the preloading 6060 for securing the object 6000 to the interface 6013. In this example the preloading 6060 may be vacuum preloading but in alternate embodiments the preloading may be any suitable preloading including, but not limited to magnetic or mechanical preloading. Suitable examples of preloading include those described below with respect to FIGS. 12-12B.

Figure 22A:
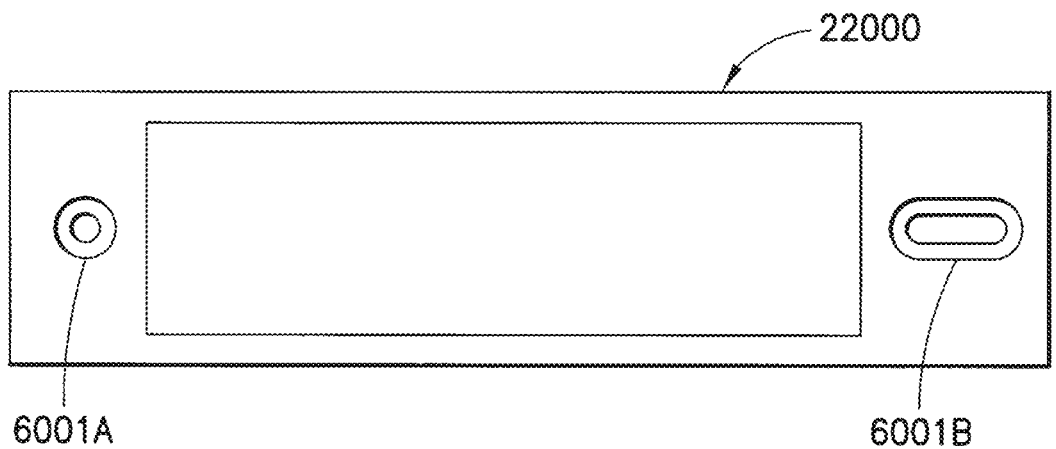
FIGS. 22A and 22B illustrate exemplary kinematic coupling features of the object and load port of FIG. 21 in accordance with an exemplary embodiment.
Figure 23:
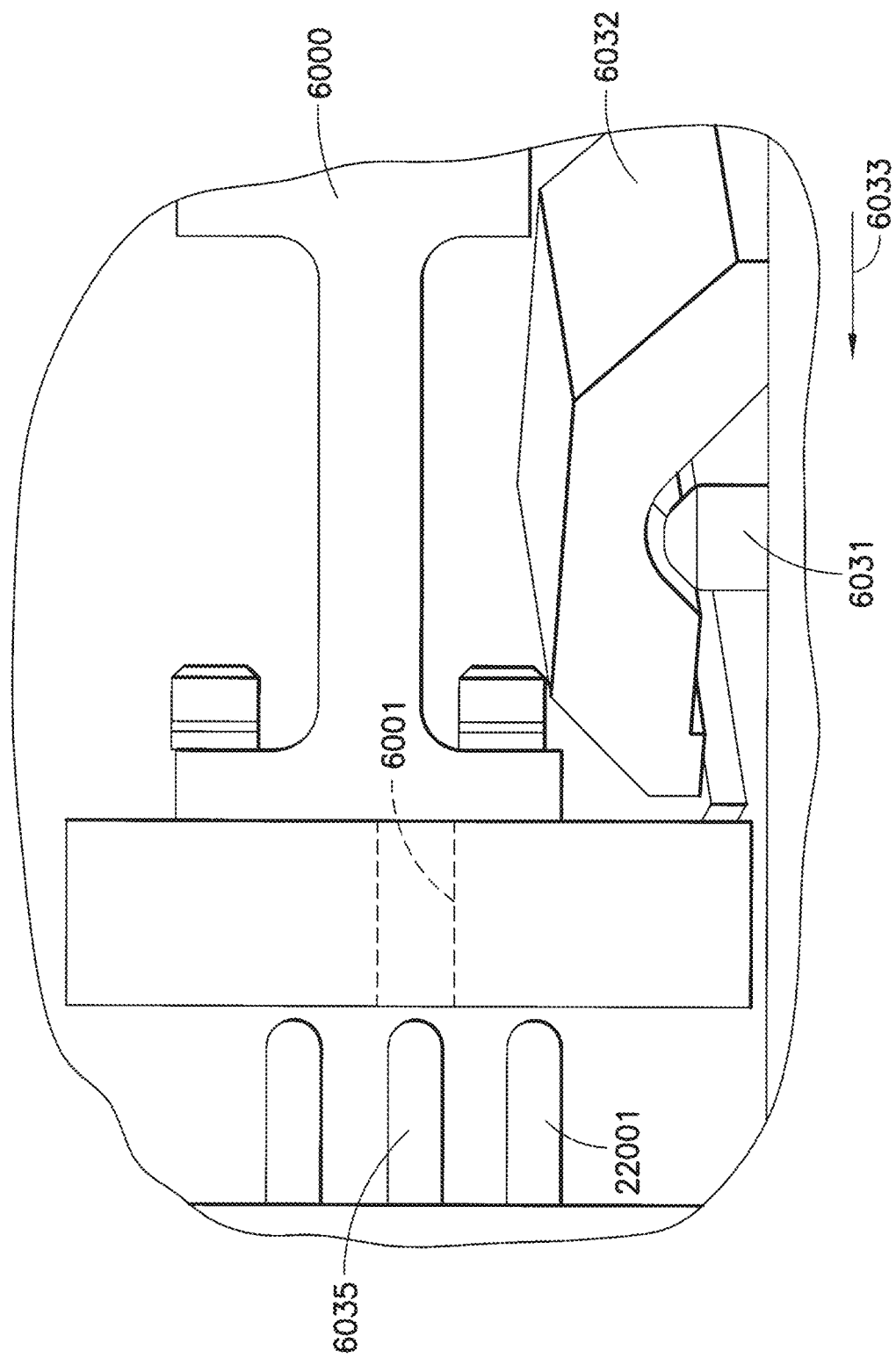
FIGS. 23-25 illustrates a coupling of the object from the first interface surface to the second interface surface of FIGS. 21 and 22 in accordance with an exemplary embodiment.

The kinematic coupling features may be any suitable kinematic couplings including, but not limited to, kinematic pins 6035 as shown in FIGS. 21-23. In this example, there two pins located on opposite sides of the interface 6013 but in alternate embodiments there may be any suitable number of pins located in any suitable position around the interface. The object 6000 may have corresponding recesses or apertures 6001 for interfacing with the pins 6035 as can be seen in FIG. 23 (see also FIG. 22A). The pins 6035 and recesses 6001 may be configured to stably hold and locate the object 6000 on the kinematic surface 6050 in predetermined relation with respect to interface 6013. The kinematic coupling 6035, 6001 causes repetitive location of the object(s) 6000 relative to the interface and may stably hold the object(s) 6000 coupled to the interface without the preload system 6060 if desired.

Figure 22B:
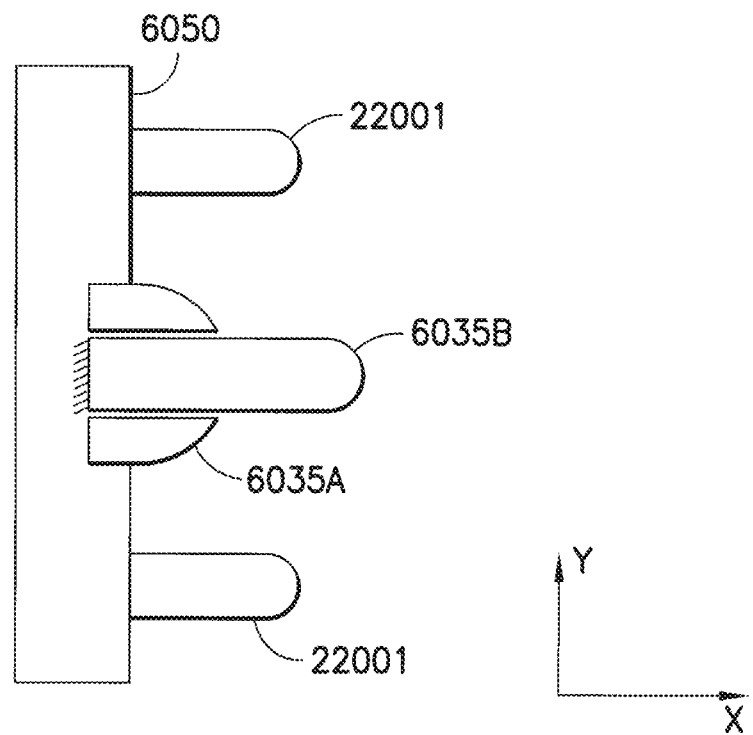

Referring now to FIGS. 22A and 22B the interface (e.g. pins and recesses) between the object 6000 and kinematic surface 6050 is shown in greater detail. As may be realized the configuration of the pins and recesses shown in FIGS. 22A, 22B are for exemplary purposes only and in alternate embodiments the pins and recesses may have any suitable configuration. In this example, the object 6000 may have an interface surface or face 22000 including recesses 6001A, 6001B substantially complementing pins 6035 to define in combination the kinematic coupling of interface 6013. The recess 6001A may be configured as having a substantially cone shape with for example, a pilot hole (defines Z-position). The recess 6001B may be in the form of a slot, such as a substantially V-shaped groove having, for example a pilot slot (defines Y-position). The pins 6035 (which may be same on both sides of the load port) include a kinematic coupling lead pin 6035B (provides with slot 6001B freedom of movement in X, Z directions) and a kinematic component 6035A that provide freedom of movement along the X axis as shown in FIG. 22B (restrained in Y and Z axes). In this example the kinematic component 6035A of pin 6035 is shown as having a substantially spherical shape, but in alternate embodiments the kinematic component may have any suitable shape including a substantial V-shape. The interface may also optionally include mechanical sensing pins, to for example sense the object 6000 and its alignment relative to interface 6013 as it is coupled to the kinematic surface 6050. In this example, the lead pin 6035B may engage the pilot hole of recess 6001A while kinematic component 6035A engages the cone shape of the recess 6001A for locating the object (generally similar to that shown in FIG. 9B). The recess 6001B may provide compliance for engaging the pin(s) on the other side of load port via the slot/groove while still providing movement only in the X-direction. For example, lead pin 6035B may engage the pilot slot while kinematic component 6035A engages the V-shaped groove of the recess 6001B (generally similar to that shown in FIG. 9C).

Still referring to FIG. 23 the object 6000 may be transported or advanced towards the interface 6013 by the actuator 6020. The object 6000 and the coupling plate 6010 may both be advanced or moved towards the interface 6013 where the movement of the object 6000 is arrested through, for example contact with the interface 6013 while the coupling plate 6010 continues to advance. In alternate embodiments the pins 6031 may be moveable relative to the coupling plate 6010 so that the pins 6031 advance with the object 6000 while the coupling plate is arrested at a predetermined distance. For example the pins may be located on a sub plate that is moveable relative to the coupling plate 6010 and extend through slots on the coupling plate 6010. In alternate embodiments relative movement between the object 6000 and the pins 6031 may be provided in any suitable manner so that the object 6000 engages the interface 6013 and is substantially lifted off of the pins 6031.

Figure 24:
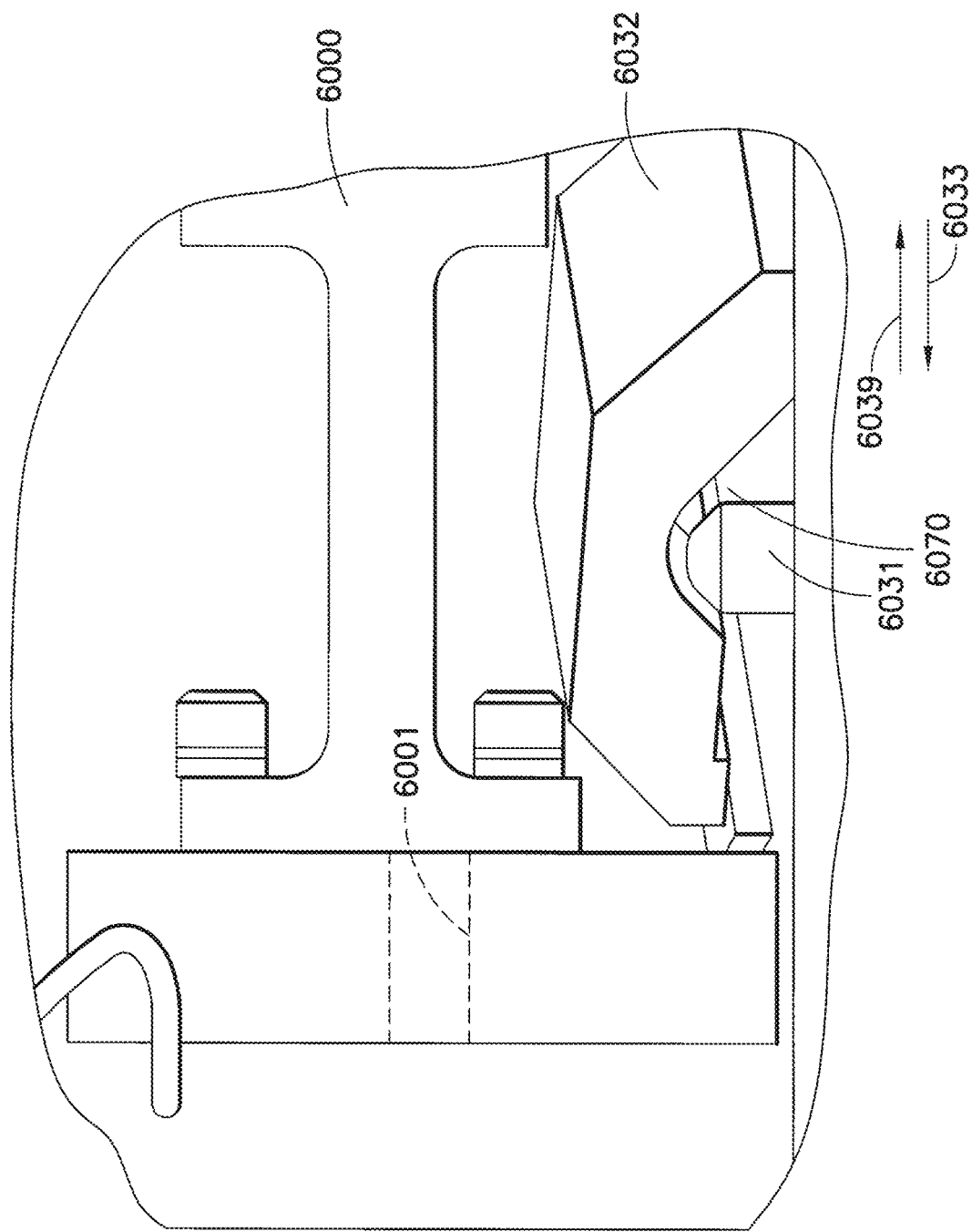

Advancement of the coupling plate 6010 past the point of engagement between the object 6000 and the interface 6013 causes relative movement between the object 6000 (and its grooves 6032) and the pins 6031 (as shown in FIG. 24 as arrows 6033 and 6034, for example) causing the object to ride up on the kinematic pins 6031 as the kinematic pins 6031 are advanced in the direction of arrow 6033 further towards the interface. For example, referring also to FIG. 24 the pin(s) 6031 when moved relative to the V-shaped groove(s) 6032 causes the object 6000 to be lifted from the coupling plate 6010 for engaging the kinematic pins 6035 of interface 6013 forming gap 6070 between the coupling plate and the object. The V-shaped grooves 6032 may be oriented so that both a lifting and guiding force (e.g. a force substantially parallel with the coupling plate 6010) is generated by the relative movement between the grooves 6032 and the pins 6031. The guiding force may act to hold a path of movement 6089 of the object 6000 along a centerline CL relative to the pins 6031 as the object is lifted off of the coupling plate 6010 (see FIG. 21A) and advanced to engage the interface 6013. In alternate embodiments, any suitable forces may be generated through the contact between the pins 6031 and grooves 6032 for guiding the object 6000 towards the interface 6013.

Figure 25:
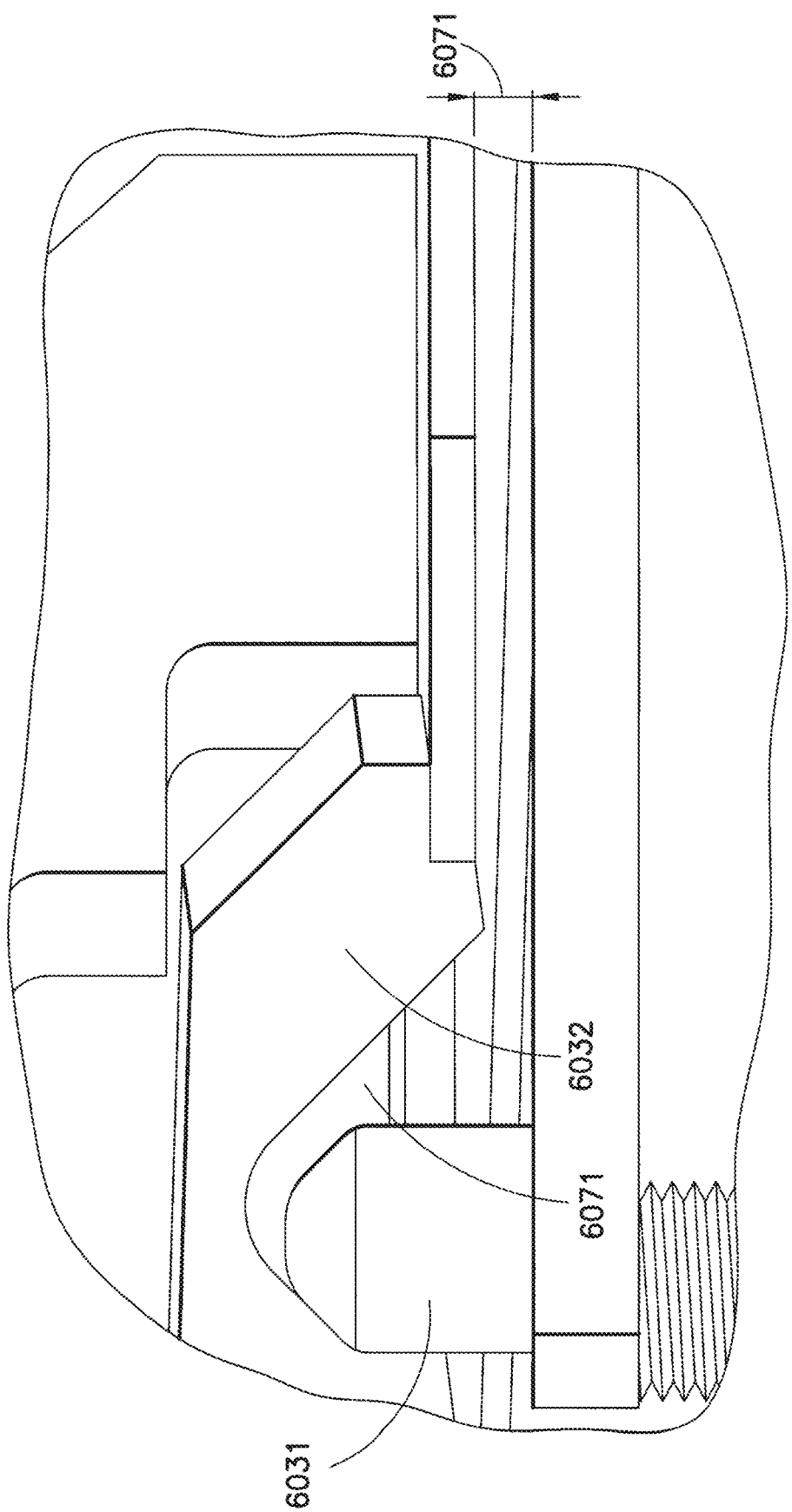

The interface between the pins 6031 and the grooves 6032 may be configured to allow for the lifting of the object 6000 while allowing the object 6000 to pivot and move so that the object 6000 is not over constrained when the object 6000 is mated to the interface 6013. Referring to FIG. 25 the relationship between the pin 6031 and the V-shaped groove 6032 is shown when the object 6000 is coupled to the interface 6013. As can be seen in FIG. 25 a gap is formed between the pin 6031 and the V-shaped groove 6032 so that the pin 6031 is not in substantial contact with the groove 6032. In alternate embodiments the coupling plate 6010 (and/or pins 6031) may be moved relative to the object after the object 6000 is mated to the interface 6013 for causing the formation of the gap 6071 by, for example centering the pin 6031 below and/or within a respective one of the grooves 6032. The gap 6071 may be such that when the object 6000 is released from interface 6013 the V-shaped grooves 6032 are lowered onto and centered with respect to the pins 6031 so that the object can be removed from, for example, the coupling plate 6010. It is noted that the object may be suitably constrained by the kinematic coupling of the interface 6013 and the coupling plate 6010 to provide for both the engagement of the object 6000 with the interface 6013 as well as the releasing of the object 6000 from the interface and re-coupling of the object 6000 with the coupling plate 6010.

Figure 6:
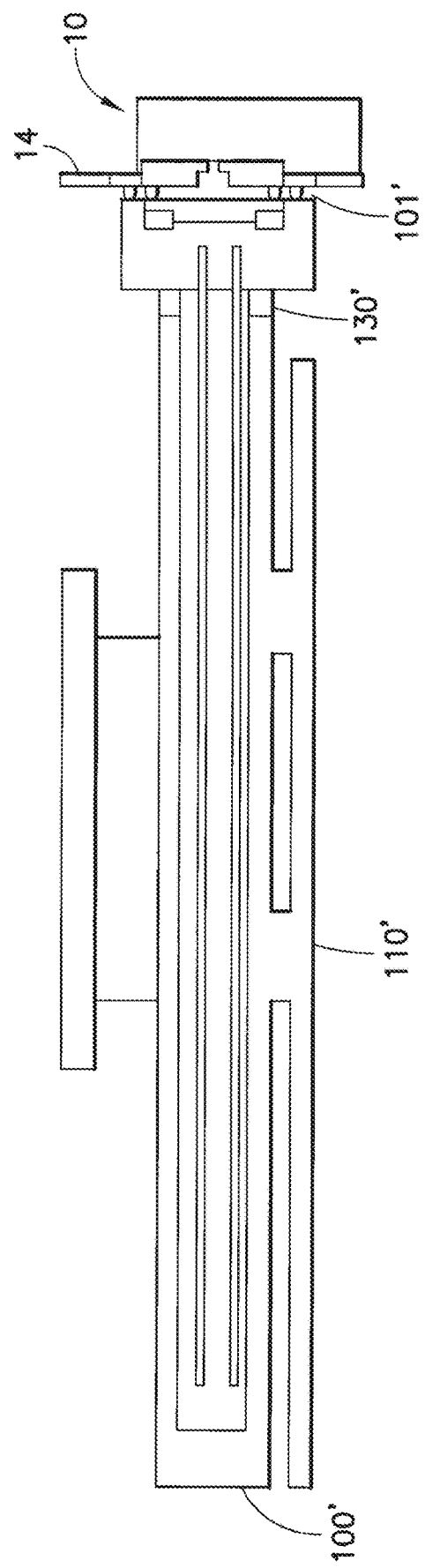
FIG. 6 is a schematic elevation view of a load port interface and carrier in accordance with another exemplary embodiment.
Figure 6A:
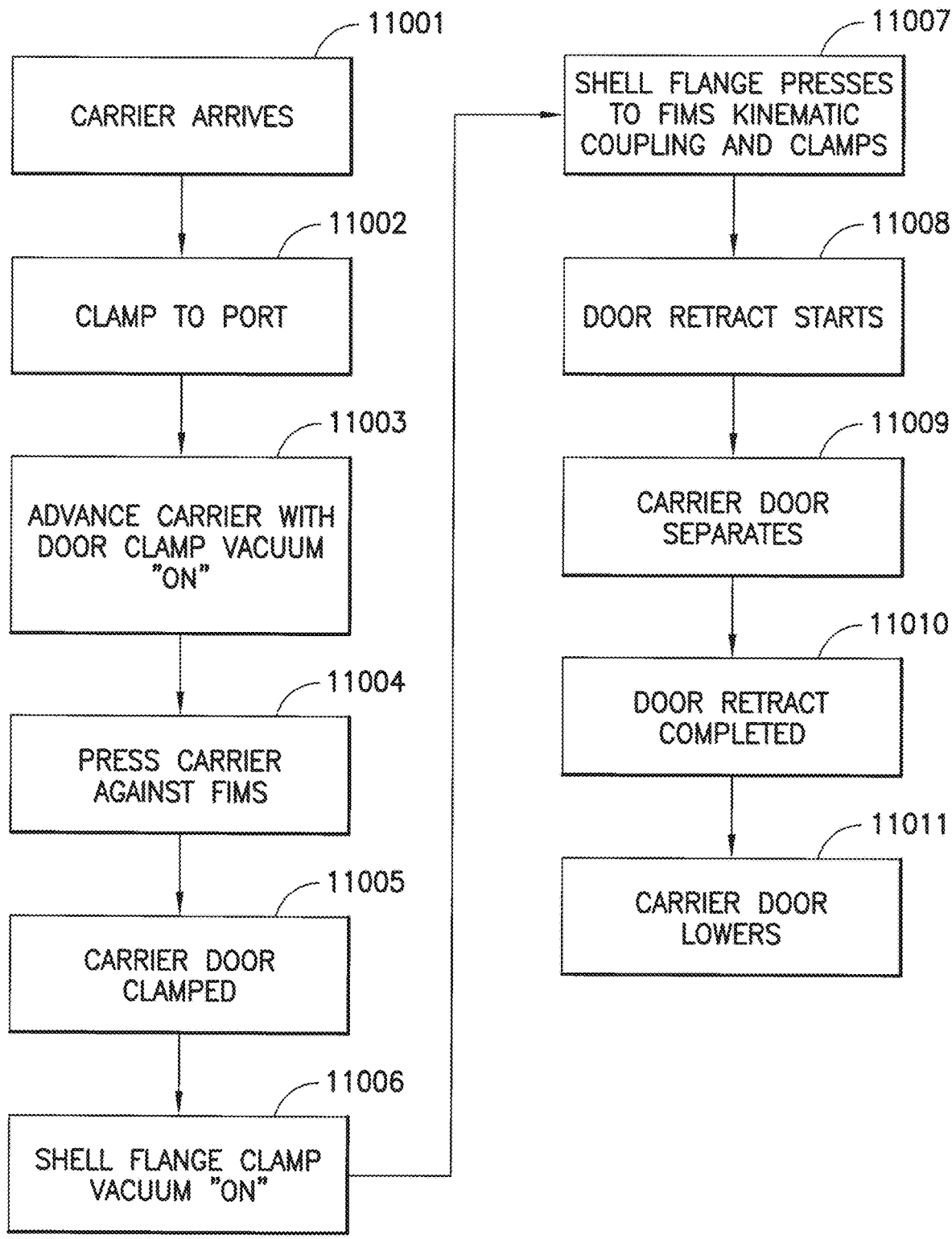
FIG. 6A is a flow chart graphically illustrating a process of carrier to load port interface in accordance with an exemplary embodiment.

Referring to FIG. 6, there is shown a schematic elevation view of a carrier 100' in accordance with another exemplary embodiment. Carrier 100' may be similar to carrier 100 described previously. In the exemplary embodiment, carrier 100' has a flexible connection 130' that may provide six degrees of freedom compliance between the kinematic coupling 110' (similar to kinematic coupling 110) and the kinematic coupling 101'. In the exemplary embodiment, kinematic coupling 110' may be fixed relative to the carrier shell bottom, and kinematic coupling 101' may be fixed to the carrier shell flange. Accordingly, the compliant connection may be positioned at any suitable location on the carrier shell between flange and carrier shell bottom. The location shown in FIG. 6 is merely exemplary. In the exemplary embodiment, the wafer support structure may be fixed relative to the flange. An exemplary locking process between the carrier 100' and the load port is illustrated graphically in the flow chart shown in FIG. 6A. For example, the carrier 100' is transported to the load port (FIG. 6A, Ref. 11001) and is optionally clamped to the load port (FIG. 6A, Ref. 11002) in a manner substantially similar to that described above with respect to FIG. 4F, Refs. 10600 and 10601. The load port shuttle advances the carrier 100' to the carrier/load port interface (FIG. 6A, Ref. 11003). The load port door vacuum may be activated during advancement of the carrier 100' so that any particulate matter on the surface of the carrier may be removed during the interfacing of the carrier and load port. The load port shuttle presses the carrier 100' against the carrier/load port interface to coarsely couple the carrier to the load port (FIG. 6A, Ref. 11004). The carrier door is clamped to the load port door (FIG. 6A, Ref. 11005) and the shell flange clamp vacuum is activated (FIG. 6A, Ref. 11006). The shell flange clamp causes the carrier to engage the kinematic coupling for clamping the carrier to the load port (FIG. 6A, Ref. 11007) and the carrier door starts to retract (FIG. 6A, Ref. 11008). The carrier door separates from the carrier (FIG. 6, Refs. 11009 and 11010) and is lowered into the door storage area of the load port (FIG. 6A, Ref. 11011). In alternate embodiments, the carrier may be registered to the load port in any suitable manner.

Figure 11:
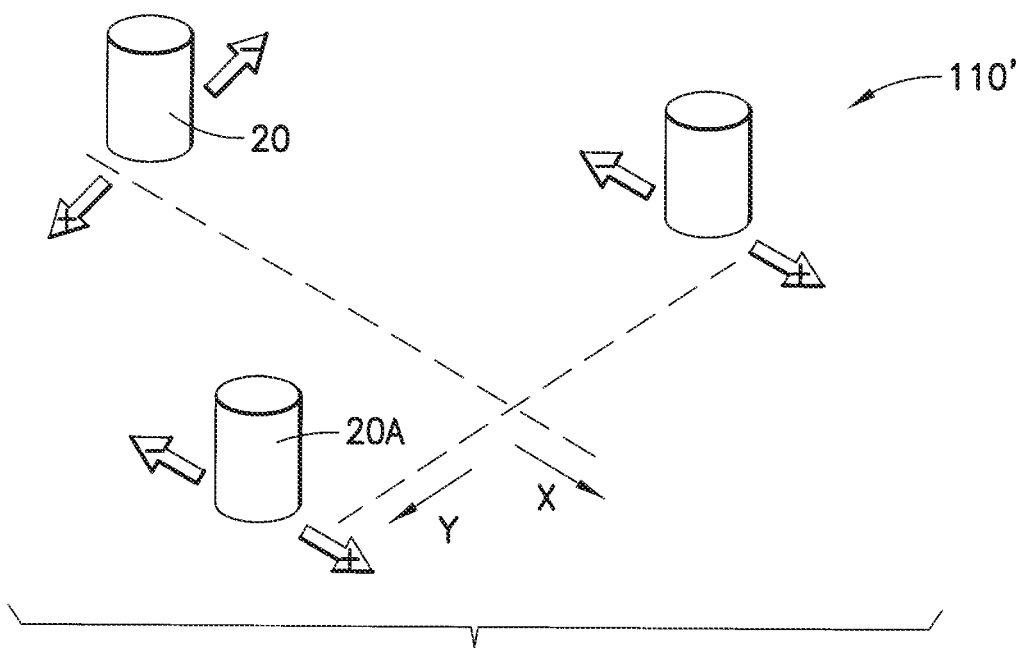
FIG. 11 is a schematic perspective view of engagement features of a kinematic coupling between carrier and tool interface in accordance with another exemplary embodiment.

Referring now to FIG. 11 there is shown a schematic plan view of a portion of the coupling interface 110' in accordance with another exemplary embodiment. In the exemplary embodiment, coupling 110' may be compliant (for example along three primary axis x, y, z) allowing the carrier shell, and hence the shell flange, six degree of freedom. In alternate embodiments, coupling compliance may have fewer degrees of freedom. The compliance of the coupling is schematically represented in FIG. 11 by flexibility of the coupling pins 20A in the x, y, z directions. In alternate embodiments compliance of interface 110' (see also FIG. 3) may be effected at one or more other suitable locations such as the shuttle plate, the load port flange coupling, the shell flange, the shell coupling grooves for the bottom coupling or the shell attachment to the coupling grooves. As may be realized compliance may be distributed at a number of locations, such as Z compliance at the pins, and x and y compliance at other locations such as the shell flange.

Figures 12, 12A:
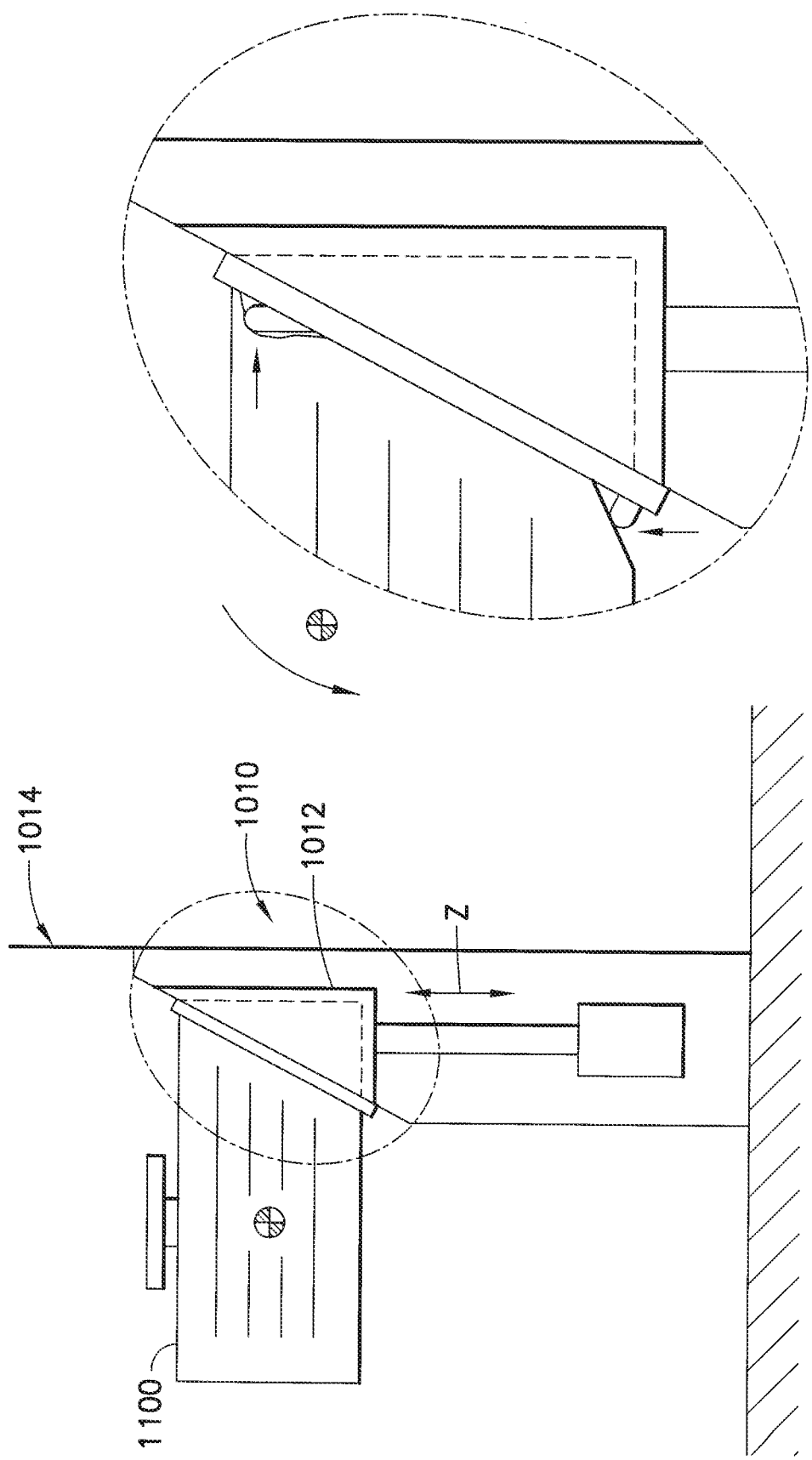
FIGS. 12-12A are respectively a schematic elevation and partial elevation views of another carrier to tool interface coupling in accordance with another exemplary embodiment.
Figure 12B:
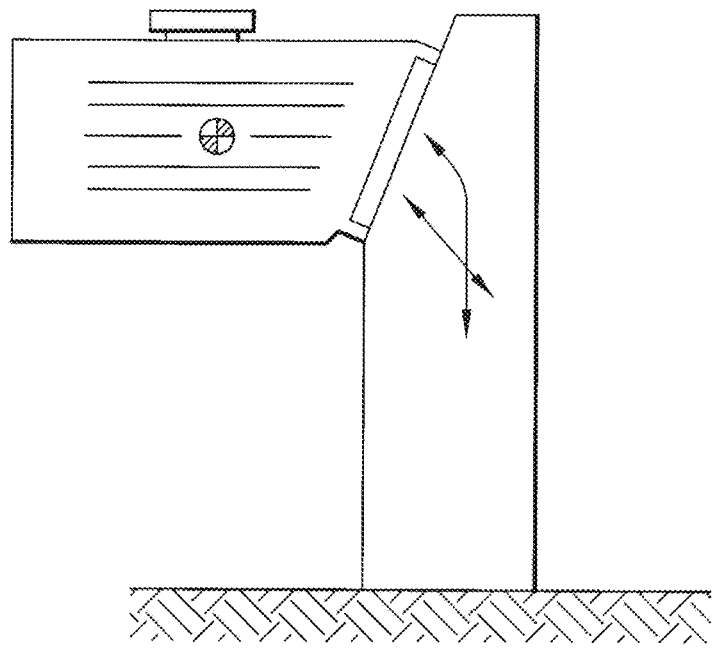
FIG. 12B is another schematic elevation view of the carrier to tool interface illustrating paths for carrier and port door movement in accordance with an exemplary embodiment.

Referring now to FIGS. 12-12B, there is shown respectively a schematic elevation view of carrier 1100 and load port 1010 in accordance with another exemplary embodiment. In the exemplary embodiment, the load port and carrier may have generally wedge shaped doors, capable of interface with each other. The carrier and load port doors may be clamped and opened by single axis movement, such as in the Z axis. In the exemplary embodiment, carrier and load port may have registration features 1107 (e.g. kinematic coupling capable carrier to load port registration) for vertical loading of the carrier, located on the load port flange (e.g. the same surface the door/carrier/load port) may be located). As may be realized registration interface features may be any arrangement, such as V-groove and pin features as shown in FIGS. 12-12A, that do not over constrain the interface. In the exemplary embodiment shown, the interface is configured so that the carrier CG preloads the coupling in a mechanically stable condition. In the exemplary embodiment the door arrangement may form the opening of the pod door at an angle. The angle is defined by the direction which the load port will extract the door from the carrier. This may form a continuous flat surface which the port and port door can seal to the carrier respectively. The load port axis of motion may also be sloped at the angle of the opening. In alternate embodiments, the motion may be performed in two vectors creating a short angled motion transitioning to a pure vertical motion as shown in FIG. 12B. The drive for the door motion may be from a single source, and for example may implement a cam action to form the two vectors of motion with a single line of action. As may be realized, in the exemplary embodiment, all physical interfaces between the carrier and the load port may be on the same surface similar to a bottom opening pod, and a single axis of motion may open the door. Further details of the kinematic coupling capable carrier to load port registration are described in U.S. patent application Ser. No. 11/855,484 filed on Sep. 14, 2007, the disclosure of which is incorporated herein by reference in its entirety.

Figure 13:
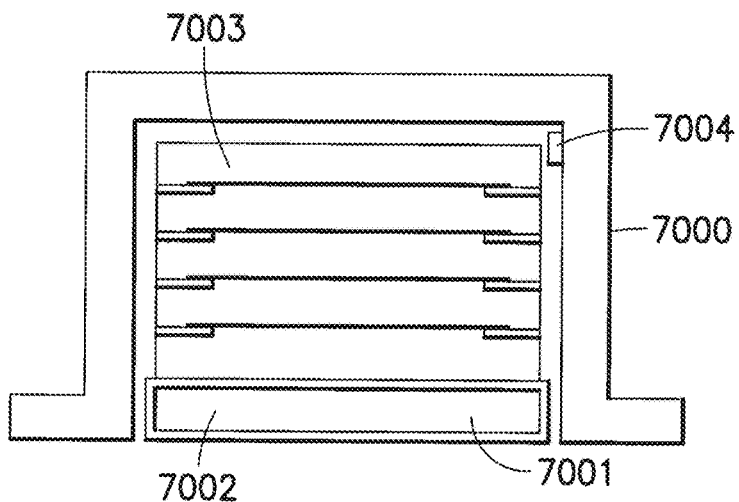
FIGS. 13-13A are schematic views of carrier and tool interface in accordance with yet another exemplary embodiment.

Referring now to FIG. 13, there is shown a schematic elevation view of a carrier and load port interface in accordance with yet another exemplary embodiment. The carrier 7000 may be configured to hold a self contained gas supply 7001, such as for purging the carrier. The gas supply may include any suitable gas such as, for exemplary purposes only, nitrogen. In the exemplary embodiment, a hollow volume may be provided integral to the carrier forming a chamber 7002 of a material which can contain a purge gas. The material density can be of a metal or polymer but with thin cross section. This helps minimize the weight gain from the denser material. The chamber 7002 may be connected to the internal cavity 7003 of the pod 7000 where the wafers reside via for example a check valve. The check valve may serve to regulate the pressure inside the pod and prevent the over pressurization. The chamber may be pressurized at a load port or other nest locations at strategic areas in the process. Once pressurized the carrier 7000 may be stored without connection to a gas supply for an extended period of time. The amount of time may be driven by the size of the chamber and the quality of the seals in the pod.

Figure 13A:
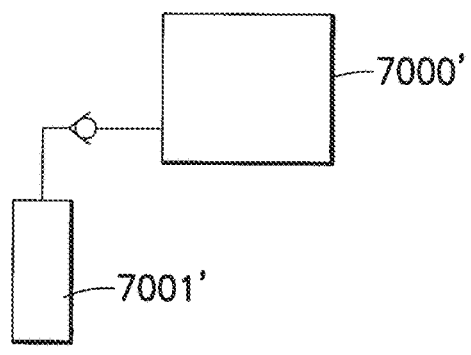

As can be seen in FIG. 13A in alternate embodiments the gas supply 7001' may be external to the carrier 7000'. The gas supply 7001' may be removably coupled to the carrier 7000 by any suitable coupling. In this example the gas supply can be recharged as described above with respect to FIG. 13 or when the gas supply is low may be replaced with another gas supply.

In accordance with another exemplary embodiment a low power pressure sensor 7004 may be integrated onto the carrier 7000. The sensor 7004 may measure the pressure in the carrier and report an alarm if the pressure dropped below a critical level. The AMHS system could be commanded to retrieve the carrier 7000 from its current position and place it on a purge nest for recharging.

Suitable examples of carrier gas supplies can be found in U.S. patent application Ser. No. 11/855,484 previously incorporated herein by reference.

Pressurizing the carrier with gas via, for example, the gas supply 7001, 7001' when storing or transporting the wafers may minimize wafer contamination if there is a leak in a seal of the carrier. For example, if the door seal has a leak the pressurized gas within the carrier will evacuate the carrier through the leak while not allowing contaminants to enter the carrier, whereas a vacuum environment within the carrier would tend to draw the external atmosphere (including contaminants) into the carrier where the wafers reside. In one embodiment the carriers may be pumped down and refilled with a predetermined gas to clean any contaminants from the carrier interior when, for example, the carrier is located at a load port or at a designated carrier cleaning station. As may be realized any wafer within the carrier during pump down and refilling with the predetermined gas may also be cleaned of contaminants.

Figure 14:
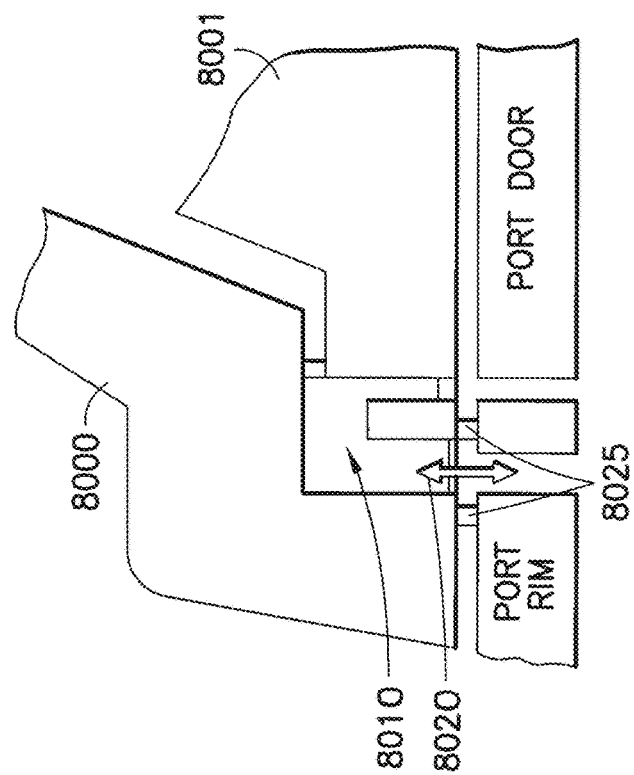
FIG. 14 is a partial view of a carrier another interface in accordance with still another exemplary embodiment.

Referring now to FIG. 14, there is shown a schematic partial cross section of a carrier and load port interface in accordance with another exemplary embodiment. As may be realized, a pressure differential may exist between the carrier environment and the load port environment prior to opening the carrier 8000. As the carrier door 8001 is opened, pressure may equalize and may introduce an undesirable flow of air across the wafer carrier. This turbulent flow of air may deposit particulate matter and potentially damage or destroy wafers within the carrier 8000. Upon closing the carrier door 8001, the displaced volume of air within the carrier shell is forced outward. This volume of air may pass over the wafers before exiting into the load port environment and could potentially deposit harmful particulate.

In the exemplary embodiment, air flow channels 8010 may be provided in the carrier shell geometry that define a low resistance path for air, or any other gaseous fluid, to enter or escape through. The channels 8010 may be located around a perimeter of the carrier shell or any other suitable location to allow gas to flow out of the carrier 8000. The channels 8010 provide a path for air/gas to flow when opening/closing the carrier door 8001, a pressure relief when the door 8001 is being opened/closed, a port for evacuating oxygen or any other undesirable particulate, and/or actively (e.g. evacuate or inject fluid to) control airflow around the wafer cassette. In the exemplary embodiment, these channels may be subjected to a vacuum source and/or a fluid source as desired when placed on a load port (or other interface). In alternate embodiments they may be open to a suitable environment so that gas can flow to/from the carrier to the environment through the channels. A suitable valve, such as a check valve 8020, may be disposed in the channels 8010 to prevent back flow of gas to/from the carrier through the channels 8010. In alternate embodiments, a distinct positive pressure port could be used to introduce a gas into the carrier 8000 through the channels 8010.

By way of example as the carrier 8000 is placed onto the load port surface the area around the flow channels 8010 is sealed with any suitable seal such as seal 8025. Prior to opening the carrier door 8001 a vacuum flow is initiated to remove any debris or entrapped gases that may be lodged on the carrier surface. As the door 8001 is opened any pressure differential between the load port and carrier environment is easily equalized due to the large flow area and low pressure. In alternate embodiments the pressure may be equalized by introducing gas into the carrier through the channels so a pressure within the carrier matches the pressure of the processing environment to which the carrier is attached. Upon closing the carrier door 8001, the large volume of air/gas that resides in the carrier must displace. The flow channels 8010 and associated vacuum provide a low resistance path for the fluid to travel. This alleviates any "piston effect" that may otherwise be experienced by the gas within the carrier 8000 and removes any turbulent air flow across the wafers.

Figure 7C:
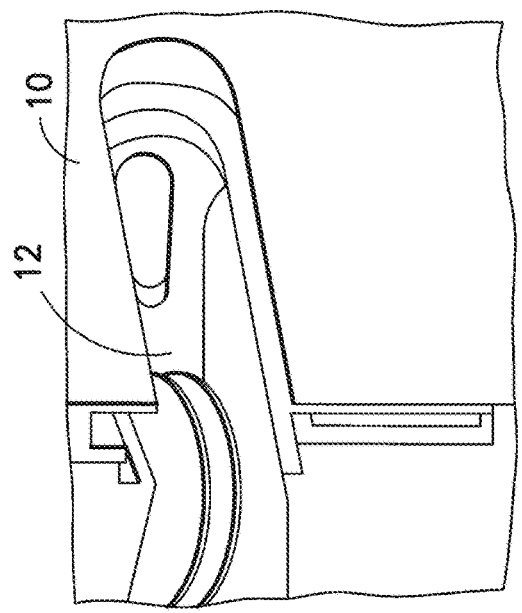
FIGS. 7A-7C respectively are a schematic partial elevation view and enlarged partial elevation view of load port interface and carrier(s); and a schematic perspective cross section of load port interface and carrier in accordance with another exemplary embodiment.
Figure 7B:
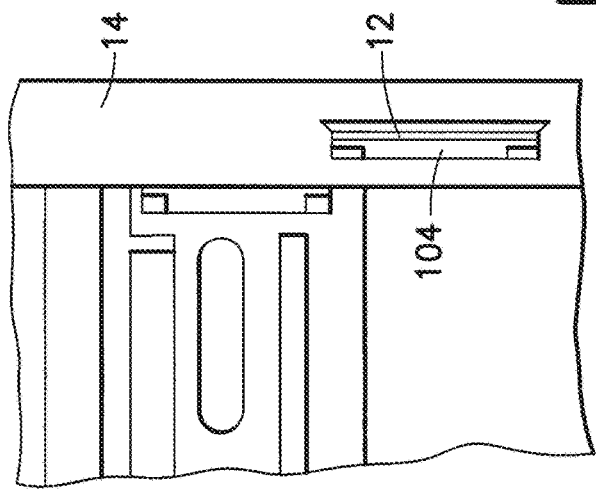
Figure 7A:
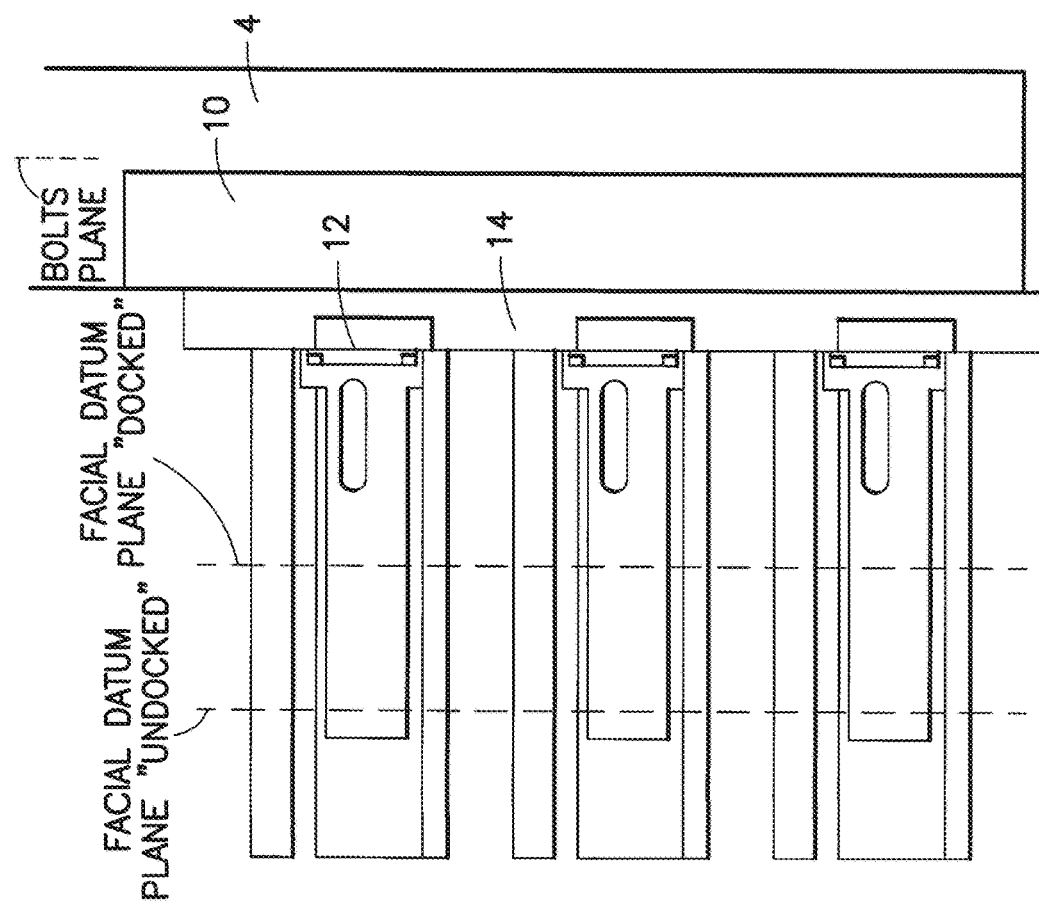

Referring now to FIGS. 7A-7C, there are shown respectively cross sectional views and a partial perspective view of a load port plate 14 or bulkhead and carriers in accordance with another exemplary embodiment. The load port or plate defining the load port 14 in the exemplary embodiment may be similar to the load port described previously. As seen in FIG. 7A, the load port 14 may be mated to the FEM 4 at a BOLTS plane, that may conform to SEMI E63 standards. In the exemplary embodiment, the load port 14 is arranged to allow door opening (e.g. load port door 12 with the carrier door 104 clamped thereto) to be effected outside the bolts interface plane. As seen best in FIGS. 7B-7C, the load port bulkhead may define a recess or cavity accommodating door motion. The cavity may be masked from the FEM interior as shown, so that the cavity is substantially hidden from the FEM interior. Also, in the exemplary embodiment the bulkhead face may be substantially uninterrupted along the BOLTS interface (other than the ports) minimizing structure that may disturb gas flow within the FEM. In the exemplary embodiment the load port bulkhead may form a return passage for recirculation of gas in the FEM, as shown for example in FIGS. 1A-1B assisting in maintaining the door cavity as a clean area. Gas may be directed into the cavity with suitable registers. In alternate embodiments, inlet or exhaust lines may be plumbed directly to the load port for introducing or removing gas from/to and external gas supply. Referring also to FIG. 10, in the exemplary embodiment the door opener mechanism 111 may be located outside the clean area. In the exemplary embodiment, the door opener mechanism or door actuator may be similar to actuator 5000 shown in FIGS. 19-20, through in alternate embodiments the door actuator may be any actuation system or combination of actuation systems. As may be realized from FIGS. 7A, 7B, in the exemplary embodiment the interface surface of the load port bulkhead interfacing the carrier shell may be offset from the BOLTS interface to accommodate the door cavity therebetween. Accordingly, and referring now also to FIG. 3, in the exemplary embodiment, the carrier shell may be configured to accommodate the offset in the load port interface and maintain the facial datum of the carrier when docked relative to the BOLTS interface in accordance with semi specifications.

In one embodiment, latches coupling the carrier door 104 to the load port door 12 may be actuated by, for example, any suitable actuator such as the actuator described above with respect to FIGS. 19 and 20. In one example, in alternate embodiments, the door actuator may include the bladder actuator similar to that described herein and may be combined with, for example, an electric motor, lead screw or pneumatic cylinder or any other suitable drive for causing actuation of the door (or other actuated components) in any desired manner. In another example, when the carrier is mated with the load port, suitable flow lines such as vacuum lines or purge lines may adjust the atmosphere within the carrier to match the atmosphere of the processing tool. In one example, the interior of the carrier may be pumped down to a predetermined vacuum creating a pressure differential between the interior of the carrier and, for example, the cavity for accommodating door motion. The pressure differential may cause the drive surface 5035 of the actuator to move which in turn may actuate a latching mechanism or device coupling the carrier door 104 to the load port door 12. In another embodiment, for example, when the carrier door 104 is placed back on the carrier, the latch between the carrier door 104 and the load port door may be released by pressurizing one side of the actuator. For example, the carrier may be filled with an inert gas such as nitrogen for transporting the substrates within the carrier. The pressure formed within the carrier from filling the carrier with the inert gas may exert a force on (e.g. pressurize) the drive surface of the door actuator (similar to surface 5035 of the actuator (similar to 5000, see FIGS. 19-20) causing movement of the actuator which in turn may cause the releasing of the latch between the carrier door 104 and the load port door 12. Actuation of the same or a different actuator 5000 may also cause the carrier door 104 to be latched to the carrier in a manner substantially similar to that described above. As may be realized, in alternate embodiments, one side of the actuator 5000 may be pressurized for latching the carrier door to the load port door while in other alternate embodiments, a pressure differential may be used to release the latch between the carrier door and the load port door. In still other alternate embodiments a pressure differential may be applied or one side of the actuator may be pressurized in any suitable manner for causing movement of the actuator. As may be realized, the vacuum source or pressure source for actuating the actuator 5000 may be from any suitable source such as, for example, flow lines for purging or pumping the carrier as described above or the registers located within the cavity for accommodating door motion. In other embodiments the linear motion of the actuator may be converted into rotary motion in any suitable manner. In still other alternate embodiments the actuator may include two bladders connected to a common actuator chamber for providing two degrees of motion having any spatial relationship to each other. For example, one of the bladders may be configured to move a door substantially perpendicular relative to a door interface surface of a substrate passage opening while the second bladder is configured to move the door substantially parallel to the door interface surface so that the substrate passage opening in unobstructed by the door.

Mapping of the carrier substrates may be effected in any desired manner. As a non limiting example, the substrates can be mapped optically with thru-beam sensors (flip-in sensors), thru-beam sensors through clear windows on sides of the carrier, or with any other suitable optical sensor. As other non-limiting examples, the sensors can be mapped mechanically with air sensors ported in supports, opto-mechanically where a wafer actuates a plunger where the plunger movement is sensed with any suitable sensor, by proximity sensors, and electro-mechanically with strain gauges that measure the strain of supports substrate supports under weight of a wafer. In alternate embodiments the substrates may be mapped in any suitable manner.

Figure 15:
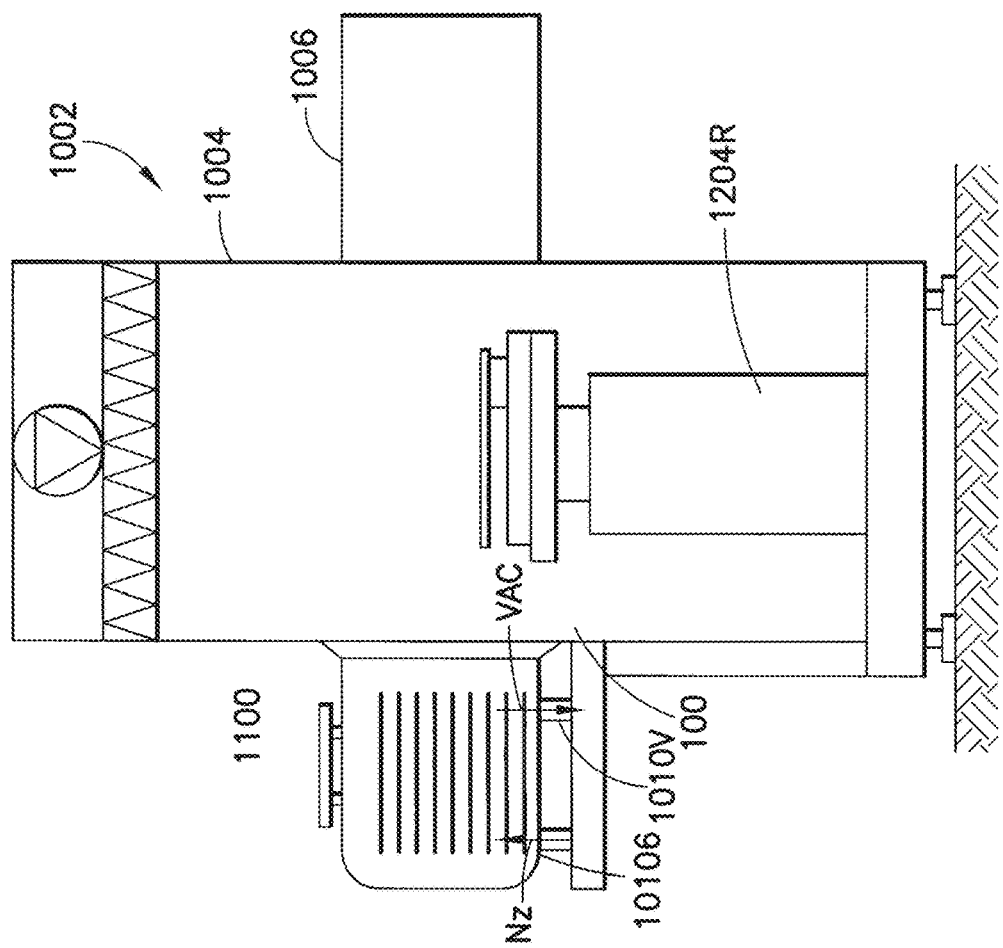
FIGS. 15 and 15A are schematic elevation views of a substrate processing tool and carrier connected thereto in accordance with another exemplary embodiment.
Figure 15A:
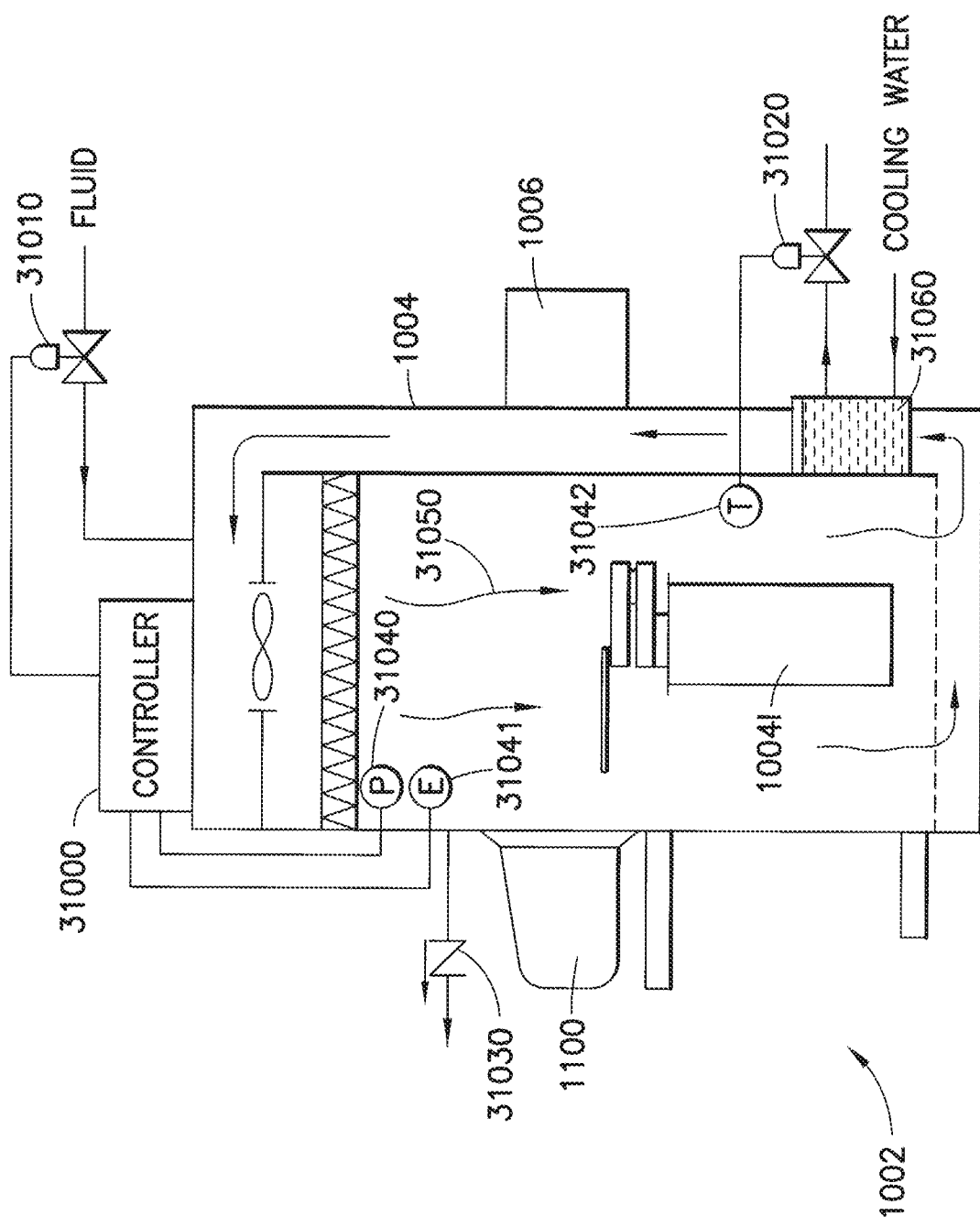

Referring now to FIGS. 15 and 15A, there is shown schematic elevation views of a substrate processing apparatus or tool 1002 and carrier(s) 1100 connected thereto in accordance with another exemplary embodiment. The processing apparatus 1002, in the exemplary embodiment shown in FIG. 15, is generally similar to the substrate processing tool 2 illustrated in FIG. 1 and described previously, and similar features are similarly numbered. The process tool 1002 may generally have a process section 1006 and FEM 1004 (continuing, for explanation purposes only, with the reference convention in which wafers may be considered to be loaded into the tool from the front). In the exemplary embodiment, the process section 1006 and FEM 1004 may share a common controlled environment or atmosphere (e.g. inert gas (N2), (Ar), or very clean dry air). The process section 1006, is shown schematically, and may include one or more process sections or module(s) connected to the FEM 1004 (the arrangement shown in FIG. 15 is merely exemplary and the FEM and process section module(s) may be connected to each other in any desired arrangement in alternate embodiments). The process section(s) or module(s) 1006 may be capable of being isolated from the FEM 1004, such as with a closable opening (e.g. a gate valve). Accordingly, the process section may also be provided with a different process atmosphere than the FEM atmosphere. In alternate embodiments, the process section may include a load lock allowing process modules with dissimilar atmospheres or holding a vacuum to be connected to the FEM as will be described further below.

The FEM 1004 in the exemplary embodiment shown in FIG. 15, may be similar to FEM 4 (see FIGS. 1-14) except as otherwise noted. The FEM 1004 may include suitable environmental controls to maintain a desired controlled environment or atmosphere in the FEM when substrate are transported to and from the process section 1006. For example, the FEM 1004 may include a controller 31000, one or more fluid control valves 31010, 31020, a pressure relief or check valve 31030 and sensors, such as for example, pressure sensor 31040, contamination sensor 31041 and temperature sensor 31042. The controller may be configured to adjust or regulate attributes such as the temperature pressure and rate of gas flow 31050 of the controlled environment within the FEM (and process section 1006). For example, the controller 31000 may receive signals from the pressure sensor 31040, temperature sensor 31042 and environmental contamination sensor 31041. Depending on the environmental information in those signals the controller may release or increase pressure within the FEM, increase or reduce air flow 31050 within the FEM by actuating the appropriate valves 31010, 31030. The controller 31000 may also be configured to increase or decrease the temperature of the gas within the FEM (e.g. via adjusting coolant flow through radiator 31060) based on temperature readings provided by temperature sensor 31042. As may be realized, while the controller 31000 and associated valves and sensors are described with respect to FIGS. 15 and 15A, the controller 31000 may be used to control the environment(s) of the other embodiments disclosed herein.

The FEM 1004 may include a substrate transport apparatus or robot 1004R (the robot, as may be realized, may be of any desired type) capable of holding and transporting substrates. Similar to FEM 4 described before, in the exemplary embodiment, the FEM 1004 may include a carrier interface 1010 for interfacing one or more carrier(s) 1100 to the tool 1002, and allowing substrates to be loaded and unloaded to and from the tool 1002. The interface, which has also been referred to herein as a load port, of the FEM 1004, and a corresponding complementing interface portion of the carrier(s) 1100, may be configured to enable loading and unloading of substrates between carrier and FEM without degradation of the controlled environment in the FEM 1004 and process section 1006. The FEM load port 1010, and complementing interface portion of the carrier 1100, which may be collectively referred to as the carrier to FEM interface, may be arranged so that carrier(s) 1100 interfaced to the FEM, are integrated into the tool. By way of example, the carrier(s) so integrated via the interface, may define a chamber(s) sharing the same controlled atmosphere as the FEM, and thus capable of holding substrates in the same controlled atmosphere as the FEM, so that substrates may be transported directly from carrier 1100 to process section or process module by the FEM transport robot 1004R. Similar to the exemplary embodiments described before, the carrier to FEM interface in the exemplary embodiment shown in FIG. 15, defines what has been referred to before as a clean tunnel (with substantially the same cleanliness as throughout the FEM and process section) from within the carrier chamber, through the interface into the FEM, and throughout the process section. The clean tunnel may be closed (such as when the carrier(s) is removed from the load port), and opened freely without degradation to the clean tunnel. In the exemplary embodiment shown in FIG. 15, the carrier to FEM interface may also be arranged to enable direct integration of the carrier with the tool (substantially as described above) independent of carrier environment prior to interface, as will be further described below. Thus, in the exemplary embodiment illustrated in FIG. 15, the carrier(s) 1100 may be interfaced with and integrated directly to process tools having different or dissimilar environments (e.g. clean air to inert gas environment, or clean air to vacuum) and then transport directly between tools with different dissimilar environment and interfaced and integrated again with the tools as will be described further below. Accordingly, a substrate(s) at one tool with a controlled environment may be transferred directly with the FEM robot, from the process section (similar to process section 1006) through the clean tunnel into the carrier(s), the carrier(s) 1100 transported directly and interfaced to the FEM (similar to FEM 1004) of another tool possibly with a dissimilar/different controlled environment, and the substrate(s) transferred directly with the FEM robot through the clean tunnel now defined in the other tool to the process section without degradation of the controlled environment in the other process tool. In effect, the carrier to FEM interface in combination with the carrier may be considered to define an exterior load lock, or carrier load lock.

Referring still to FIG. 15, and as noted before, the load port 1010 of FEM 1004 may be similar to load port 10 described previously. In the exemplary embodiment illustrated in FIG. 15, the load port 1010 is shown interfacing with one carrier 1100 for example purposes, though in alternate embodiments, the load port may be arranged to interface with any desired number of carriers. For example, in alternate embodiments, the load port may have a generally stacked configuration capable of interfacing a number of carriers arrayed in a stack similar to the arrangement shown in FIG. 1. In the exemplary embodiment, the load port 1010 may have a vacuum source 1010V capable of being communicably connected to the carrier(s) 1100 held on the load port in order to pump down the carrier, for example to clean molecular contaminants from the carrier interior and substrates therein when the carrier is on the load port. Conversely, the carrier may be arranged to communicably interface with the vacuum source 1010V at the load port and to withstand atmospheric pressure in the carrier casement when the carrier is pumped down to vacuum. As noted above, the vacuum source 1010V for pumping down the carrier may also effect the actuation of an actuator 5000 for coupling the carrier door to the load port door via a pressure differential in a manner substantially similar to that described above with respect to FIG. 7 (See also FIGS. 19 and 20). For example, the load port door may interface with the carrier door through a vacuum interface. The interior volume of the carrier may be pumped to a higher vacuum than the load port/carrier door vacuum interface to create a pressure differential between the two for effecting movement of the actuator. In other exemplary embodiments the vacuum interface between the load port door and the carrier door may effect the movement of the actuator 5000 for latching the carrier door and load port door to each other. In alternate embodiments, as also noted above, a surface of the actuator may be pressurized in any suitable manner, such as for example, when the carrier is purged with the inert gas. In alternate embodiments, the load port door may include a vacuum/purge flow line that interfaces directly with the actuator (e.g. the actuator seals around the flow line) for creating a pressure differential or for pressurizing one side of the actuator.

Figure 26:
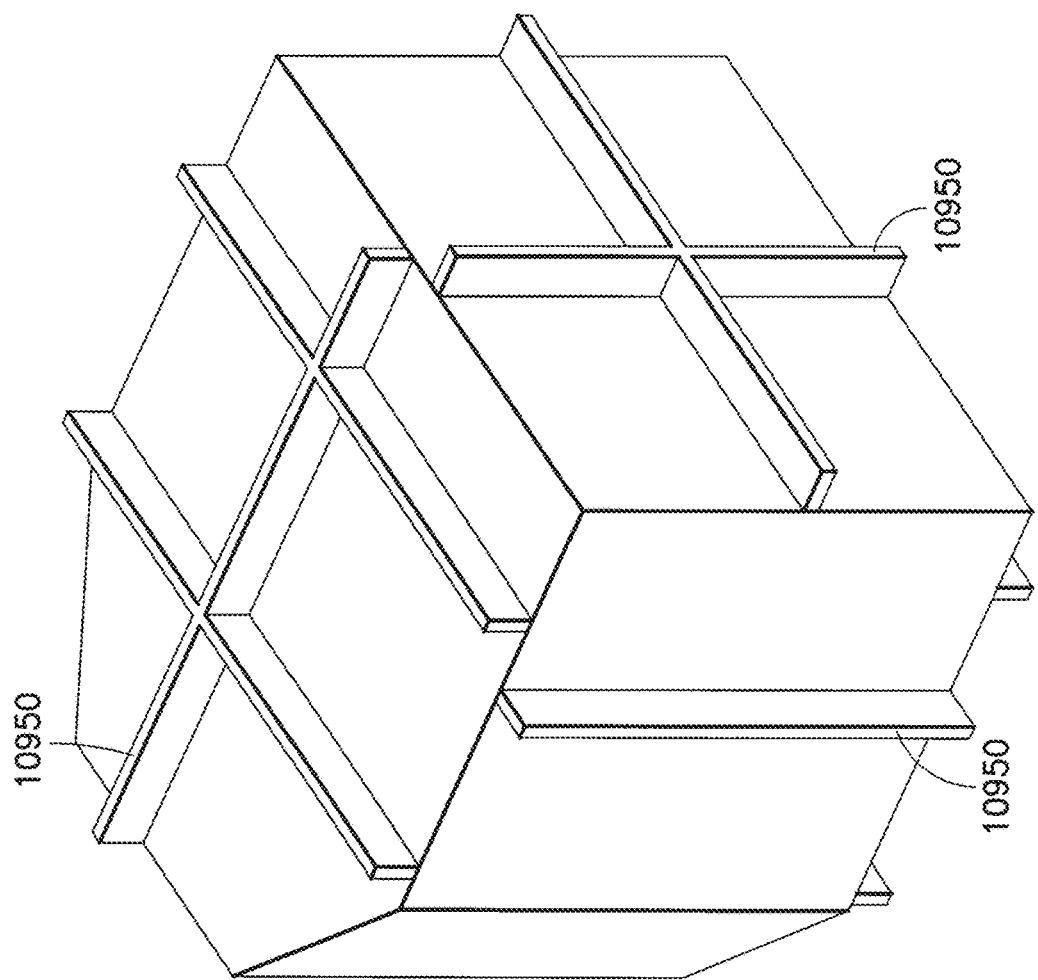
FIGS. 26 and 27 illustrate schematic views of a substrate carrier in accordance with exemplary embodiments.
Figure 27:
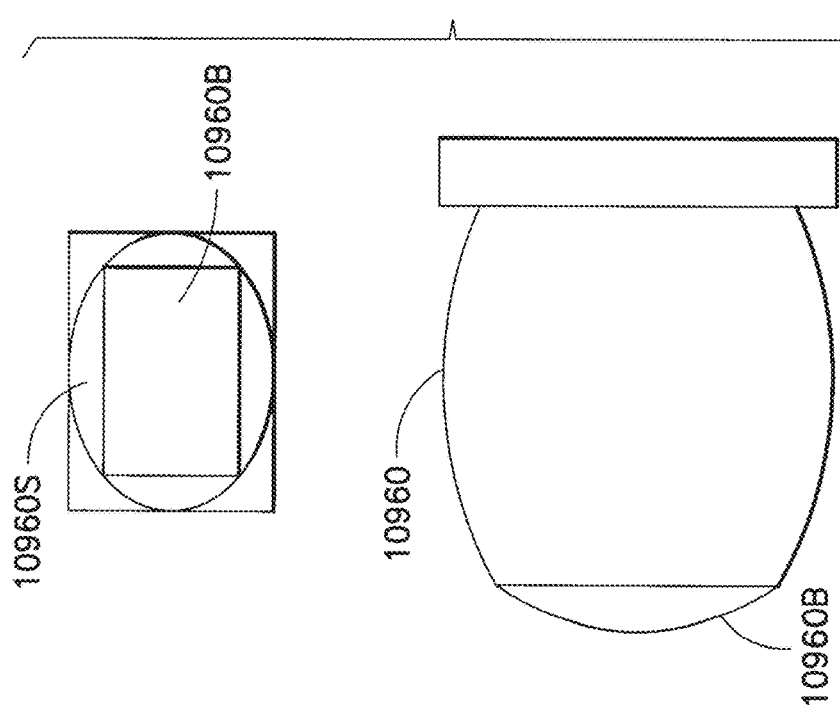

In the exemplary embodiment shown in FIG. 15, the carrier is illustrated as a side opening carrier (having the carrier door located in a side wall of the carrier), through in alternate embodiments the carrier door may be located in any carrier wall, such as top or bottom walls of the carrier. The carrier 1100 may have any desired size and may be a small lot carrier (for example with a capacity of 5 or less substrates) or may be sized to have any desired transport capacity such as 13, 25 or any other desired number of substrates. The carrier may have a metal housing for example of aluminum or stainless steel, or any other material (including non-metallic materials or metal for lined non-metallic materials) so that the housing is substantially impermeable to gas molecules. As noted before, the carrier housing may also be suitably arranged to hold a vacuum therein (for example a sufficiently high vacuum for effective cleaning of molecular contaminants within the carrier, and vacuum comparable to vacuum processes, e.g. about $1\times10^{-3}$ torr) with the carrier housing exterior subject to atmospheric pressure. The carrier housing structure may be arranged to have any suitable wall thickness (such as for exemplary purposes only about 1/8" in the case of stainless steel) and may have stiffeners 10950 suitably dimensioned and positioned along one or more of the sides, top and/or bottom of the carrier as shown in FIG. 26 to minimize deflections of carrier housing. The stiffeners 10950 may be configured as ribs or any other suitable stiffening member for minimizing deflection of the walls of the carrier. In other exemplary embodiments, the walls of the carrier may be domed walls 10960 to use, for example, hoop stresses to strengthen the walls and minimize deflection of the carrier as can be seen in FIG. 27. In alternate embodiments the walls of the carrier may have any suitable configuration for minimizing deflection of the walls. The carrier 1100 may have similar coupling features (e.g. kinematic couplings for docking with the load port upon delivery from an over head transport for example and for engaging the carrier side opening to the corresponding load port opening to effect the clean tunnel through the load port) to carrier 100 described before. The carrier housing may be suitably arranged so that any deflections of the carrier housing, when the carrier interior is subjected to vacuum, to not degrade the operation of the couplings. The carrier 1100 may have suitable passages and orifice(s) or ports so that on connection or coupling the carrier with the load port, the vacuum source 1010V of the load port is automatically coupled to the carrier housing and communicates with the carrier interior. The location of the vacuum port shown in FIG. 15 is merely exemplary, and in alternate embodiments the vacuum port may be positioned as desired. For example, in alternate embodiments the vacuum passages and port on the carrier (and conversely on the load port) may be similar to that shown in FIG. 14 (e.g. flow channels formed in the mating face of the carrier within the sealed interface region between carrier side and load port rim). As may be realized, carrier seals (see FIG. 3) have desired integrity to withstand vacuum across the seal.

As seen in FIG. 15, in the exemplary embodiment illustrated, the carrier 1100 may also be configured to be communicably connected to a gas feed, such as a source of vent or purge gas. In the exemplary embodiment shown in FIG. 15, the carrier 1100 may be communicably connected to gas source 1010G, when seated on the carrier support of the load port 1010. As may be realized, the carrier may have a suitable inlet port (plug (and suitable gas channels connecting the carrier interior) to couple (for example automatically) to a nozzle of the gas feed 1010G, such as when the carrier is placed on the load port support surfaces. The arrangement of the gas source interface between load port and carrier shown in FIG. 15 is merely exemplary and in alternate embodiments the gas source interface between carrier and load port may have any other desired location and configuration. As noted before, the gas source 1010G may be capable of providing for example purge and/or vent gas to the carrier seated on or located at the load port 1010. By way of example, with the carrier 1100 suitably positioned (such as from an overhead transport) at load port 1010, and the gas feed nozzle connected to the carrier to feed gas into the carrier housing, a purge gas (e.g. N2) may be fed into the carrier if desired (depending on the interior atmosphere of the carrier when positioned at the load port, and the environment being maintained in the FEM). Thus, if the carrier for example contains some process atmosphere, (such as from an interface with a previous tool), and the FEM 1004 may be maintained with an inert gas or very clean air atmosphere, that may be dissimilar from the carrier atmosphere, upon positioning the carrier at the load port, desired purge gas may be fed into the carrier such as via gas feed 1010G, purging the carrier atmosphere so that the carrier may be interfaced with the load port opening and integrated to the tool 1002 is previously described. Moreover, in the event that carrier atmosphere is considered incompatible with or possibly presenting undesired contaminants to, the FEM environment, upon positioning the carrier at the load port (but for example before opening the carrier interior to the FEM environment), the carrier interior may be pumped to sufficient vacuum via vacuum source 1010V, and filled with the inert gas (e.g. N2, very clean air) similar to the environment in the FEM to clean the potential contaminants from the carrier, and allowing integration of the carrier to the tool as previously described. As noted above, the purge gas feed 1010G may, in addition to or in lieu the vacuum source 1010V, operate the actuator 5000 in a manner substantially similar to that described above. Information regarding the carrier atmosphere may be recorded on a RFID (radio frequency identification) tag, or other suitable data storage device, capable of being read (or otherwise accessed) by a suitable reader at or proximate to the load port 1010 with which the carrier is being loaded. Accordingly, suitable information regarding the carrier interior may be obtained by the tool controller (see also FIG. 16), reviewed with a desired protocol and if desired the carrier may be pumped and vented as previously described when positioned at the load port. Information regarding the carrier atmosphere for example may be recorded on the carrier borne storage device when the carrier is docked to the load port, or any other suitable time. Such information may also be tracked by a FAB wide controller if desired. As may be realized, the carrier 1100 may also be interfaced with a FEM that may not have vacuum and gas feed connections. In alternate embodiments, the carrier may include an internal or onboard source of purge gas (similar to the embodiment shown in FIG. 13), to effect purging the carrier when positioned at a load port. As may be realized, in alternate embodiments, the load port interface interfacing with the carrier may be provided with a vacuum connection, and no gas feed, that gas being provided for example from a gas source on board the carrier. Thus, as may be realized the carrier may now serve as a substrate cleaning chamber of the tool, storing substrates at the tool so they are undergoing cleaning. As may be realized, the carrier pump/vent may also be performed prior to removal of the carrier from the load port such as when repositioning to a conventional tool.

Figure 16:
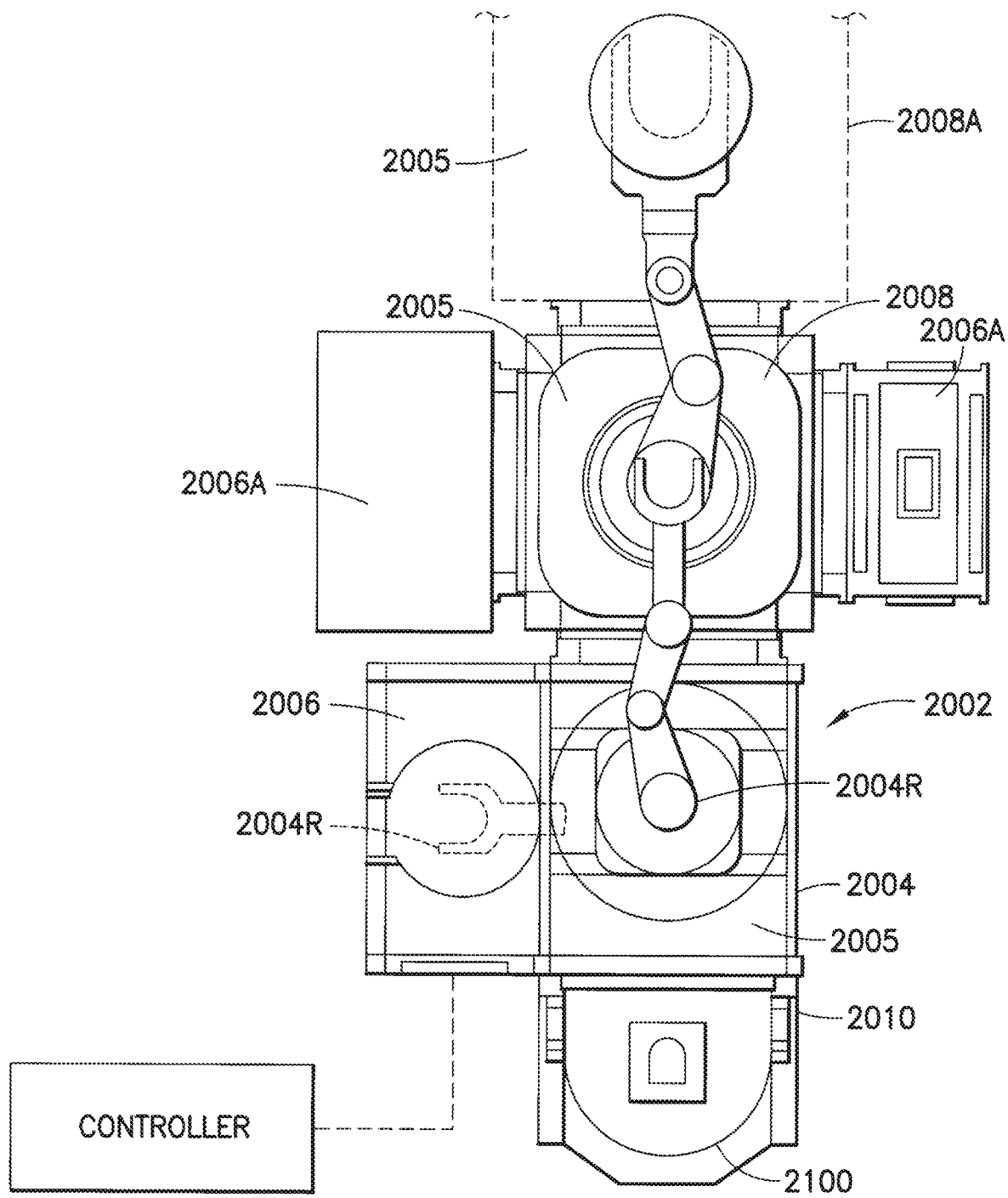
FIGS. 16, 16A and 16B are a schematic plan views of substrate processing tools and carriers connected thereto in accordance with other exemplary embodiments.
Figure 16A:
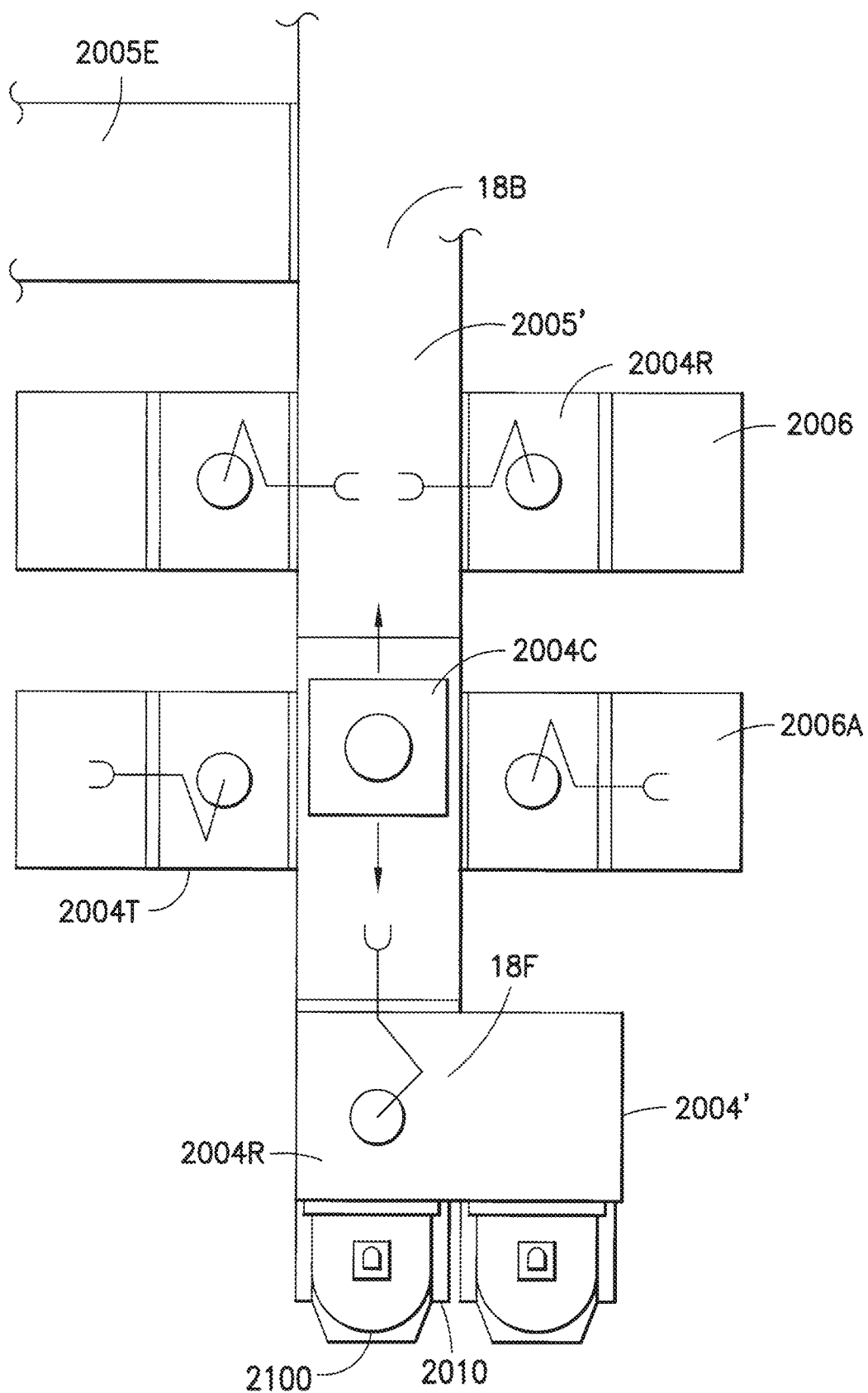

As noted before, the arrangement of the load port and carrier to tool interface shown in FIG. 15 is merely exemplary, and in alternate embodiments, the interface may have any other desired configuration. For example, the gas feed may be positioned as desired to vent gas from FEM environment into the carrier after the carrier interior has been pumped. Referring now also to FIG. 16, there is shown a plan view of another process tool 7002 in accordance with another exemplary embodiment, the tool 2002, in the exemplary embodiment shown in FIG. 16 is generally similar to the process tool 1002 shown in FIG. 15 and described before (similar features are similarly numbered) the tool 2002 may have processing modules 2006, 2006A, and FEM 2004 with a desired controlled atmosphere (e.g. inert gas or very clean air). One or more of the process modules 2006 may be connected to the FEM so that the FEM transport robot 2004R may pick/place substrates in the process module (as shown in FIG. 16 and similar to embodiment shown in FIG. 15). Process modules 2006, 2006A (though one process module is shown in FIGS. 15, 16, 16A, in alternate embodiments a stack of process modules may be joined to the FEM or to each of the one or more transfer modules) may share a common atmosphere with the FEM 2004. FEM 2004 may have a loading interface or load port, for loading and interfacing a carrier 2100 to the tool in an integral manner similar to that described previously. The FEM transport robot 2004R in the exemplary embodiment may pick/place substrates directly between carrier 2100 and one or more process module(s) 2006 through a clean tunnel similar to that previously described. In the exemplary embodiment shown in FIG. 16, the clean tunnel 2005 that is defined through the FEM interface 2010 into the carrier interior, and extends into the process modules 2006, 2006A may be varied in length or configuration (for example in a manner similar to U.S. application Ser. No. 11/422,511, filed May 26, 2006; U.S. application Ser. No. 10/624,987, filed Jul. 22, 2003; U.S. application Ser. No. 10/962,787, filed Oct. 9, 2004; U.S. application Ser. No. 11/442,509, filed May 26, 2006 and U.S. application Ser. No. 11/441,711, filed May 26, 2006 all incorporated by reference herein in their entirety). In the exemplary embodiment, transfer module(s) 2008 may be connected to the FEM, so that the FEM robot may pick/place substrates into the transfer module. The location of the transfer module(s) is merely exemplary. As may be realized, the clean tunnel may continue to extend from the FEM through the transfer module. More or fewer transfer module(s) 2008, 2008A may be connected to each other (for example serially, such as shown in phantom in FIG. 16) to vary the length and configuration of the clean tunnel as desired. Process modules (similar to modules 2006, 2006A) may be joined to the clean tunnel so that substrates may be transferred through the clean tunnel, for example to/from the carrier 2010 and any desired process module, or between any desired process modules. In the exemplary embodiment shown, the transfer module 2008 may have a transport robot inside the module, for example to transport substrates to/from process modules 2006A, or to an adjoining transfer module/chamber 2006A. In alternate embodiments, the transfer module may have no internal robot, the substrates being placed/picked there from by robots inside adjoining modules of the clean tunnel 2005, as will be described below with respect to FIGS. 16A, 16B. In still other exemplary embodiments, the transfer module may have any suitable length and include any suitable substrate transfer apparatus. For example, as can be seen in FIG. 16A, the clean tunnel 2005' may be substantially similar to the clean tunnel described above with respect to FIG. 16 and include a module forming an elongated chamber having a transfer cart(s) configured to traverse the chamber. The transfer cart may be a passive cart (e.g. without a transfer arm/robot) similar to the transfer cart described in U.S. patent application Ser. No. 10/962,787 filed on Oct. 9, 2004, the disclosure of which is incorporated herein by reference in its entirety. For example, the transfer cart may be a movable cart that may be integrated with the chamber. The cart may be configured to translate back and forth in the chamber between front 18F and back 18B. The cart(s) may define multiple independent transport paths within the clean tunnel (e.g. one for each load port door, or one for each process module of a module stack joined to the clean tunnel). The cart may be configured to traverse the chamber such that particulate (that may contaminate the substrates) is not introduced into the clean tunnel 2005'. For exemplary purposes only, in one embodiment, the cart may be a magnetically levitated cart or have any other suitable drive system for moving the cart without releasing contaminants into the clean tunnel. The cart of the transport apparatus 2004R' has end effectors for holding one or more substrates. As can also be seen in FIG. 16A, transfer chambers 2004T are coupled to the clean tunnel 2005'. One or more of the transfer chambers 2004T may include transport arms 2004R (configured for operation in e.g. a vacuum environment) for transporting substrates from the cart 2004C into processing chambers 2006, 2006A coupled to the transfer chambers 2004T. In the exemplary embodiment the transport arms 2004R in a transfer chamber may define multiple transport paths, for example, vertically stacked or offset transport paths to vertically offset process modules communicating with the transport chamber. To pick or release substrates from the cart 2004C, the cart 2004C may be aligned with desired module/port and the arm 2004R is extended/retracted through the corresponding port to position the end effector for picking/releasing the substrate from/to the cart 2004C. In this example, the clean tunnel may be include clean tunnel extension 2005E that may extend the clean tunnel in any suitable direction forming, for example a grid through which the cart(s) 2004C can pass for transporting substrates from the carrier 2100 to the processing modules. As may be realized there may be more than one transport path for the cart 2004C to follow while traversing the clean tunnel 2005', 2005E. In one example, the transport paths may be vertically spaced from each other so that carts can pass over/under each other or to vertically adjust a height of the cart so the cart is aligned with processing modules/ transfer chambers that are vertically stacked one above the other. In alternate embodiments the cart transport paths may be horizontally spaced from each other. The FEM 2004' shown in FIG. 16A may be substantially similar to FEM 2004 in FIG. 16 however, FEM 2004' may include more than one load port for coupling carriers to the FEM. In this example the load ports are shown as being horizontally spaced from each other but in alternate embodiments the load ports may be vertically spaced one above the other.

Figure 16B:
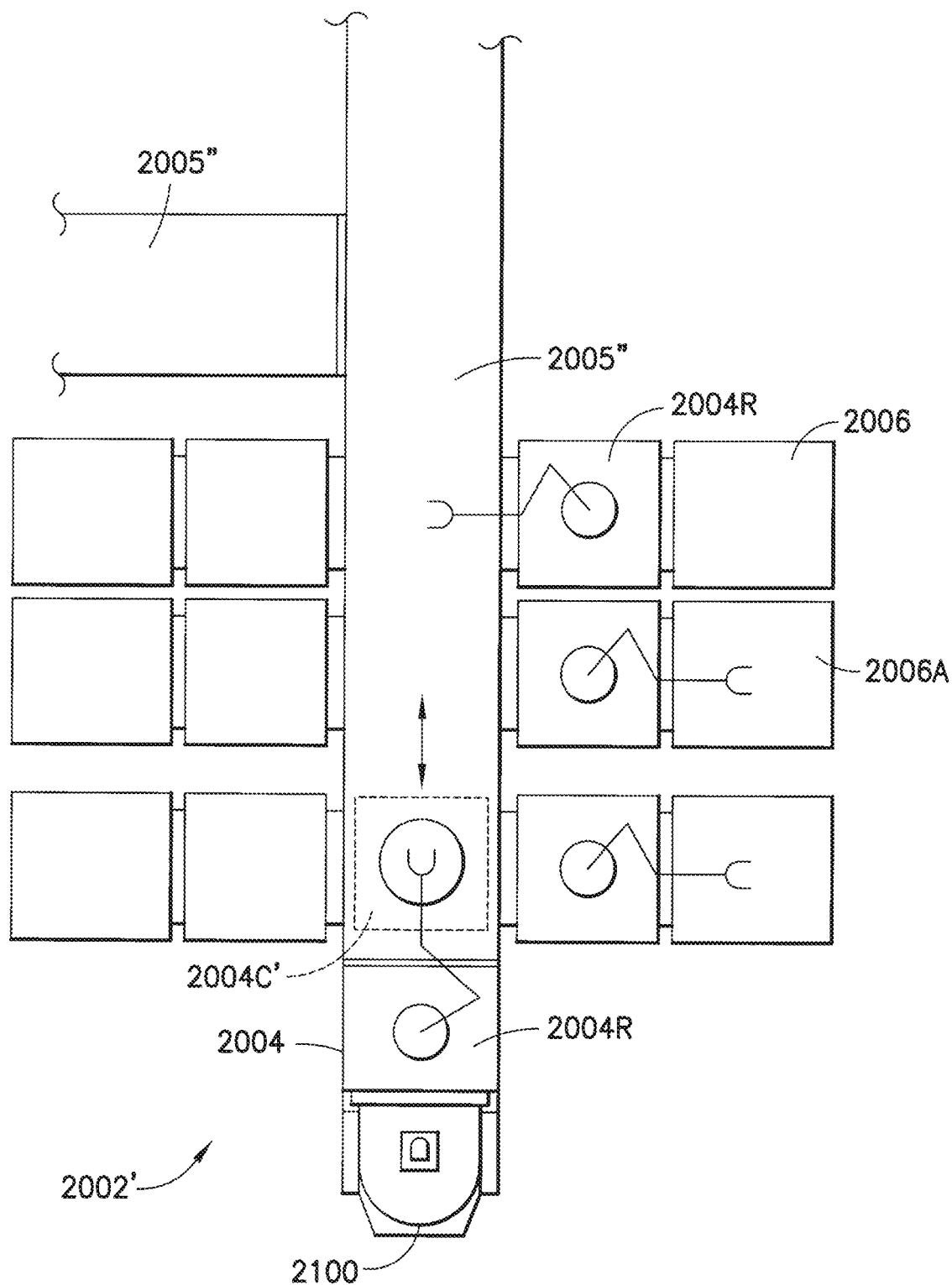

Referring now to FIG. 16B, another exemplary processing tool is shown. In this example, the processing tool includes a clean tunnel 2005" that may be substantially similar to clean tunnel 2005', 2005E. Similarly, transport modules and processing modules may be coupled to the clean tunnel 2005". In this example, the transport apparatus 2004C' may be any suitable transport apparatus such as, a passive or active cart(s) (e.g. including a substrate transport arm/robot), a series of transport robots located in substantially line within the clean tunnel and configured to pass substrates from one robot to another or any other suitable apparatus for transporting substrates through the clean tunnel 2005". In other alternate embodiments the clean tunnel may be formed by a series of transfer modules that include transport arms configured for holding substrates. The transport modules may be coupled to each other to form the clean tunnel. It should be understood that the ports allowing passage between the process modules, transfer modules, clean tunnel and carrier may be configured to isolate a respective portion of the tool 2002' so that one or more of the different portions of the tool 2002' may include atmospheres that are different from each other.

Referring back to FIG. 16, in the exemplary embodiment, the transfer module(s) 2008, 2008A of the clean tunnel in tool 2002, may share the common controlled (e.g. inert gas, very clean air) of the FEM. In alternate embodiments, one or more of the transfer module(s) 2008, 2008A may be configured as a load lock so that portions of the clean tunnel may hold different atmospheres (for example the clean tunnel portion defined within the FEM may have a N2 environment, and the portion within the module 2008A may have a vacuum environment, transfer module 20008 may be a load lock capable of cycling substrates between the inert gas atmosphere in the FEM, and the vacuum atmosphere in module 2008A).

Figure 17:
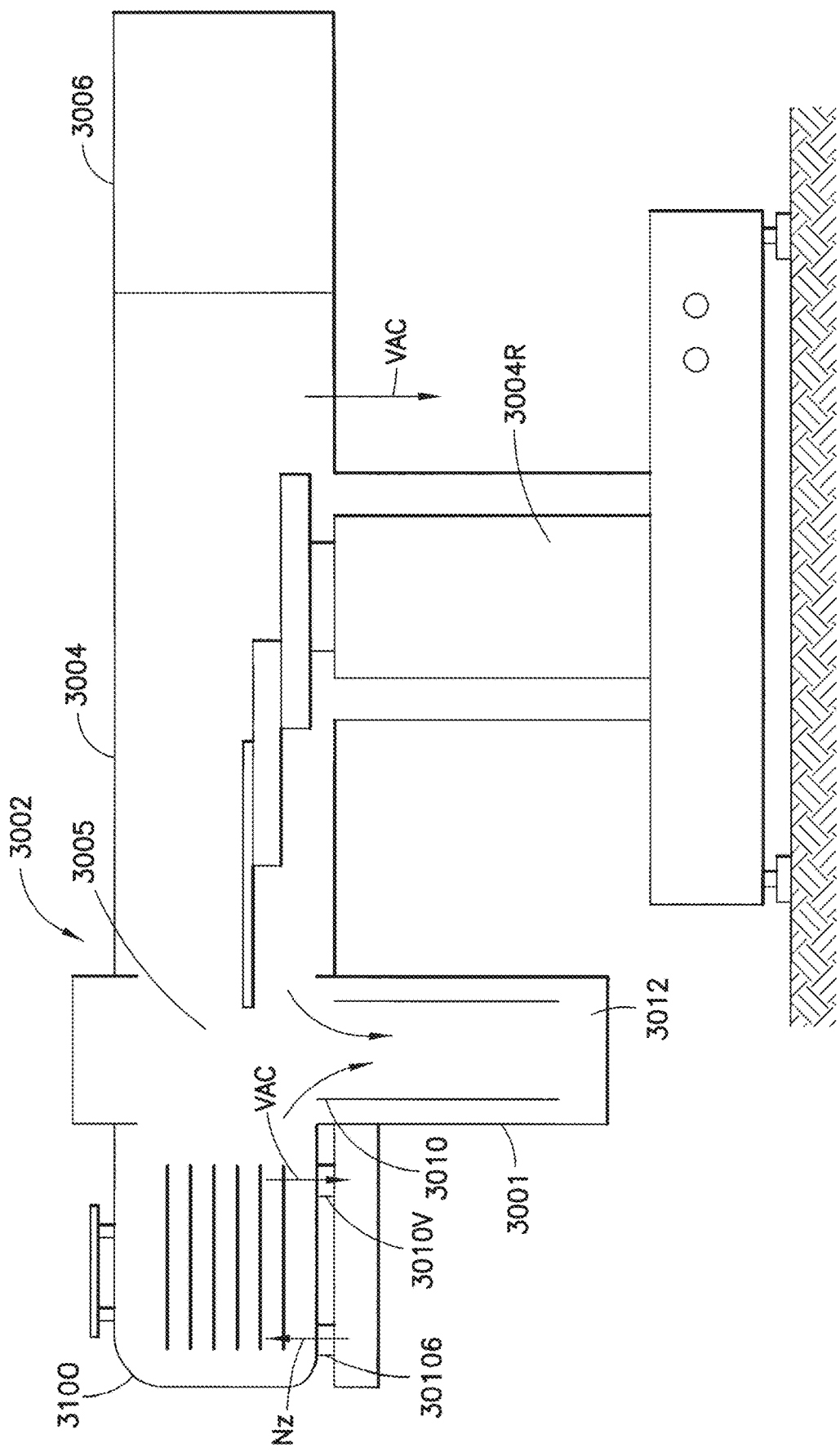
FIG. 17 is a schematic elevation view of substrate processing tool and carrier connected thereto in accordance with another exemplary embodiment.

As may be realized, in addition to being interfaceable with an FEM (Similar to that shown in FIGS. 15-16), the carrier may be interfaced directly with a vacuum portion of a process tool. Referring now to FIG. 17, there is shown a substrate process tool 3002 and carrier 3100 connected thereto. Carrier 3100 may be similar to carrier 1100 described previously. The process tool 3002 is generally similar to the process tools described before with a front loading section 3004 (maintaining the convention as previously discussed with the tool being loaded from the front and process section 2006 (of process modules) 3006) connected thereto. In the exemplary embodiment shown in FIG. 17, the front loading section 3004 may be configured to hold a vacuum (or any other desired atmosphere). The loading section 3104 may have a chamber interface or load port 3010, generally similar to the load port interface 10, 1010 described before, except as otherwise noted, and capable of receiving carrier 3100 and interfacing the carrier directly to the vacuum atmosphere in the loading section. As may be realized, the carrier opening to load port rim interface, similar to that previously described, provides sufficient integrity so that when the carrier is integrated directly thereto and opened (for example) to the vacuum atmosphere within the loading section 3004 there is no appreciable degradation in the vacuum atmosphere and the clean tunnel extending from the carrier interior through the carrier-load port interface, the loading section 3004 and process module(s) 3006 communicating with the clean tunnel. Thus, when the carrier integrated with the clean tunnel, the substrate robot, 3004R inside the vacuum loading section may pick/place substrates inside the carrier and the process module(s) 3006 and directly transfer substrates therebetween via the clean tunnel. The arrangement illustrated in FIG. 17 is merely exemplary. The loading opening of front loading section 3004 may be closable, such as with a vacuum gate valve (or other suitable closure), in order to maintain vacuum inside section 3004 when the carrier is not interfaced. In the exemplary embodiment, the loading section may also include a fore section 3012, that may be located forward of the vacuum gate valve for example, and may interface or be connected to the port interface for the carrier 3001 (similar to interface 101 described before, see also FIG. 3). The fore section 3012 may also have a closable opening (closable, for example with a door similar to door 8014 shown in FIG. 3), through which the loading section communicates with the carrier interior and through which the clean tunnel extends. As may be realized, the fore section 3012 may also have a vacuum atmosphere, when the carrier is interfaced and the carrier is opened. The fore section may for example be arranged, so that the carrier door is removable (similar to that previously described) from the carrier, through the loading opening into the fore section. In the exemplary embodiment, the fore section may not be a load lock, (though in alternate embodiments it may be) as the carrier 3100 may become a load lock (as previously described). Thus, the substrates may be held in the carrier and atmosphere (for example the carrier may hold and inert gas atmosphere during intertool transport) may be pumped (such as with vacuum source 3010V, similar to the vacuum source previously described) to establish a commensurate vacuum with the process vacuum in the transfer chamber of the loading section. With desired vacuum established in the carrier, the vacuum gate valve may be opened so that the vacuum robot in the loading section may pick/place substrates inside the carrier. The carrier door may be opened after the carrier is pumped to vacuum (in the exemplary embodiment the fore section may also have a vacuum environment to facilitate opening of the carrier door and the clean tunnel established to extend from carrier interior, through the interface openings the fore section, the transfer chamber and process module(s) communicating therewith. In the exemplary embodiment, the fore section may have an inert atmosphere (to minimize potential for contaminant entry) between carrier interfaces, that may be pumped to desired vacuum prior to opening the carrier door (as may be realized suitable vacuum source and gas feed may be provided to the fore section). In alternate embodiments, the carrier door may be opened before pumping the atmosphere from the carrier (e.g. the carrier door is opened with the fore section having an inert gas atmosphere), and the atmosphere in both carrier and fore section may be pumped simultaneously either via a vacuum source in the fore section, or vacuum source coupled to a vacuum orifice on the carrier (as previously described). In the exemplary embodiment, after closing the carrier door in anticipation of transfer to another tool, the carrier 3100 may be filled, via feed 3010G with a suitable inert gas (e.g. N2).

Figure 18:
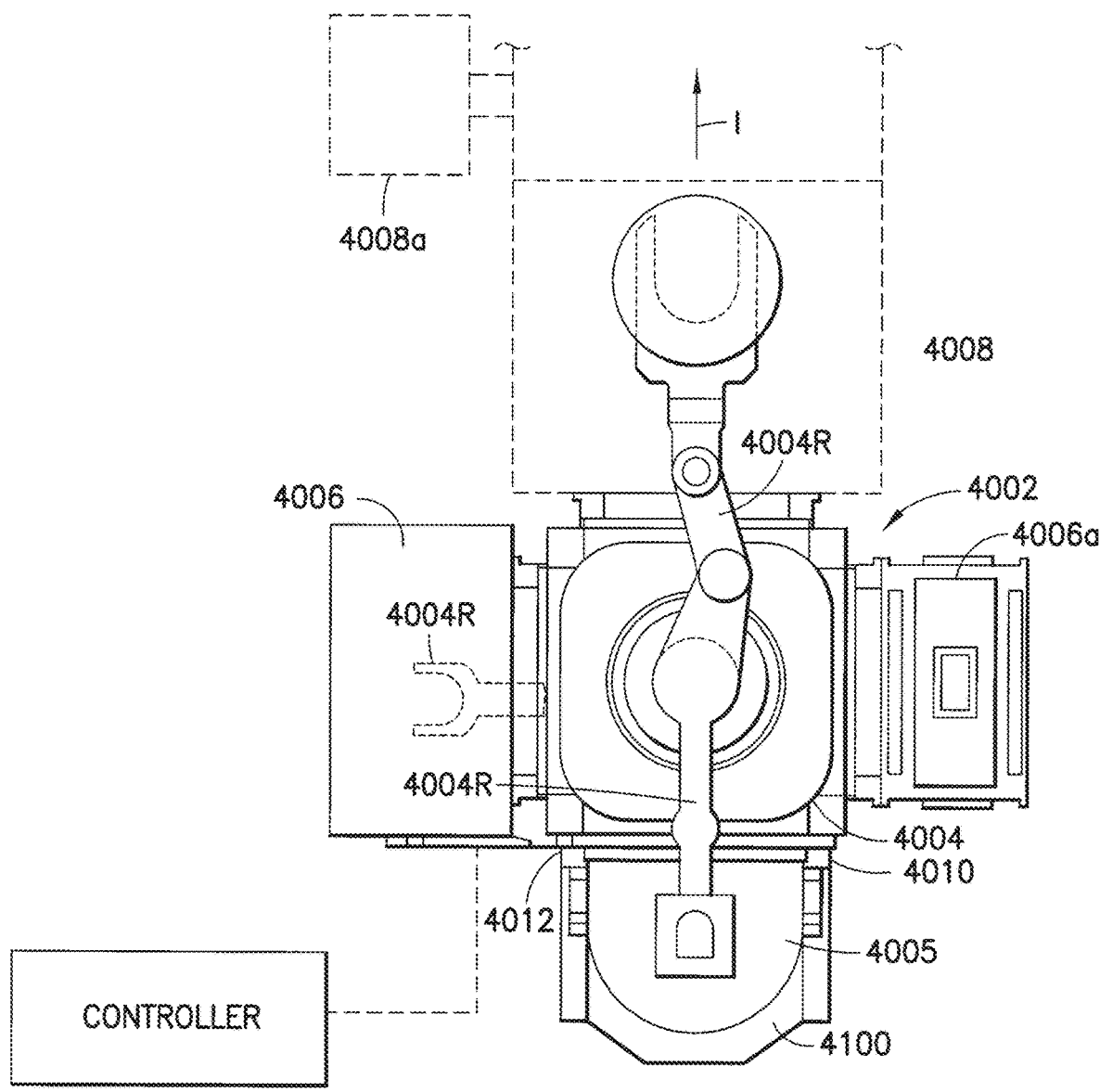
FIGS. 18, 18A and 18B are schematic plan views of a substrate processing tools and carriers connected thereto in accordance with other exemplary embodiments.
Figure 18A:
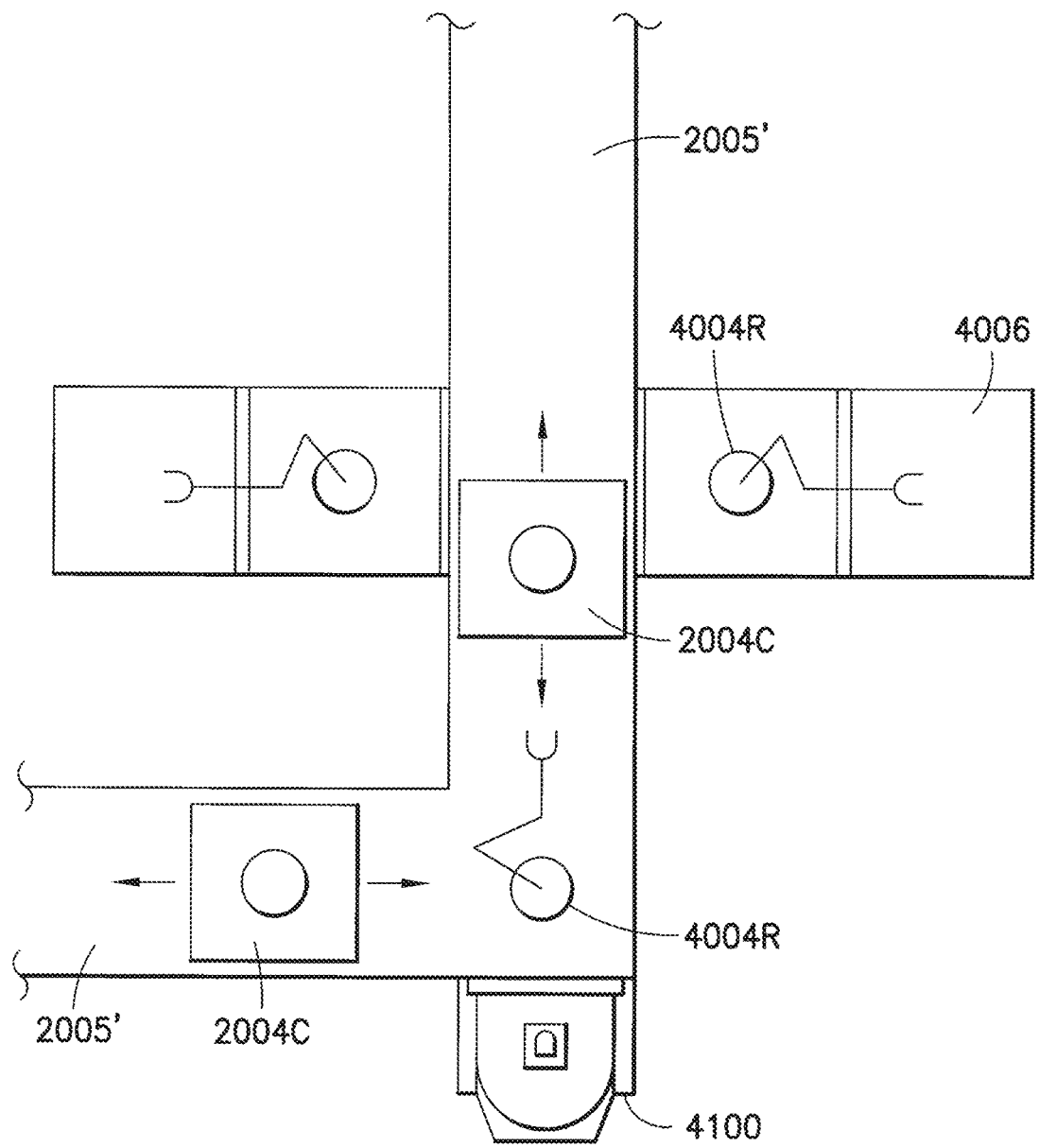
Figure 18B:
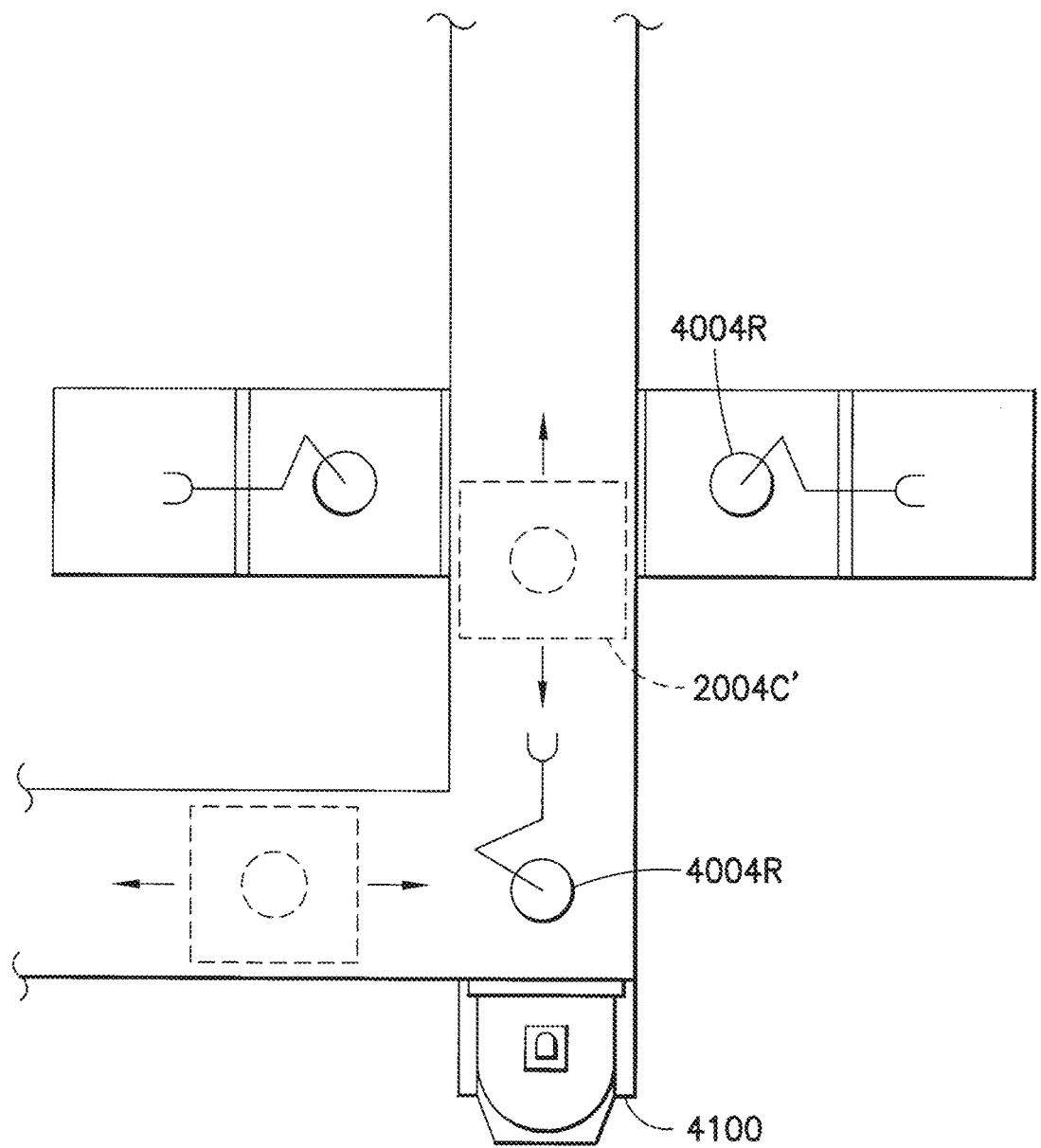

As noted before, the arrangement of the process tool 3002 and carrier to tool interface may have any desired configuration. Referring now also to FIG. 18, there is shown a plan view of another process tool 4002 in accordance with another exemplary embodiment. The tool 4002 in the exemplary embodiment shown in FIG. 18 is generally similar to the processing tool 3002 shown in FIG. 17 and described before (similar features are similarly numbered). The tool 4002 may have processing modules 4006, 4006A, and FEM 4004 with for example a vacuum atmosphere (or in alternate embodiments inert gas or very clean dry air). One or more of the process modules 4006 (such as for example in vertically stacked or offset arrangement) may be connected to the vacuum FEM so that the vacuum transport robot 4004R may pick/place substrate in the process module as shown in FIG. 18 and similar to embodiment shown in FIG. 16. Process modules 4006, 4006a may share a common process vacuum with the loading section 4004. FE 4004 may have a loading interface or load port, for loading and interfacing a carrier 4100 to the tool in an integral manner similar to that described previously. The vacuum transport robot 4004R in the exemplary embodiment may pick/place substrates directly between carrier 4100 and one or more process module(s) 4006,4006A through a clean tunnel similar to that previously described. In the exemplary embodiment shown in FIG. 18 the clean tunnel 4005 that is defined through the FEM interface 4010, 4012 into the carrier interior and extends into the process modules 4006, 4006A may be varied in length or configuration Referring now to FIG. 18A, in accordance with another exemplary embodiment, the processing tool may be configured such that the carrier 4100 is coupled directly to the atmosphere of the clean tunnel 2005' as described above with respect to FIG. 18. In this example, a transport robot 4004R may be located adjacent the carrier for transporting substrates from the carrier to a transport cart(s), for example a substrate transport system that may be substantially similar to the transport cart(s) described above with respect to FIGS. 16A, 16B. As described above the cart(s) may be moved to a desired location within the clean tunnel 2005' such that a transport robot 4004R, in a transfer module communicating with the clean tunnel, may transfer substrates between the processing modules 4006 and the clean tunnel. In the exemplary embodiment, the clean tunnel transport system may define multiple substrate transport paths (e.g. particularly offset) in the clean tunnel between the carrier(s) and process modules 4006. In the exemplary embodiment the process modules 4006 at each process module station may be arranged in a vertically stacked manner. Thus a substrate(s) from a carrier at the load port may be transported to a corresponding to a corresponding process module(s) of the tool and returned to the respective carrier substantially independent of other process paths of substrate(s) from the other carriers. In alternate embodiments, the cart may include an articulated arm or movable transfer mechanism for extending and retracting the end effectors in order to pick or release substrates directly from the processing modules 4006 or transport robots 4004R adjoined to the clean tunnel 2005'. FIG. 18B illustrates another processing tool in which the carriers 4100 are coupled directly to the clean tunnel. In this example, the processing tool may be substantially similar to the clean tunnel described above with respect to FIG. 18A, however the transportation system 2004C' may be substantially similar to the transportation system described before with respect to FIG. 16B. It should also be realized that the clean tunnel (or portions thereof) may have transport paths vertically or horizontally spaced from each other, as described above, for allowing the transport of substrates throughout the processing tool or to different processing modules or carrier that may be vertically stacked one above the other or located side by side from each other.

The disclosed system may provide:
Stops crystal growth/corrosion
Relax queue time rules and simplifies storage management
Removes air Et halogen Et organic compounds and moisture
Suppresses FAB cross contamination risks
Low CoO
Eliminates airborne molecular contaminants AMC such as HF, HCL, VOC in carrier environment and on the substrate
Protects carrier and substrate within the carrier from contaminated environments for days
Active gas passivation protection on both substrate and carrier,
POD ambient refreshing and protection
Integrated gas measurement with spectra signature analysis.

It should be understood that the exemplary embodiments described herein could be used individually or in any suitable combination(s). It should also be understood that the foregoing description is only illustrative of the invention. Various alternatives and modifications can be devised by those skilled in the art without departing from the invention. Accordingly, the present invention is intended to embrace all such alternatives, modifications and variances.

What is claimed is:

1. A substrate carrier configured for coupling to a load port of a substrate processing system that includes a processing section having a processing vacuum and where the load port includes a BOLTS interface, the substrate carrier comprising:
   a shell having shell walls and kinematic coupling features disposed on at least one side wall of the shell walls and being configured to couple the shell with the BOLTS interface of the load port; and
   an internal volume formed by the shell, the internal volume including substrate supports;
   wherein the shell includes reinforcing members disposed on the shell, the reinforcing members are configured to reinforce the shell with an exterior of the shell exposed to an atmospheric environment and with the internal volume at the processing vacuum so that the kinematic coupling features provide repeatable coupling of the shell with the BOLTS interface with the internal volume pumped down to the processing vacuum and the exterior of the shell exposed to the atmospheric environment and with the internal volume pumped down to the processing vacuum and the substrate carrier substantially located in an atmospheric environment, where the processing vacuum corresponds to at least one vacuum process from the group of material deposition, ion implantation, etching and lithography, the reinforcing members include reinforcing members that are distinct from the shell walls and the substrate supports, and wherein with the internal volume at the processing vacuum, the repeatable coupling of the shell with the BOLTS interface extends the processing vacuum from the internal volume through the repeatable coupling of the shell with the BOLTS interface to the processing section.

2. The substrate carrier of claim 1, wherein the reinforcing members are integral to sides of the shell.

3. The substrate carrier of claim 1, wherein the processing vacuum is a processing pressure of the substrate processing system.

4. A substrate processing system comprising:
a processing section arranged to hold a processing atmosphere therein;
a carrier having a shell forming an internal volume for holding at least one substrate for transport to the processing section, the shell being configured to hold a pumped down pressure within the internal volume where the pumped down pressure is predetermined processing vacuum pressure that is different than an exterior atmosphere outside the substrate processing system; and
a front end load port communicably connected to the processing section to isolate the processing atmosphere from the exterior atmosphere, the front end load port having a BOLTS interface and being configured to couple with the carrier to pump down the internal volume of the carrier to the predetermined processing vacuum and to communicably connect the carrier to the processing section, for loading the substrate into the processing section through the front end load port, and the predetermined processing vacuum extends from the internal volume of the carrier through the BOLTS interface to the processing section.

5. The substrate processing system of claim 4, wherein:
the front end load port is configured for allowing access to the processing atmosphere of the processing section through at least one sealable load port opening that is sealable with a load port door, the at least one sealable load port opening being disposed in a load port opening plane;
the BOLTS interface is located substantially along and defining the load port opening plane and configured to interface with a side of the carrier on which a carrier opening is located, and where the load port door interfaces with a carrier door; and
the BOLTS interface has common kinematic registration features that are common to the load port opening plane and engage the side of the carrier, on which the carrier opening is located, effecting kinematically repeatable positioning of the carrier in at least three perpendicular axes to the BOLTS interface independent of a closure of the load port door.

6. The substrate processing system of claim 5, wherein the common kinematic registration features are configured to effect a kinematic coupling between the BOLTS interface and the side of the carrier on which the carrier opening is located.

7. The substrate processing system of claim 5, further comprising a handling system configured to effect registration of the carrier with the common kinematic registration features.

8. The substrate processing system of claim 5, wherein the BOLTS interface forms a seal with the side of the carrier after contact between the carrier and the BOLTS interface.

9. The substrate processing system of claim 8, wherein the seal between the side of the carrier and the BOLTS interface seals a shared high vacuum atmosphere between the processing atmosphere and the carrier.

10. The substrate processing system of claim 5, wherein the carrier door is configured to interface with the load port door after contact between the side of the carrier and the BOLTS interface.

11. The substrate processing system of claim 5, wherein the BOLTS interface includes a flange that substantially surrounds the at least one sealable load port opening, where the flange is configured to interface with the side of the carrier on which the carrier opening is located.

12. The substrate processing system of claim 5, wherein the BOLTS interface includes a flange that substantially surrounds the at least one sealable load port opening, where the flange is configured to interface with a carrier flange.

13. The substrate processing system of claim 1, wherein the predetermined processing vacuum that extends from the processing section through the at least one sealable load port opening.

14. The substrate processing system of claim 4, wherein the predetermined vacuum pressure is a pressure of the processing atmosphere.

15. The substrate processing system of claim 4, wherein the substrate processing system is configured for transporting substrates directly from the carrier to the processing section in a vacuum environment.

16. The substrate processing system of claim 4, wherein the load port is further configured to introduce a gas into the internal volume for pressurizing the carrier.

17. The substrate processing system of claim 4, further comprising a carrier station apart from the front end load port, the carrier station being configured to pump down the carrier to the predetermined vacuum pressure or pressurize the carrier through an introduction of gas.

18. The substrate processing system of claim 4, wherein at least the shell of the carrier is constructed of a metal.

19. The substrate processing system of claim 4, wherein the shell of the carrier includes reinforcing ribs on one or more sides of the shell.

20. The substrate processing system of claim 4, further comprising a transport module communicably connecting the load port to the processing section, the transport module comprising an internal passage formed between the carrier and the processing section wherein the internal passage is a substantially contaminant free environment.

21. The substrate processing system of claim 20, further comprising a movable cart configured to traverse the internal passage and hold substrates for transfer through the transport module.

22. The substrate processing system of claim 21, wherein the movable cart includes a transfer arm configured to transfer at least one substrate directly between the carrier and the processing section.

23. The substrate processing system of claim 21, further comprising a transfer module connecting the transport module to the processing section, the transfer module includes a transfer arm configured to hold at least one substrate and to transfer the at least one substrate from the movable cart to the processing section.

24. The substrate processing system of claim 20, wherein a pressure of the carrier and internal passage are the same as a pressure of the processing section.

25. The substrate processing system of claim 4, wherein:
the carrier is configured to hold at least one substrate in a predetermined substrate plane for transport to the processing section, the carrier having a closable opening on a side of the carrier, the side framing more than one edge of the opening and both the side and the opening being oriented at an angle relative to the substrate plane; and
the front end load port comprises registration features to engage the side of the carrier framing the closable opening and effect repeatable positioning of the carrier to the front end load port.

26. The substrate processing system of claim 4, wherein the carrier comprises a portable gas supply, the portable gas supply being configured to maintain a predetermined pressure within the carrier during transport and/or storage of the carrier.

27. A method comprising:
coupling a substrate carrier to a front end load port of a substrate processing system that includes a processing section having a processing vacuum and where the front end load port includes a BOLTS interface; and
pumping down an internal volume of the substrate carrier to a predetermined vacuum pressure while one or more exterior surfaces of the substrate carrier are exposed to an atmospheric environment, where the process vacuum extends from an internal volume of the substrate carrier through the BOLTS interface to the processing section.

28. The method of claim 27, wherein the predetermined vacuum pressure is a processing pressure of the substrate processing system.

29. The method of claim 27, further comprising transferring at least one substrate from the substrate carrier to a processing module of the substrate processing system.

* * * * *

UNITED STATES PATENT AND TRADEMARK OFFICE
CERTIFICATE OF CORRECTION

| | | |
|---|---|---|
| PATENT NO. | : 11,201,070 B2 | Page 1 of 1 |
| APPLICATION NO. | : 15/986710 | |
| DATED | : December 14, 2021 | |
| INVENTOR(S) | : Babbs et al. | |

It is certified that error appears in the above-identified patent and that said Letters Patent is hereby corrected as shown below:

In the Claims

Column 36, Claim 13, Line 6, after "vacuum" delete "that".

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*